United States Patent
Shealy et al.

(10) Patent No.: US 11,736,177 B2
(45) Date of Patent: *Aug. 22, 2023

(54) FRONT END MODULES FOR 5.6 GHZ AND 6.6 GHZ WI-FI ACOUSTIC WAVE RESONATOR RF FILTER CIRCUITS

(71) Applicant: Akoustis Inc., Huntersville, NC (US)

(72) Inventors: Jeffrey B. Shealy, Cornelius, NC (US); Rohan W. Houlden, Oak Ridge, NC (US); David M. Aichele, Huntersville, NC (US)

(73) Assignee: Akoustis Inc., Huntersville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/544,319

(22) Filed: Dec. 7, 2021

(65) Prior Publication Data
US 2022/0103239 A1 Mar. 31, 2022

Related U.S. Application Data

(63) Continuation-in-part of application No. 17/198,927, filed on Mar. 11, 2021, now Pat. No. 11,394,451,
(Continued)

(51) Int. Cl.
*H04B 1/02* (2006.01)
*H04B 7/08* (2006.01)
(Continued)

(52) U.S. Cl.
CPC ............ *H04B 7/0814* (2013.01); *H03F 1/26* (2013.01); *H03F 3/195* (2013.01); *H03F 3/72* (2013.01);
(Continued)

(58) Field of Classification Search
CPC .......... H04B 1/38; H04B 1/44; H04B 7/0814; H04B 1/0092; H04B 2001/0408;
(Continued)

(56) References Cited

U.S. PATENT DOCUMENTS

| | | |
|---|---|---|
| 5,231,327 A | 7/1993 | Ketcham |
| 5,894,647 A | 4/1999 | Lakin |

(Continued)

FOREIGN PATENT DOCUMENTS

| | | |
|---|---|---|
| CN | 1929302 A | 3/2007 |
| JP | H09321361 A | 12/1997 |

(Continued)

OTHER PUBLICATIONS

International Search Report and Written Opinion for PCT/US2019/040729, dated Oct. 22, 2019.
(Continued)

*Primary Examiner* — Tuan Pham
(74) *Attorney, Agent, or Firm* — Richard T. Ogawa; Ogawa P.C.

(57) ABSTRACT

A front end module (FEM) for a 5.6/6.6 GHz Wi-Fi acoustic wave resonator RF filter circuit. The device can include a power amplifier (PA), a 5.6/6.6 GHz resonator, and a diversity switch. The device can further include a low noise amplifier (LNA). The PA is electrically coupled to an input node and can be configured to a DC power detector or an RF power detector. The resonator can be configured between the PA and the diversity switch, or between the diversity switch and an antenna. The LNA may be configured to the diversity switch or be electrically isolated from the switch. Another 5.6/6.6 GHZ resonator may be configured between the diversity switch and the LNA. In a specific example, this device integrates a 5.6/6.6 GHz PA, a 5.6/6.6 GHZ bulk acoustic wave (BAW) RF filter, a single pole two throw (SP2T) switch, and a bypassable LNA into a single device.

20 Claims, 76 Drawing Sheets

Related U.S. Application Data which is a continuation-in-part of application No. 15/931,413, filed on May 13, 2020, now Pat. No. 11,031,989, which is a continuation of application No. 16/135,276, filed on Sep. 19, 2018, now Pat. No. 10,673,513, which is a continuation-in-part of application No. 16/019,267, filed on Jun. 26, 2018, now Pat. No. 10,979,022, which is a continuation-in-part of application No. 15/784,919, filed on Oct. 16, 2017, now Pat. No. 10,355,659, which is a continuation-in-part of application No. 15/068,510, filed on Mar. 11, 2016, now Pat. No. 10,217,930.

(51) Int. Cl.
| | | |
|---|---|---|
| *H04B 1/00* | (2006.01) | |
| *H03H 3/02* | (2006.01) | |
| *H03F 1/26* | (2006.01) | |
| *H03F 3/195* | (2006.01) | |
| *H03F 3/72* | (2006.01) | |
| *H03H 9/02* | (2006.01) | |
| *H03H 9/17* | (2006.01) | |

(52) U.S. Cl.
CPC ............... *H03H 3/02* (2013.01); *H04B 1/006* (2013.01); *H03F 2200/294* (2013.01); *H03F 2200/451* (2013.01); *H03F 2203/7239* (2013.01); *H03H 9/02118* (2013.01); *H03H 9/173* (2013.01); *H03H 9/175* (2013.01); *H03H 2003/023* (2013.01); *H03H 2003/025* (2013.01)

(58) Field of Classification Search
CPC .... H03F 3/195; H03H 9/02102; H03H 9/173; H03H 9/13; H03H 9/0211
See application file for complete search history.

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,554,427 B2 * | 6/2009 | Matsumoto | H03H 9/605 |
| | | | 333/191 |
| 7,777,777 B2 | 8/2010 | Bowman et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 9,243,316 B2 * | 1/2016 | Larson, III | C23C 14/228 |
| 11,031,989 B2 * | 6/2021 | Shealy | H03H 3/02 |
| 11,063,576 B2 * | 7/2021 | Shealy | H04B 1/0458 |
| 11,177,868 B2 * | 11/2021 | Shealy | H04B 7/0814 |
| 11,184,079 B2 * | 11/2021 | Shealy | H03H 3/02 |
| 11,394,451 B2 * | 7/2022 | Shealy | H04B 7/0814 |
| 2005/0219012 A1 | 10/2005 | Milsom et al. | |
| 2005/0255234 A1 | 11/2005 | Kanda et al. | |
| 2007/0080611 A1 | 4/2007 | Yamada et al. | |
| 2008/0024042 A1 | 1/2008 | Isobe et al. | |
| 2008/0284541 A1 | 11/2008 | Chitnis | |
| 2009/0033177 A1 | 2/2009 | Itaya et al. | |
| 2011/0114968 A1 | 5/2011 | Sheppard et al. | |
| 2011/0298564 A1 | 12/2011 | Iwashita et al. | |
| 2012/0287575 A1 | 11/2012 | Nelson | |
| 2013/0176086 A1 | 7/2013 | Bradley et al. | |
| 2014/0132117 A1 | 5/2014 | Larson, III | |
| 2015/0097638 A1 | 4/2015 | Yu et al. | |
| 2015/0357993 A1 | 12/2015 | Shealy | |
| 2016/0028367 A1 | 1/2016 | Shealy | |
| 2016/0036580 A1 | 2/2016 | Shealy | |
| 2017/0264256 A1 | 9/2017 | Gibb et al. | |
| 2018/0013405 A1 | 1/2018 | Takata | |
| 2018/0054176 A1 | 2/2018 | Kim et al. | |
| 2018/0138885 A1 | 5/2018 | Stokes et al. | |
| 2018/0190601 A1 * | 7/2018 | Hitomi | H03F 3/213 |
| 2019/0081611 A1 | 3/2019 | Vetury et al. | |

FOREIGN PATENT DOCUMENTS

| | | |
|---|---|---|
| JP | 2009100197 A | 5/2009 |
| JP | 2010-068109 A | 3/2010 |
| KR | 20120023285 A | 3/2012 |
| WO | 2005-034349 A1 | 4/2005 |
| WO | 2016122877 A1 | 8/2016 |
| WO | 2017171856 A1 | 5/2017 |
| WO | 2017222990 A1 | 12/2017 |

OTHER PUBLICATIONS

International Search Report and Written Opinion for PCT/US2019/048412, dated Nov. 19, 2019.

International Search Report and Written Opinion for PCT/US2018/050521 dated Jan. 28, 2019.

InImInternationalational Search Report for PCT/US2019/018550, dated May 30, 2019.

International Search Report for PCT/US2015/034560, dated Sep. 18, 2015.

International Search Report and Written Opinion for PCT/US2020023008 dated Dec. 3, 2020.

\* cited by examiner

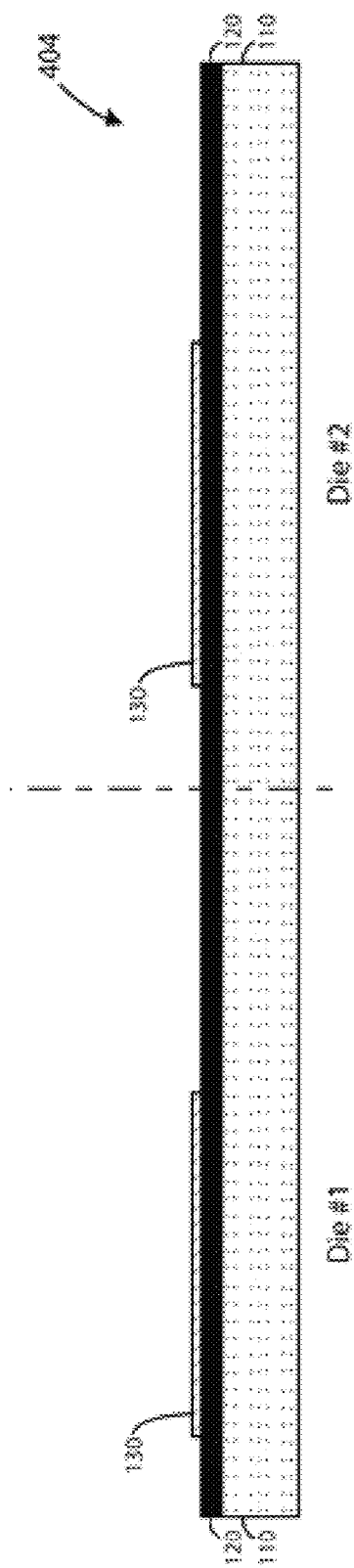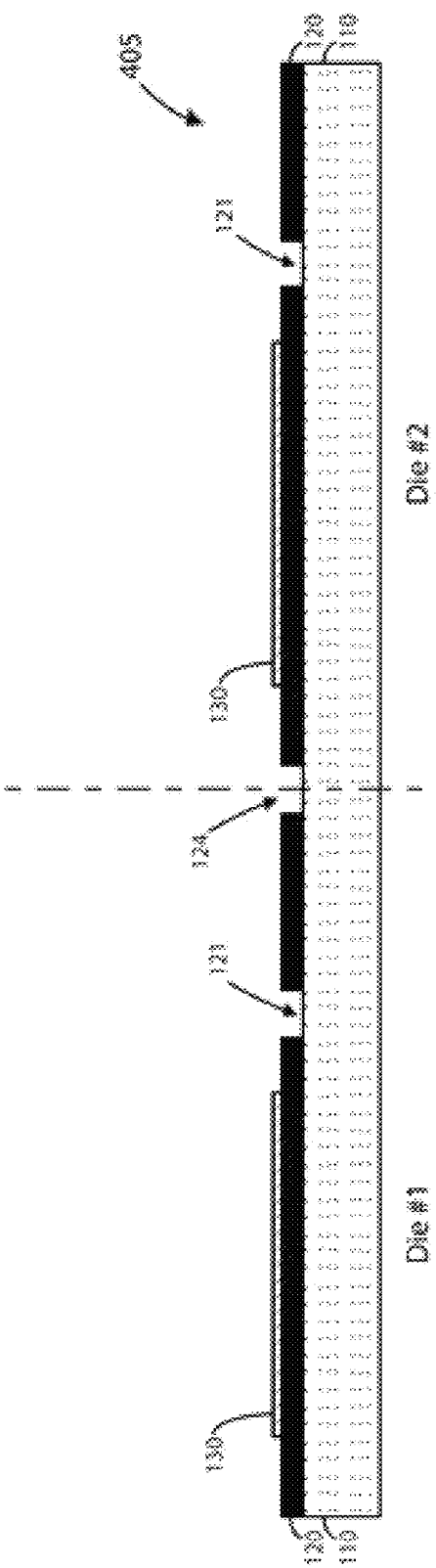

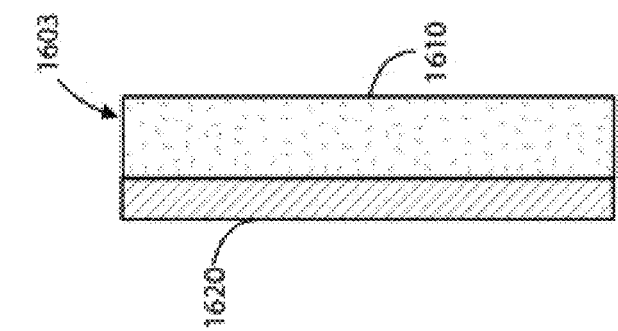
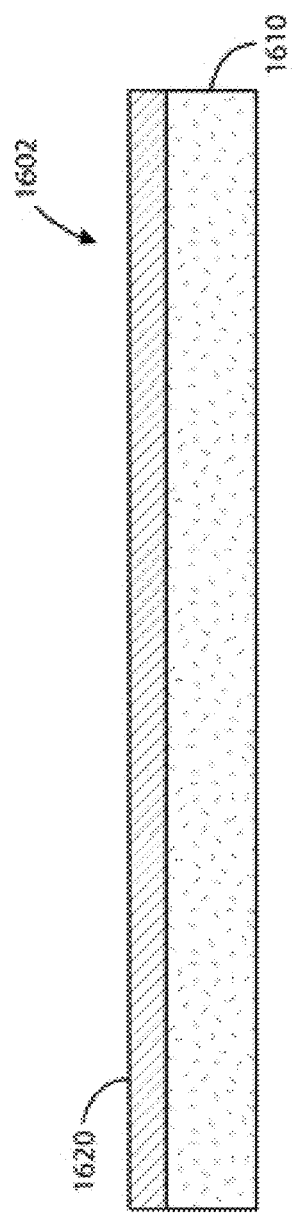
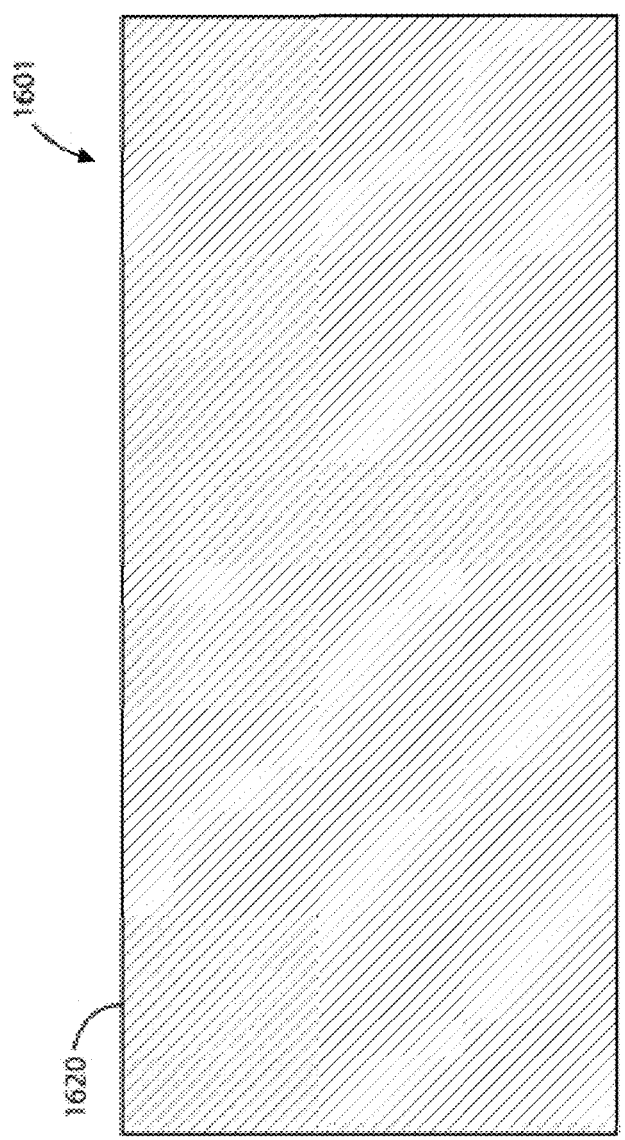
FIG. 16C
FIG. 16A
FIG. 16B

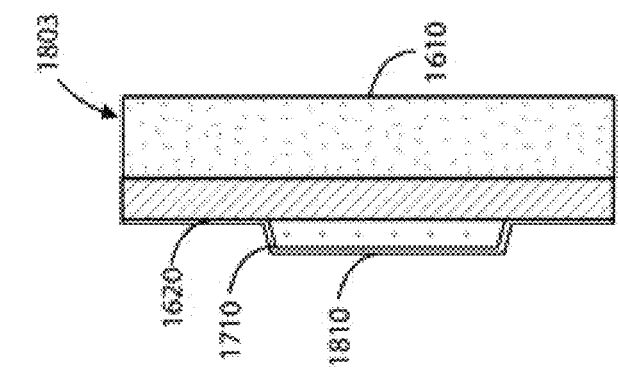
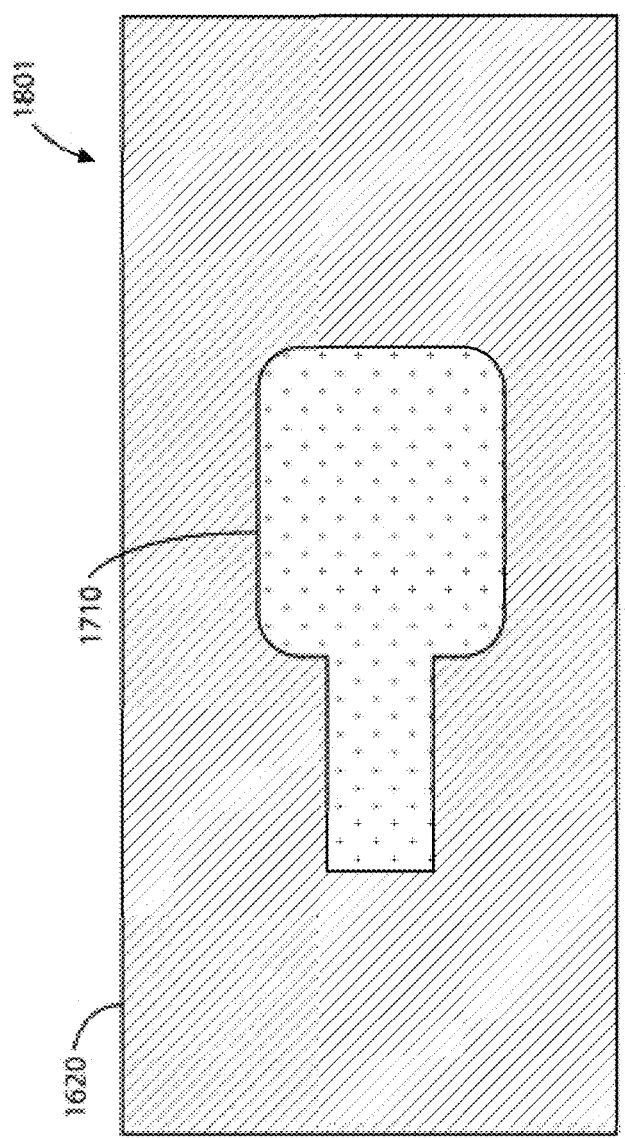
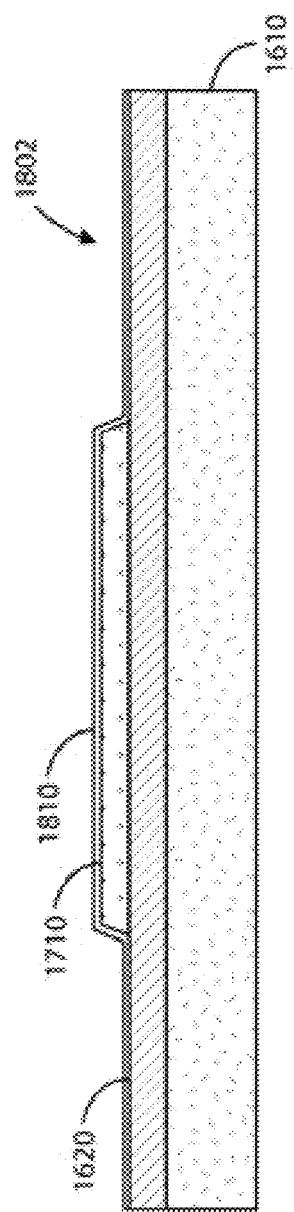
FIG. 18C
FIG. 18A
FIG. 18B

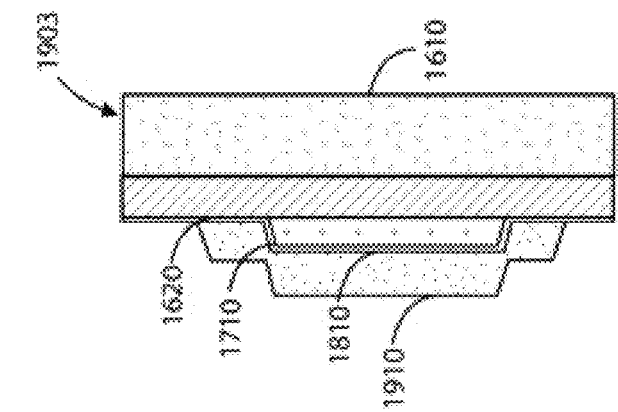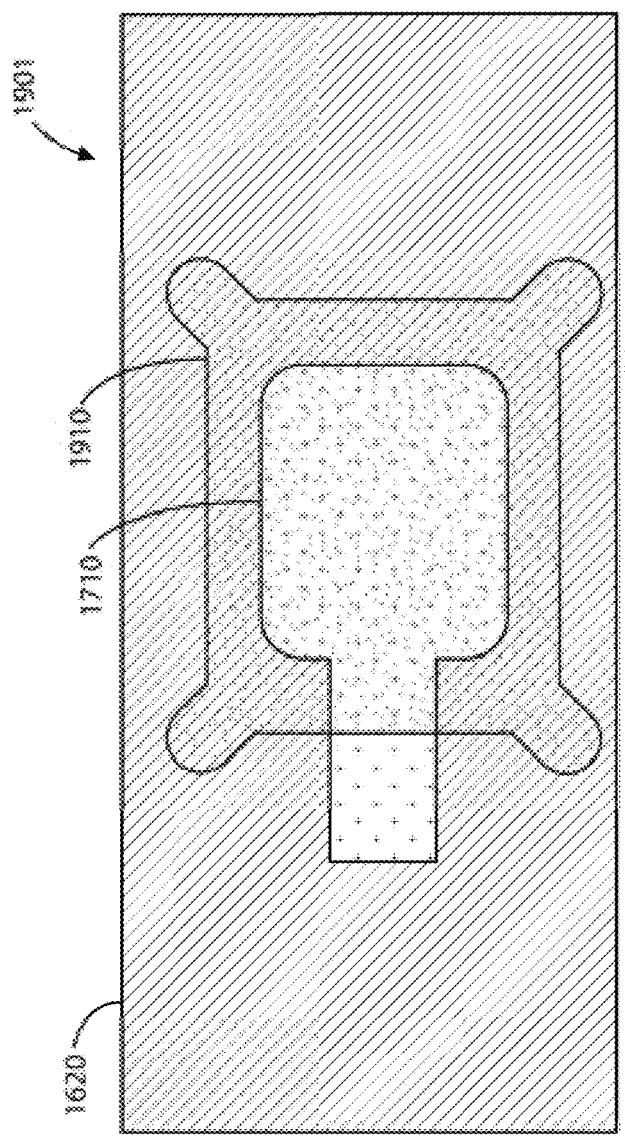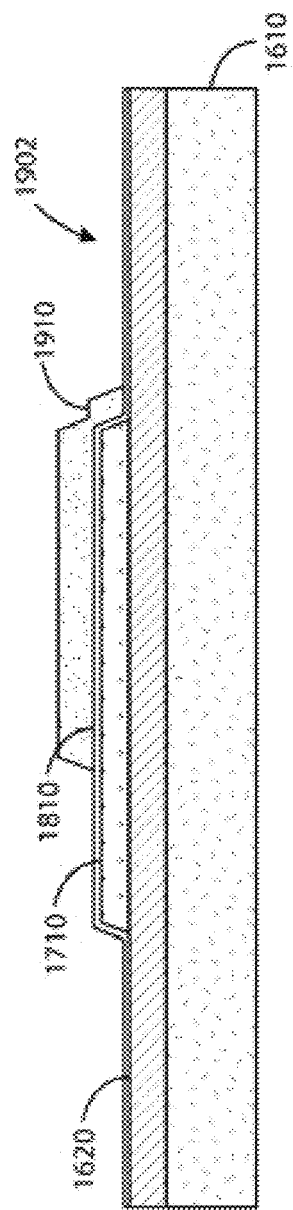

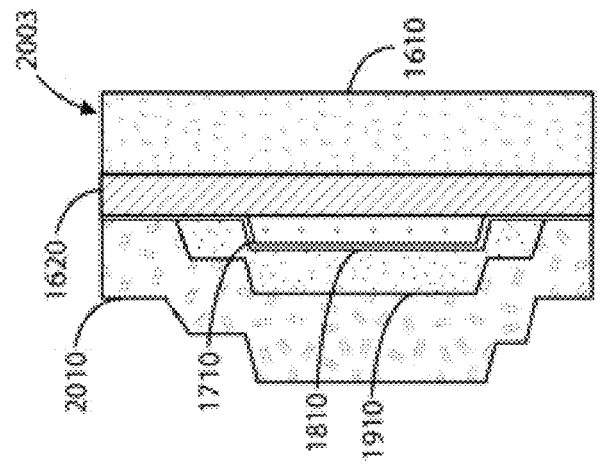
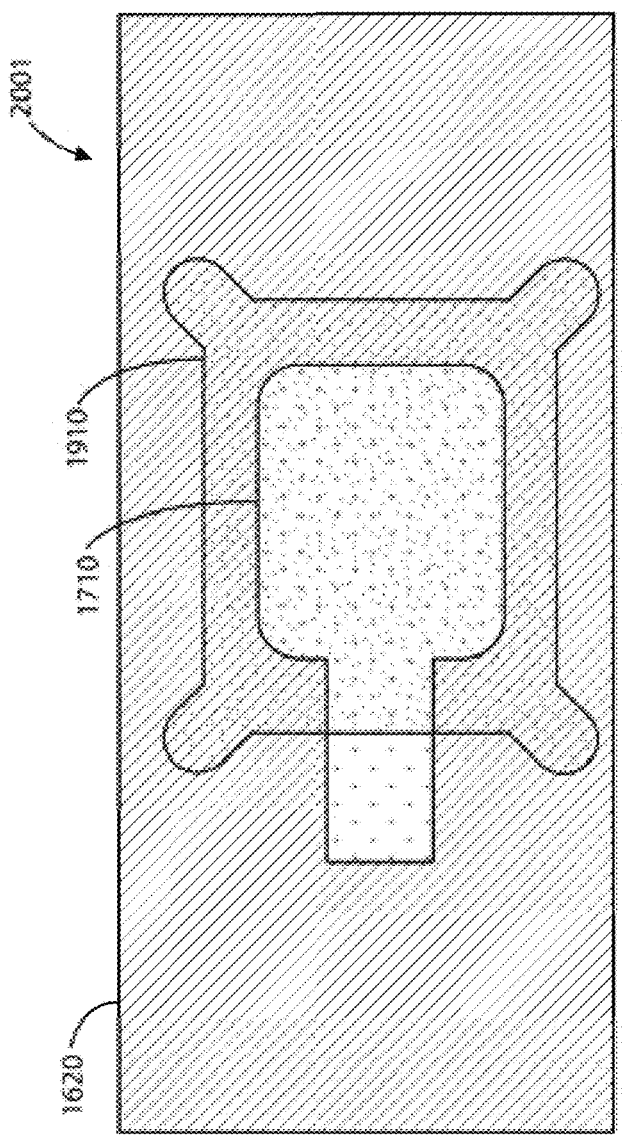
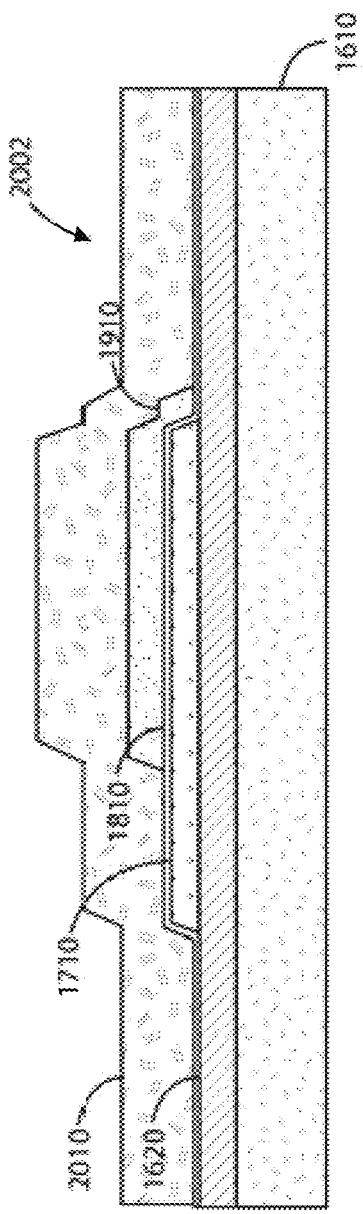
FIG. 20C
FIG. 20A
FIG. 20B

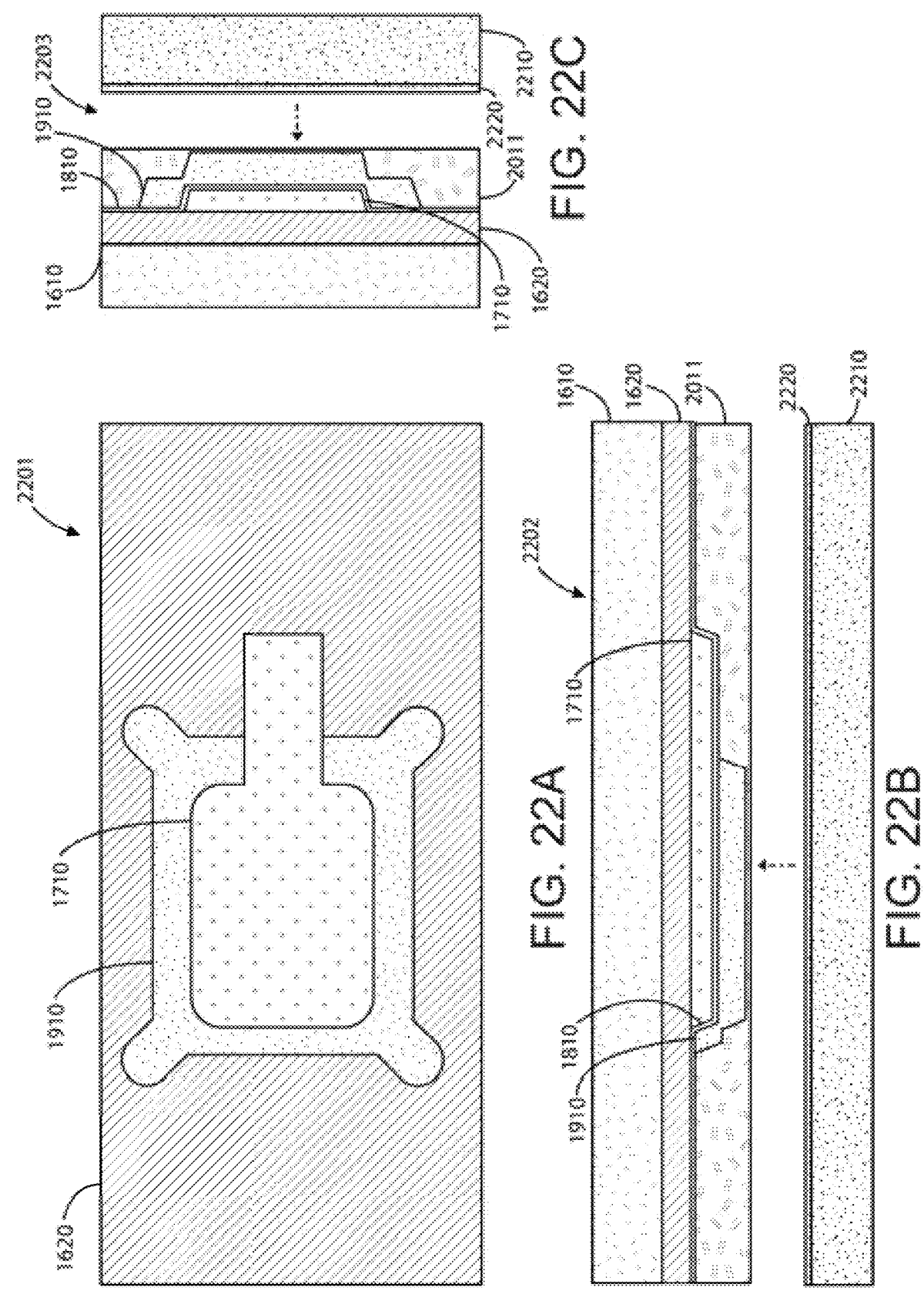

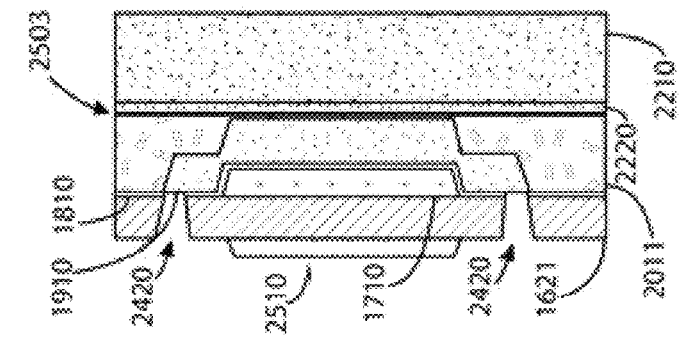
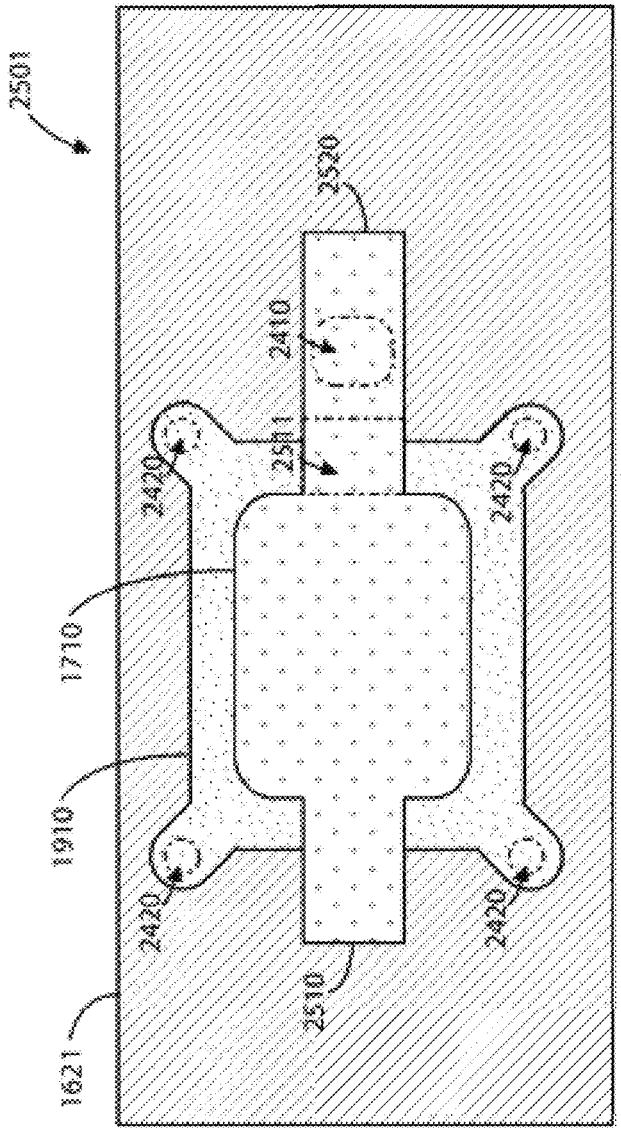
FIG. 25A
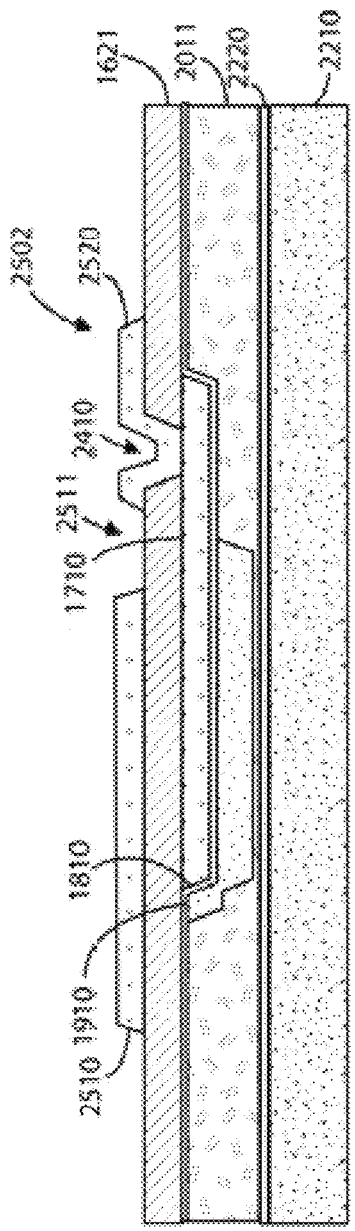
FIG. 25B
FIG. 25C

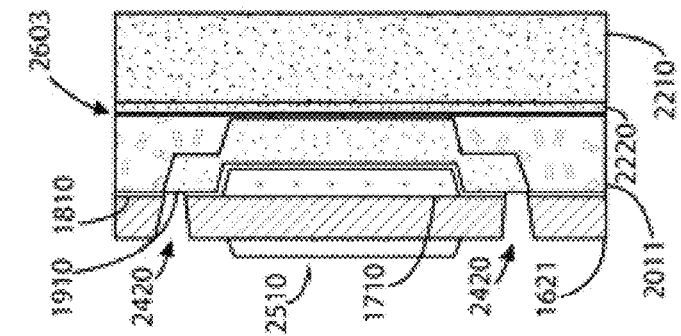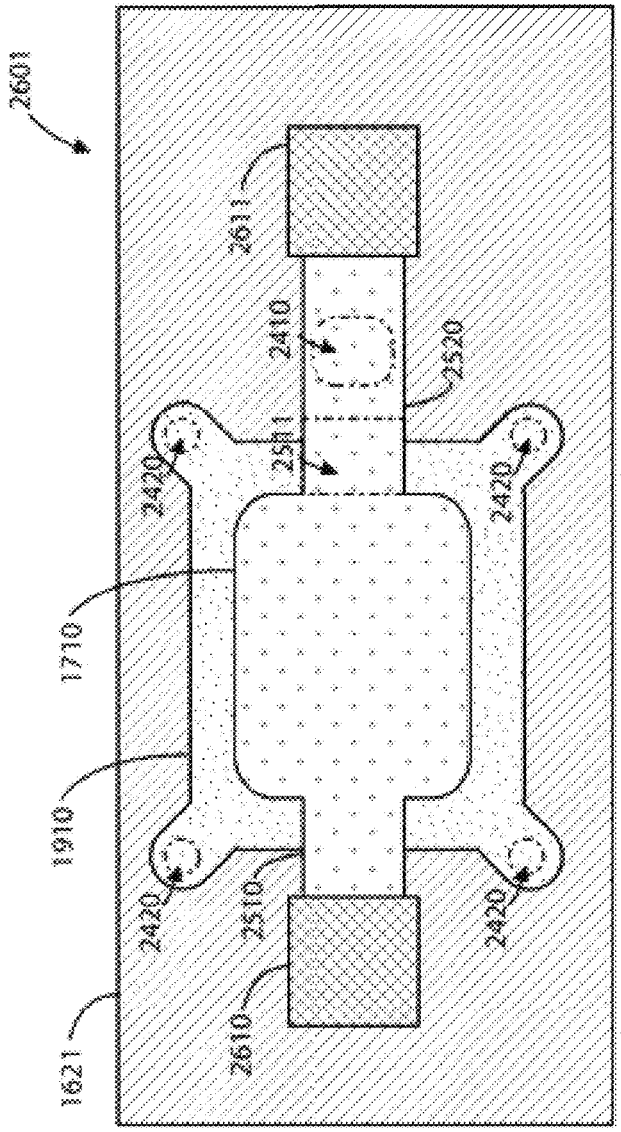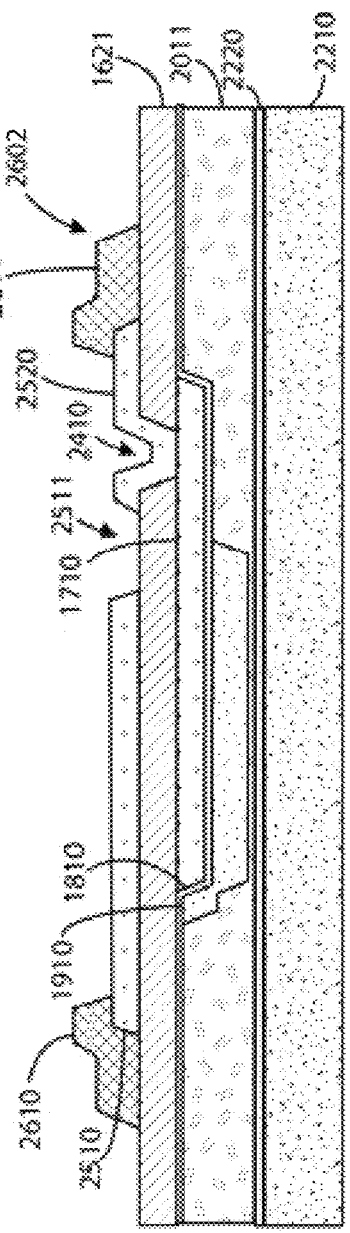

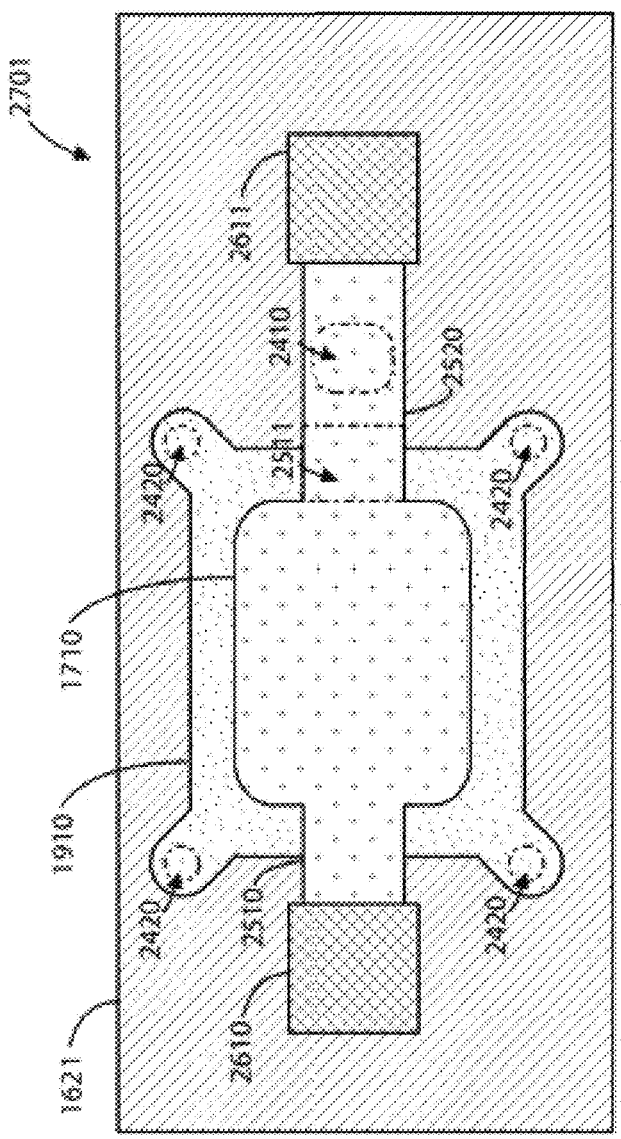
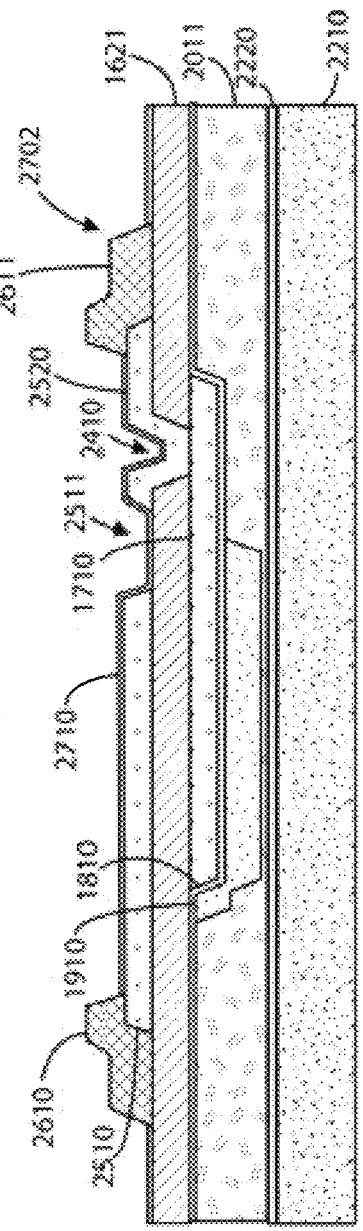
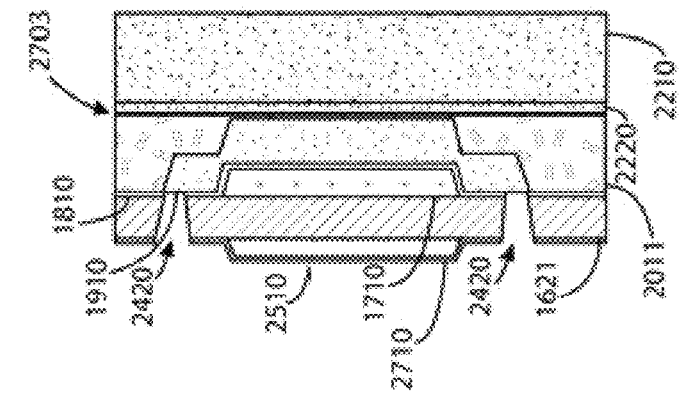
FIG. 27A
FIG. 27B
FIG. 27C

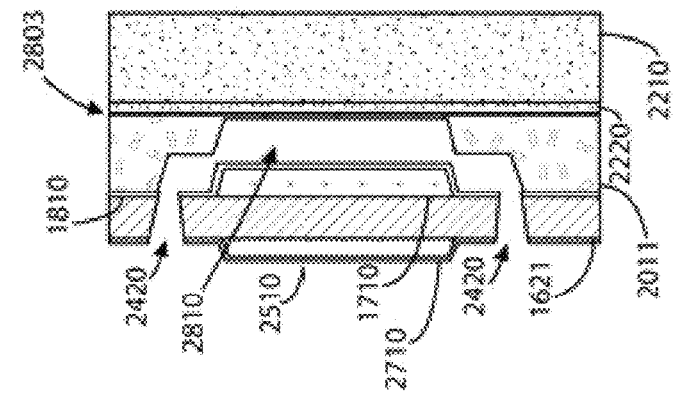
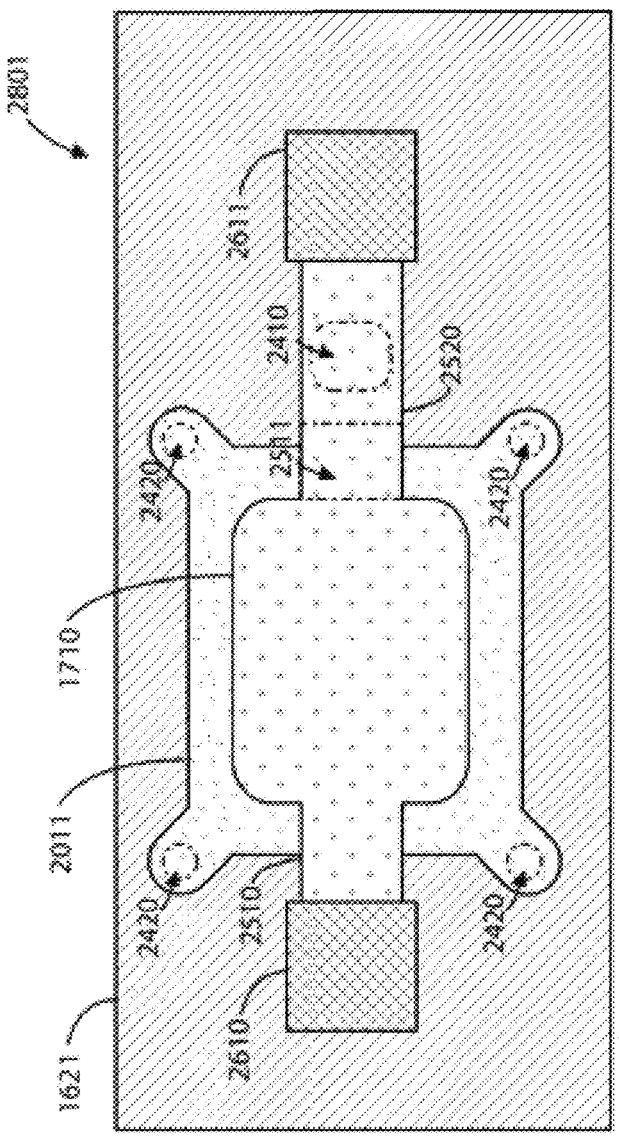
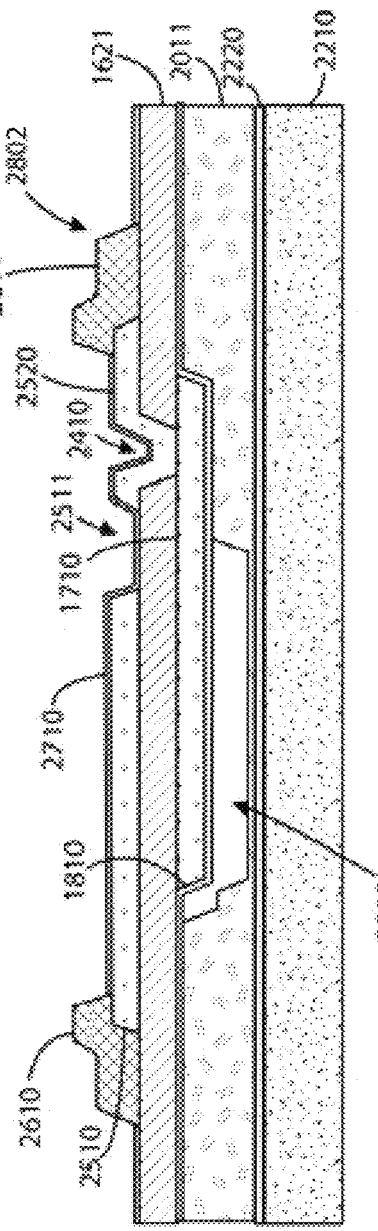
FIG. 28C
FIG. 28A
FIG. 28B

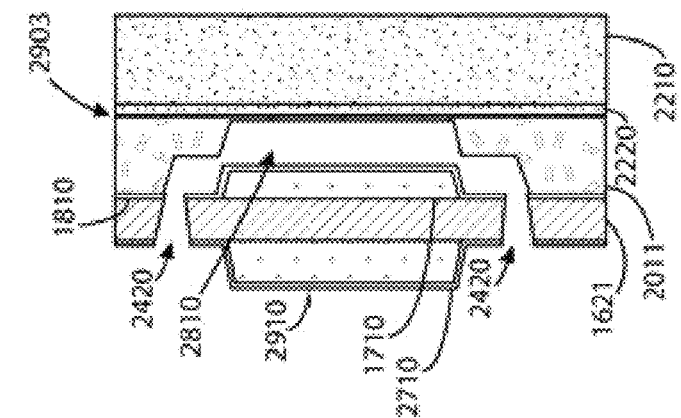
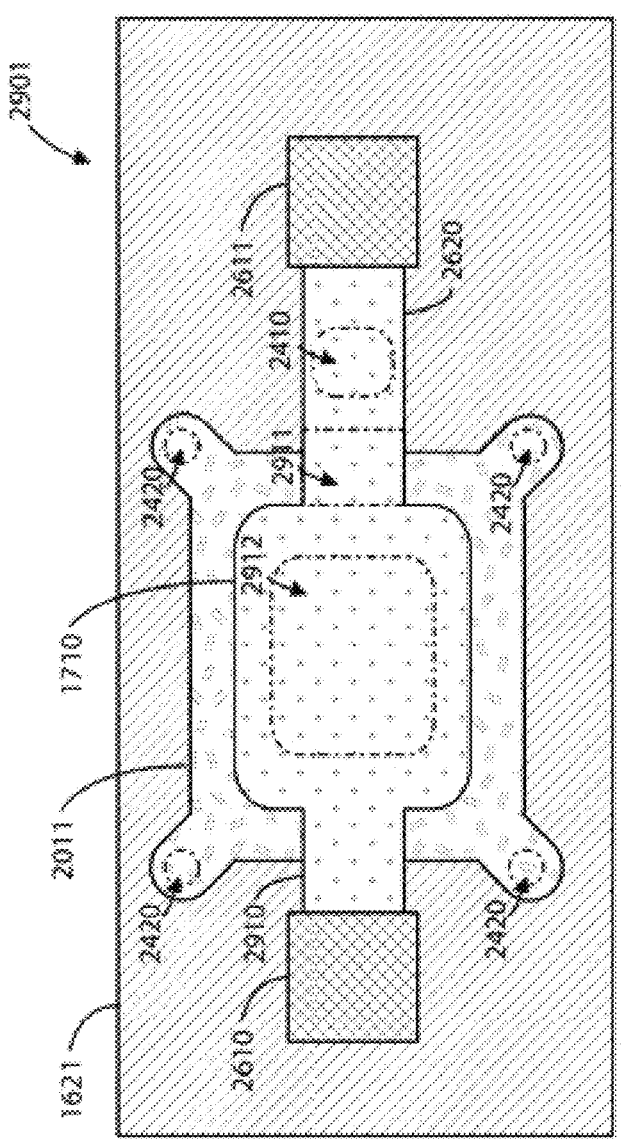
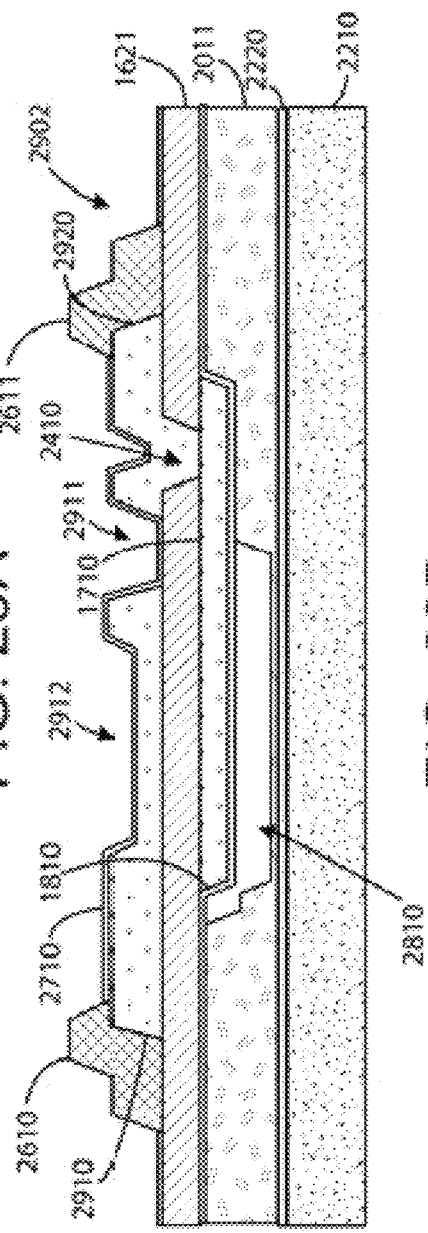
FIG. 29C
FIG. 29A
FIG. 29B

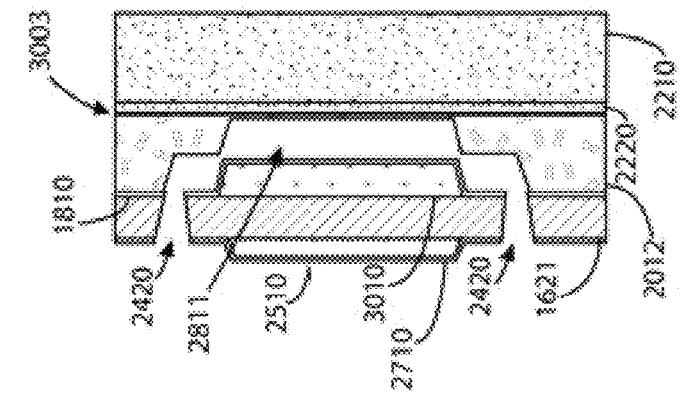
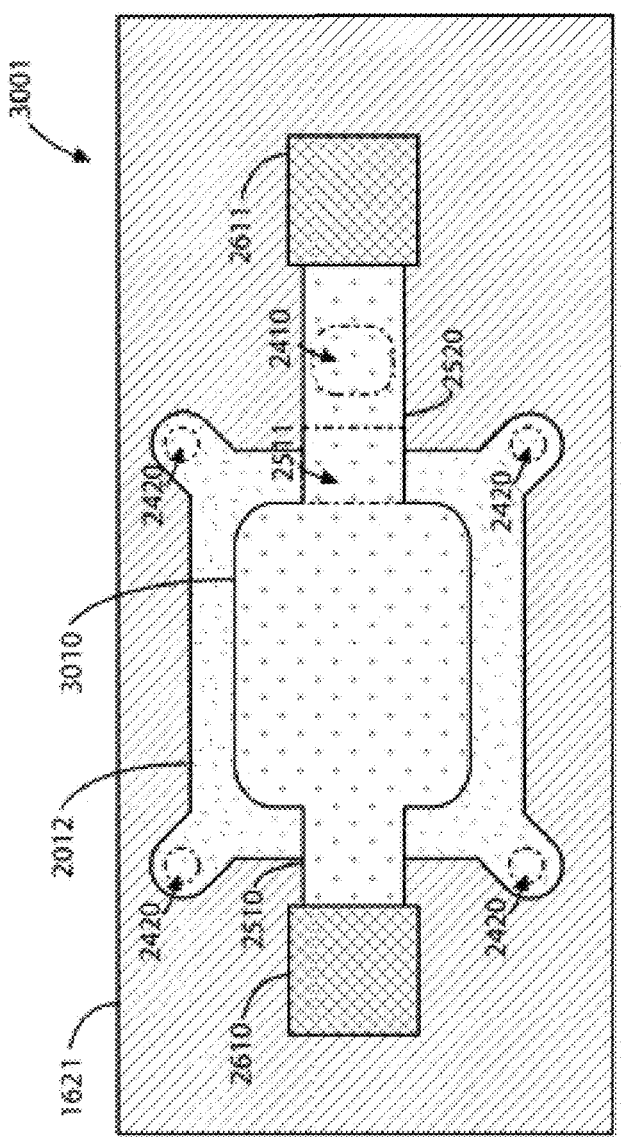
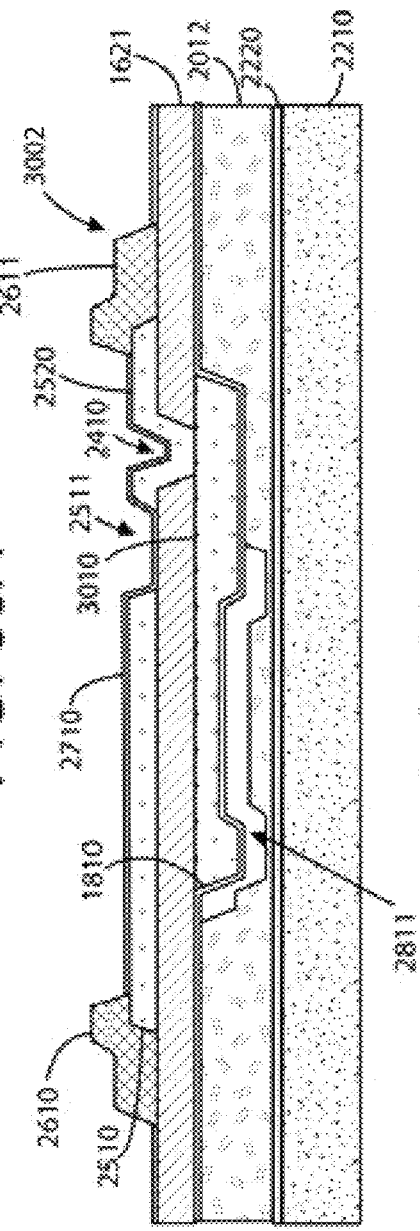
FIG. 30A
FIG. 30B
FIG. 30C

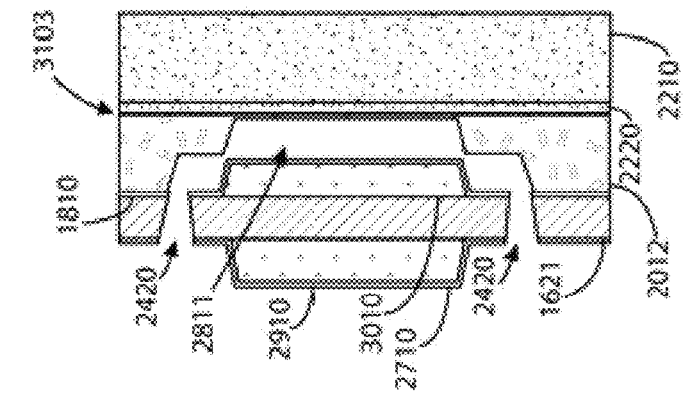
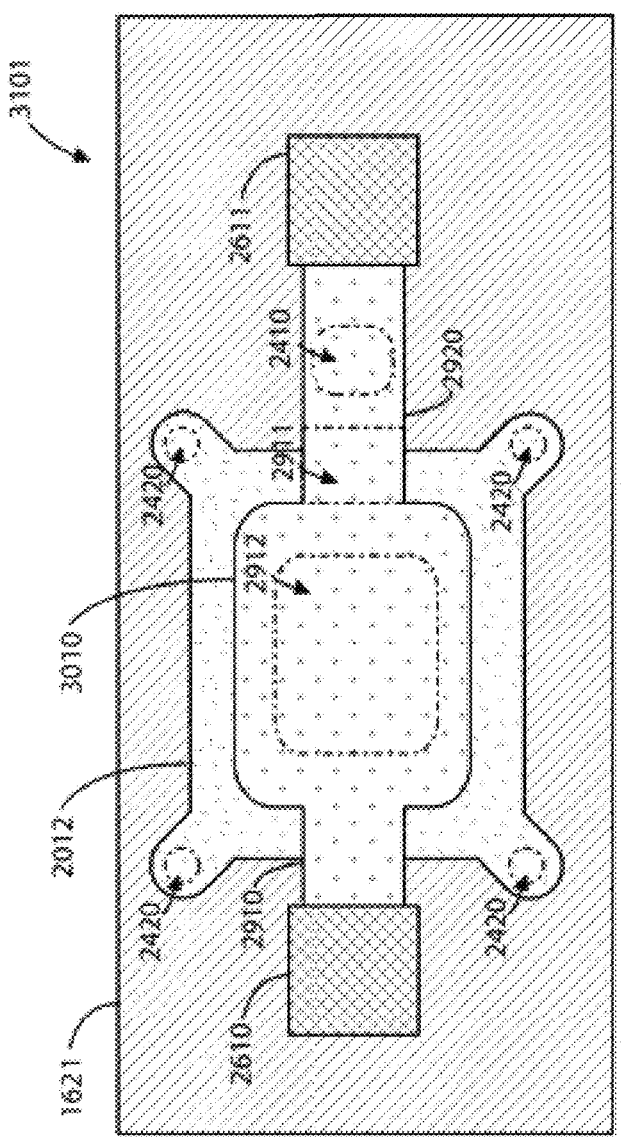
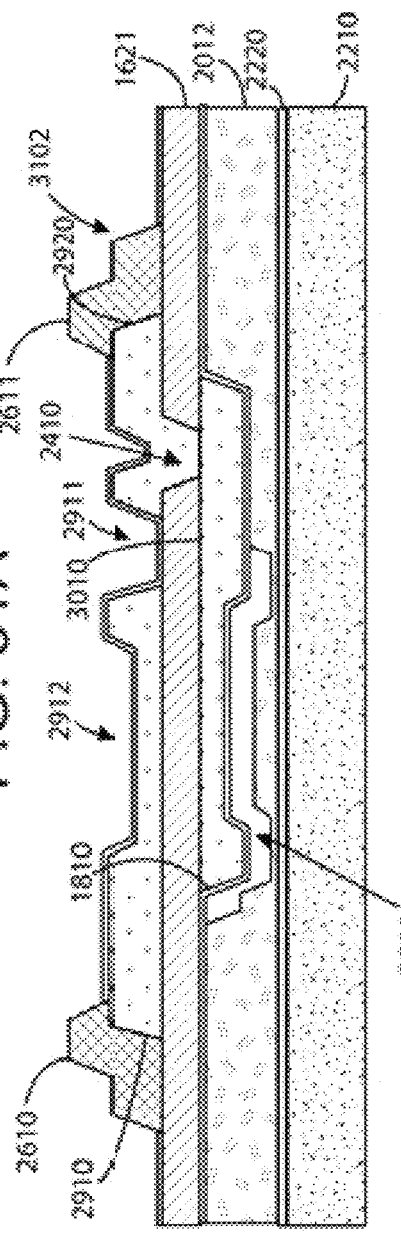

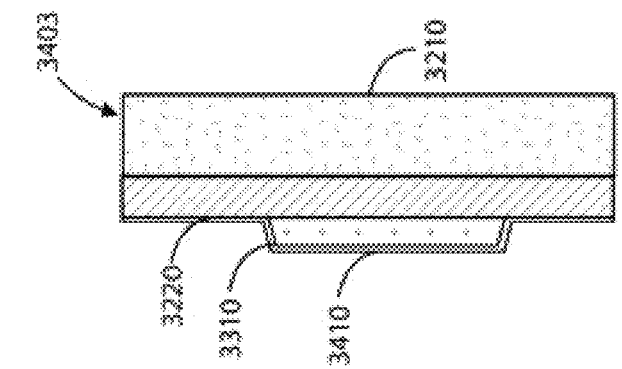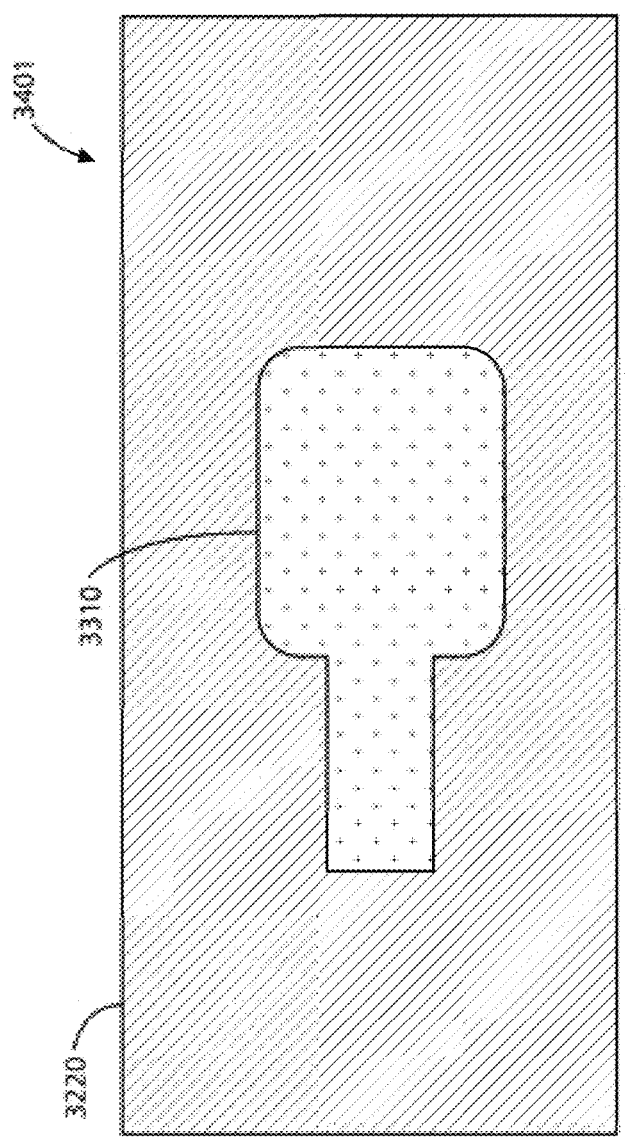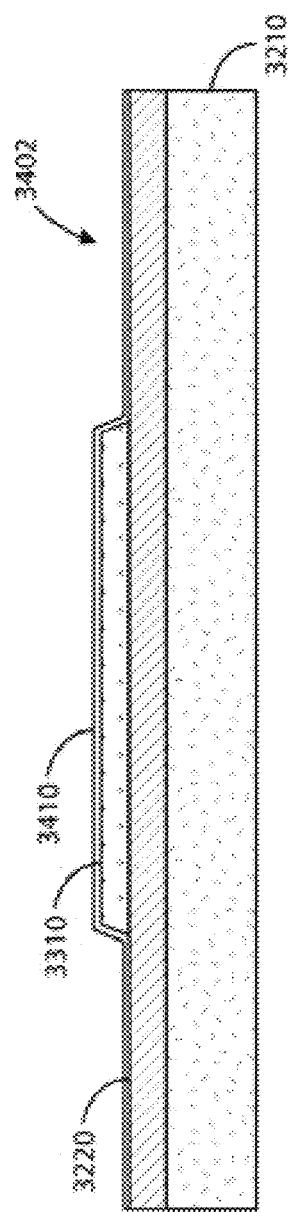
FIG. 34C
FIG. 34A
FIG. 34B

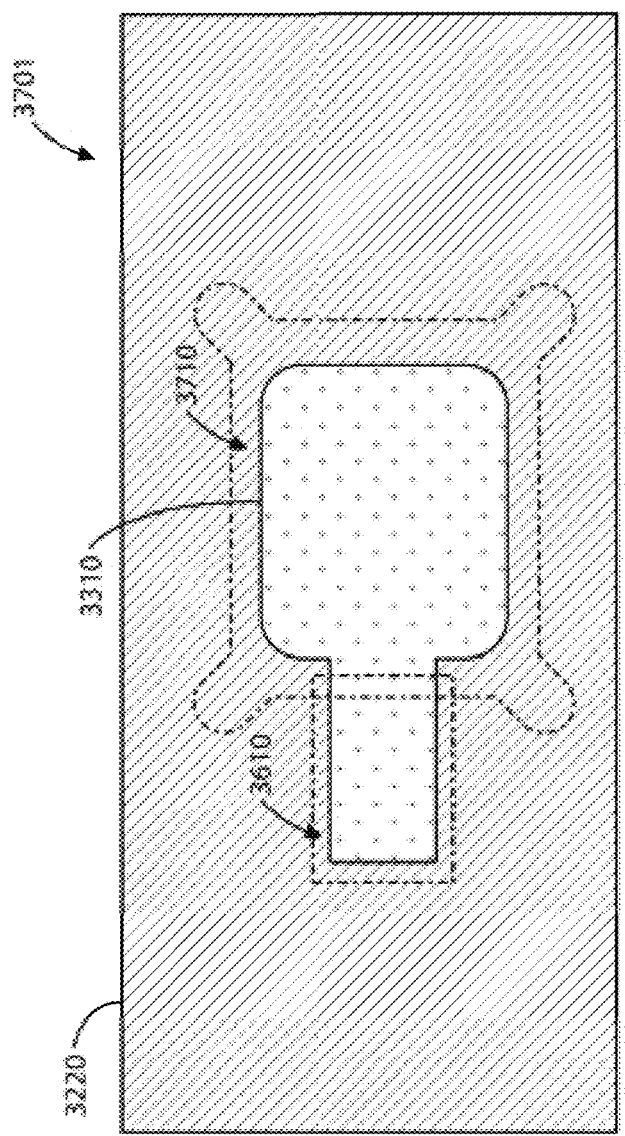
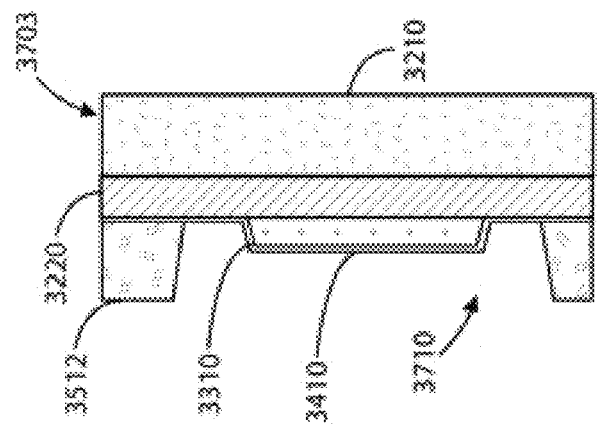
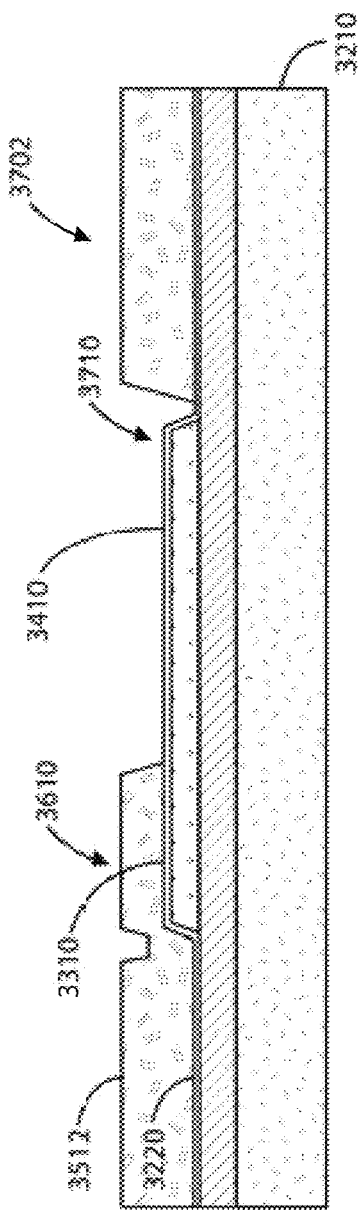
FIG. 37A
FIG. 37B
FIG. 37C

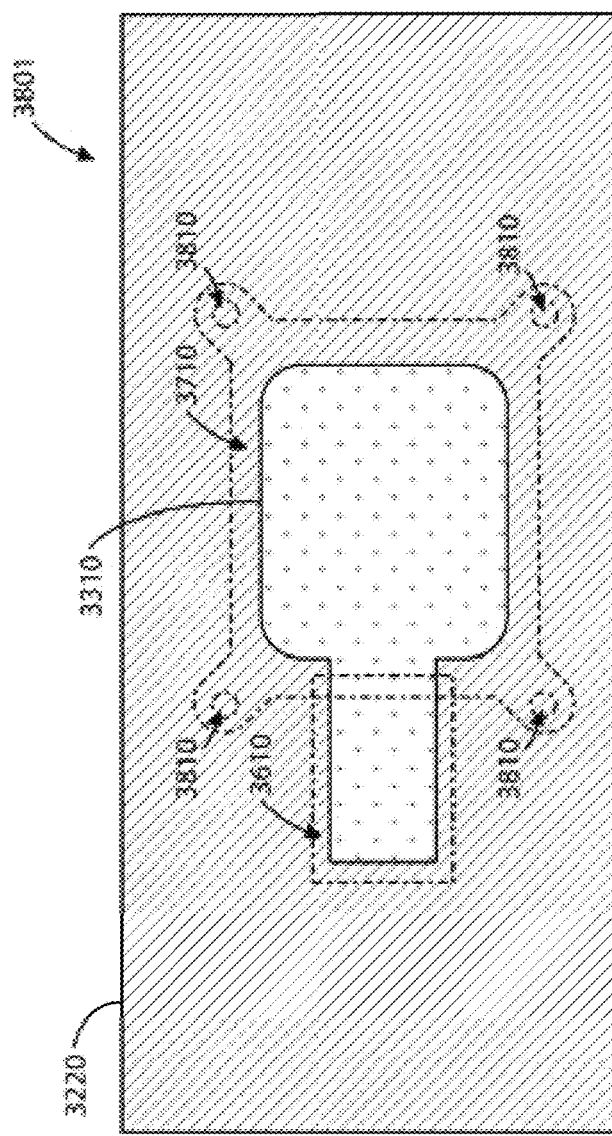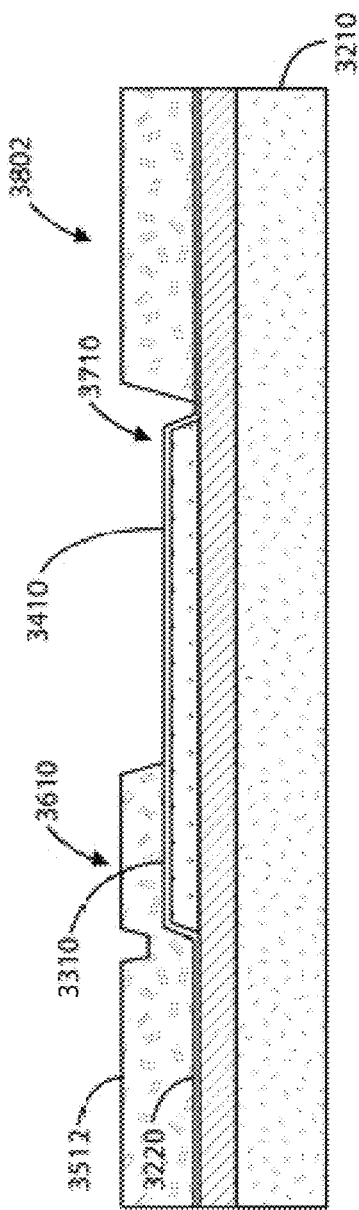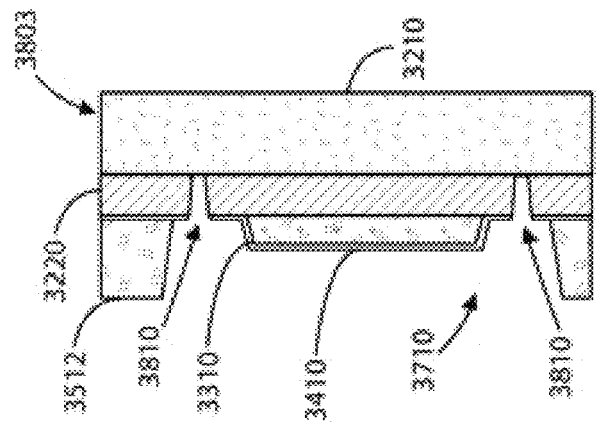
FIG. 38A
FIG. 38B
FIG. 38C

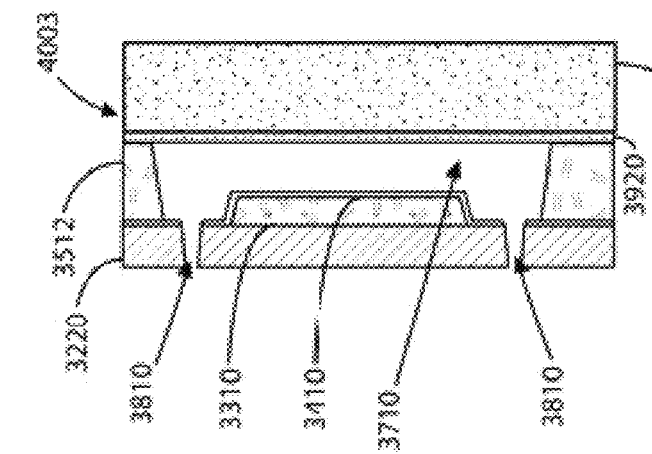
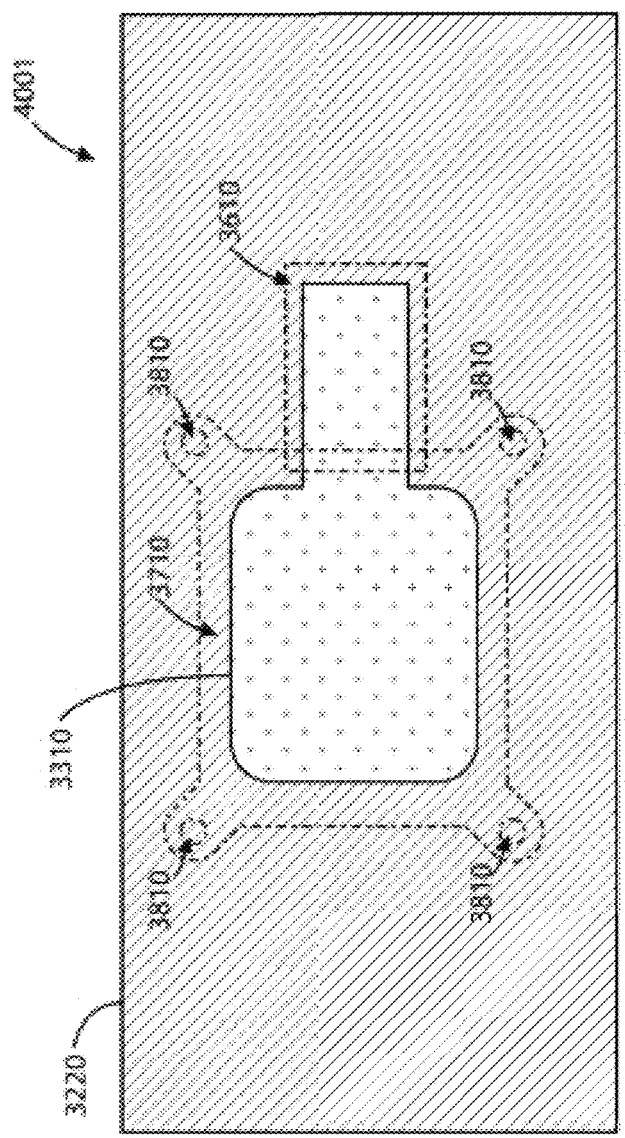
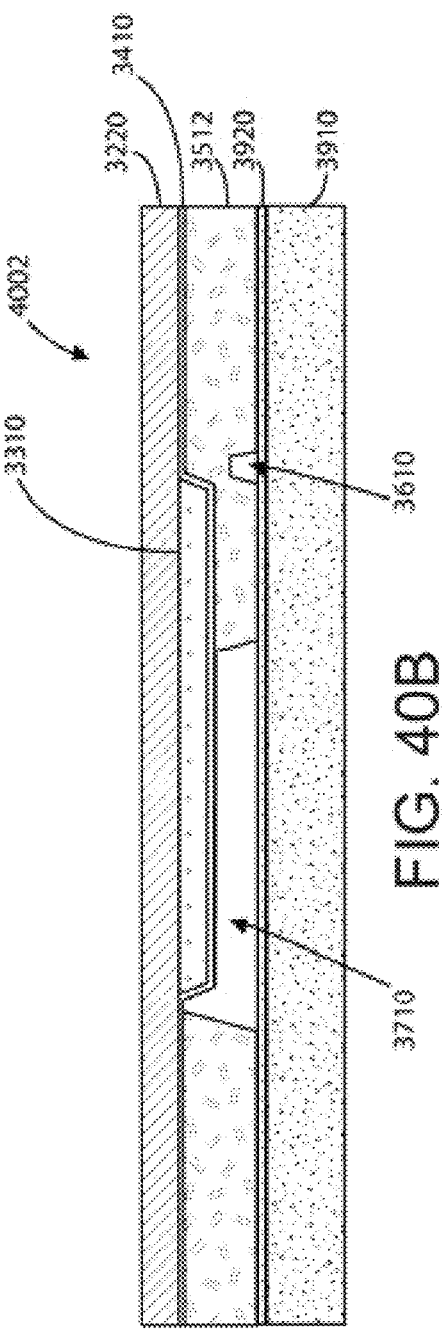
FIG. 40A
FIG. 40B
FIG. 40C

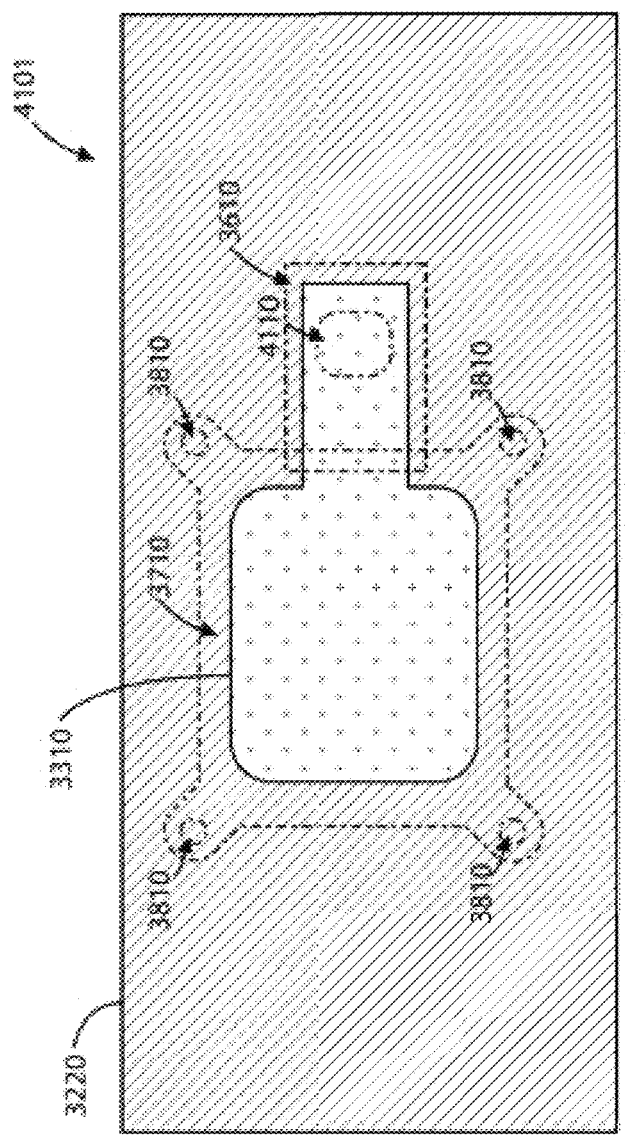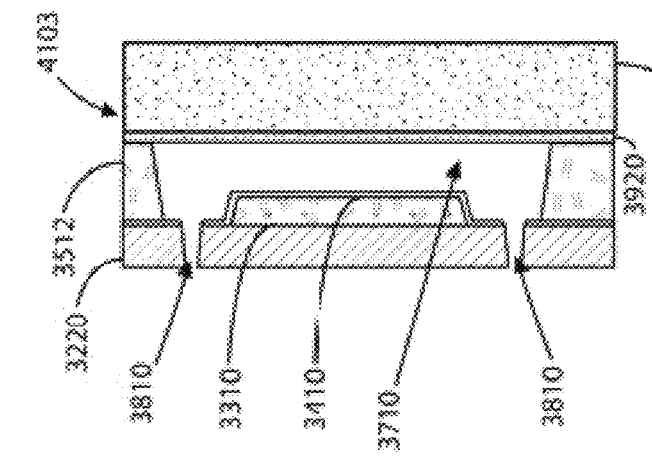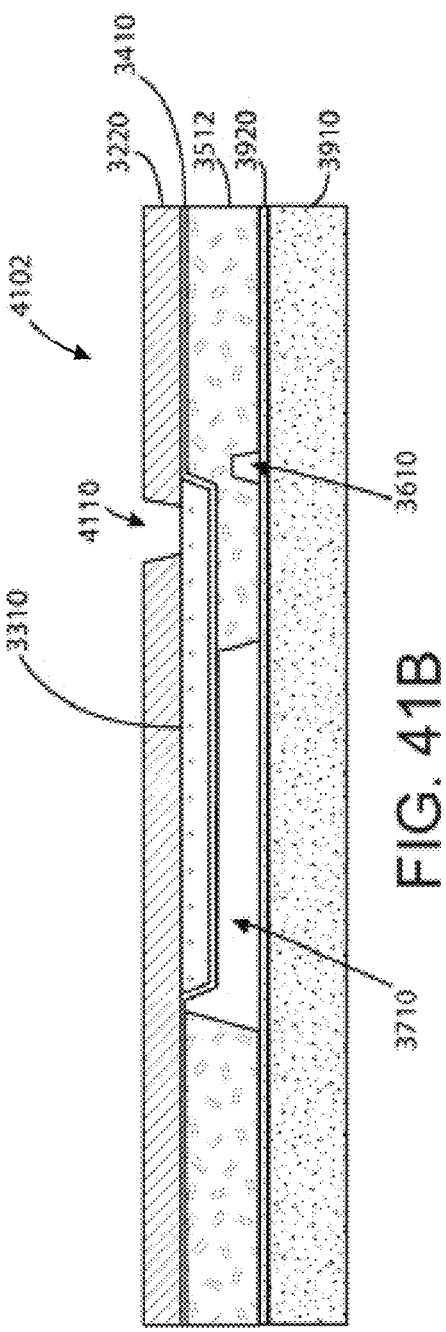
FIG. 41A
FIG. 41B
FIG. 41C

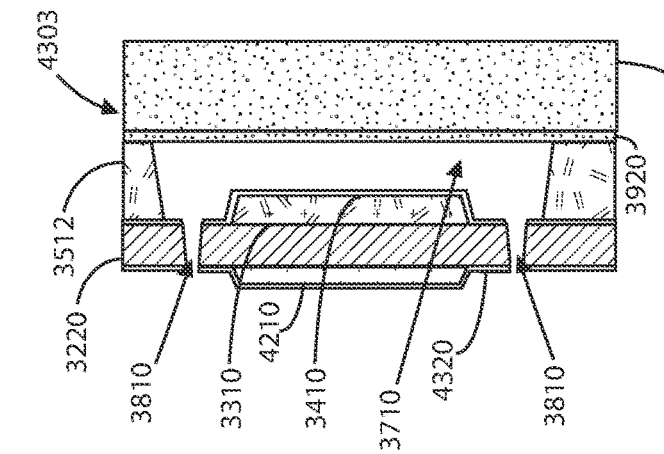
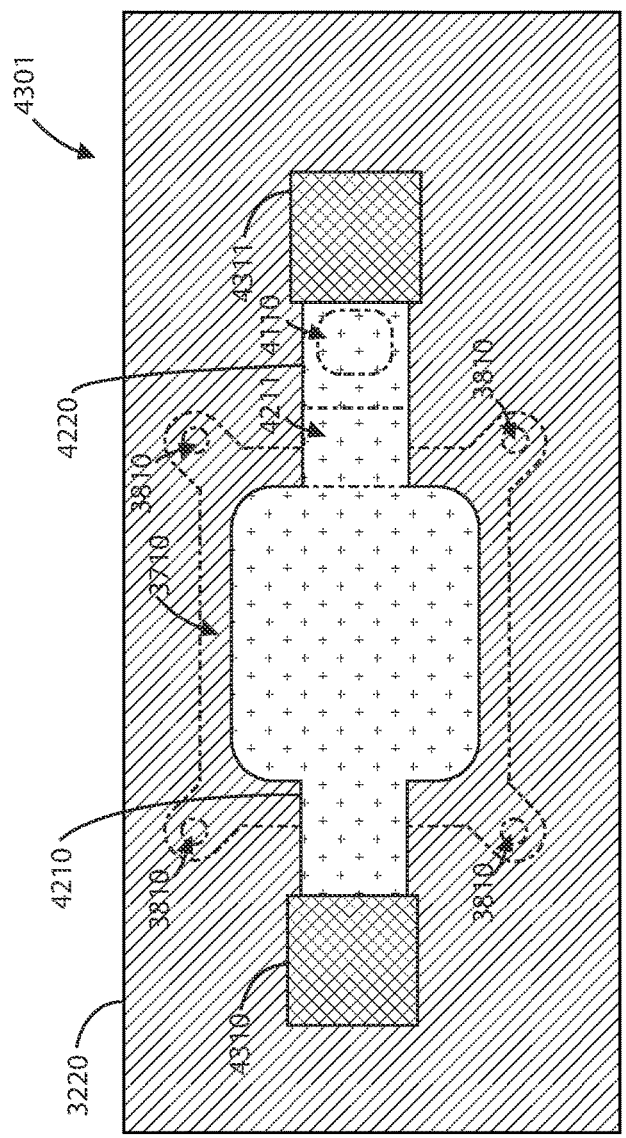
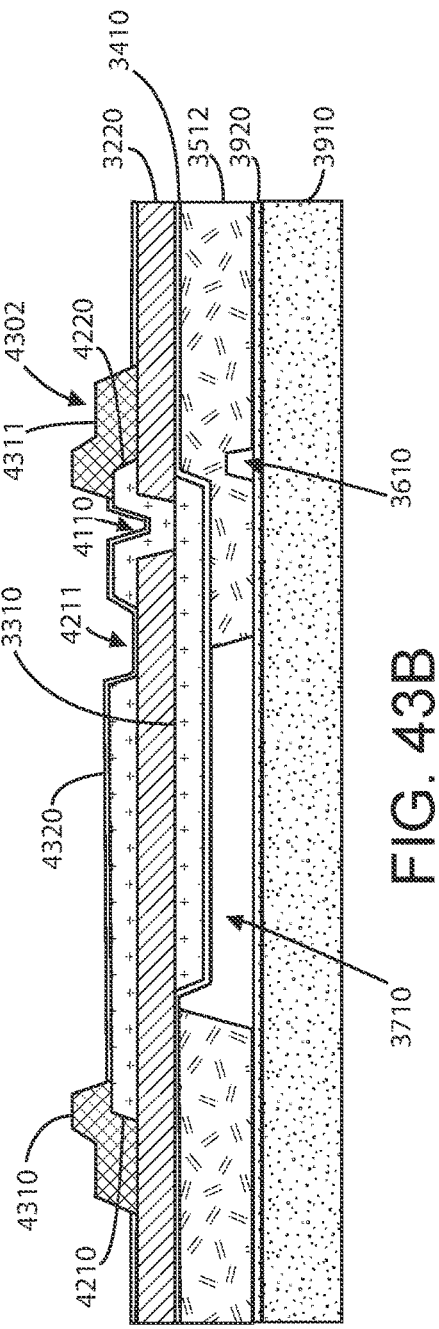
FIG. 43C
FIG. 43A
FIG. 43B

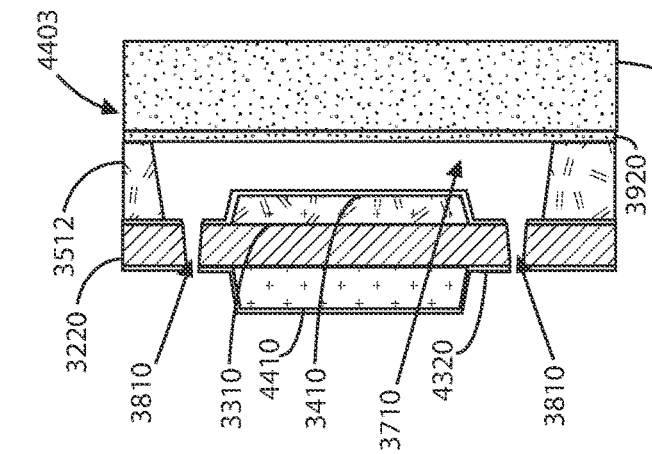
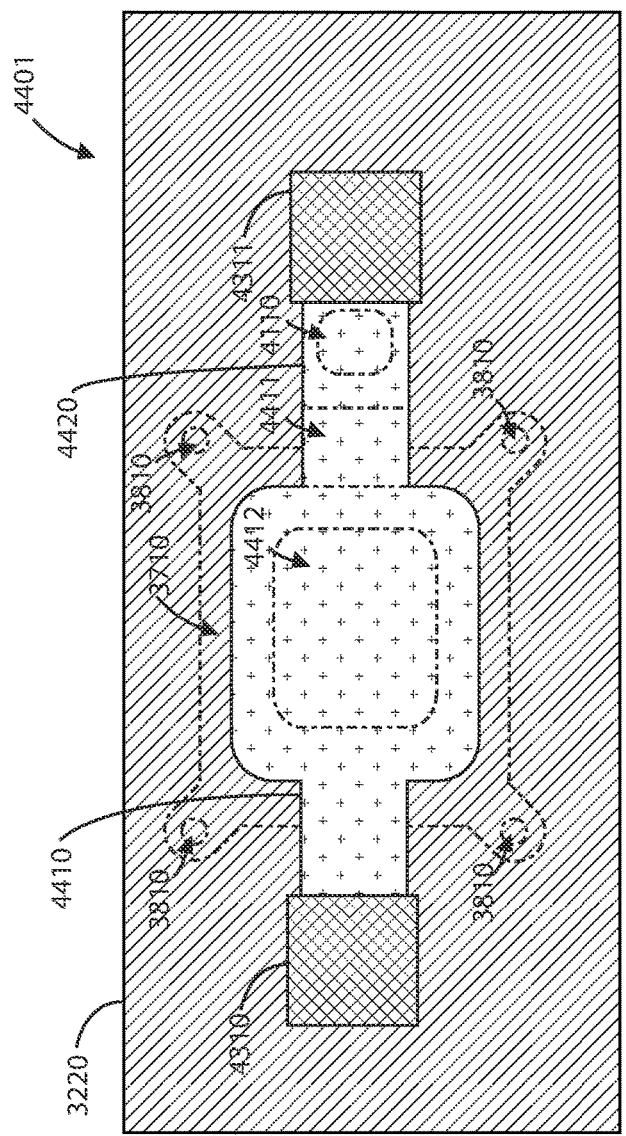
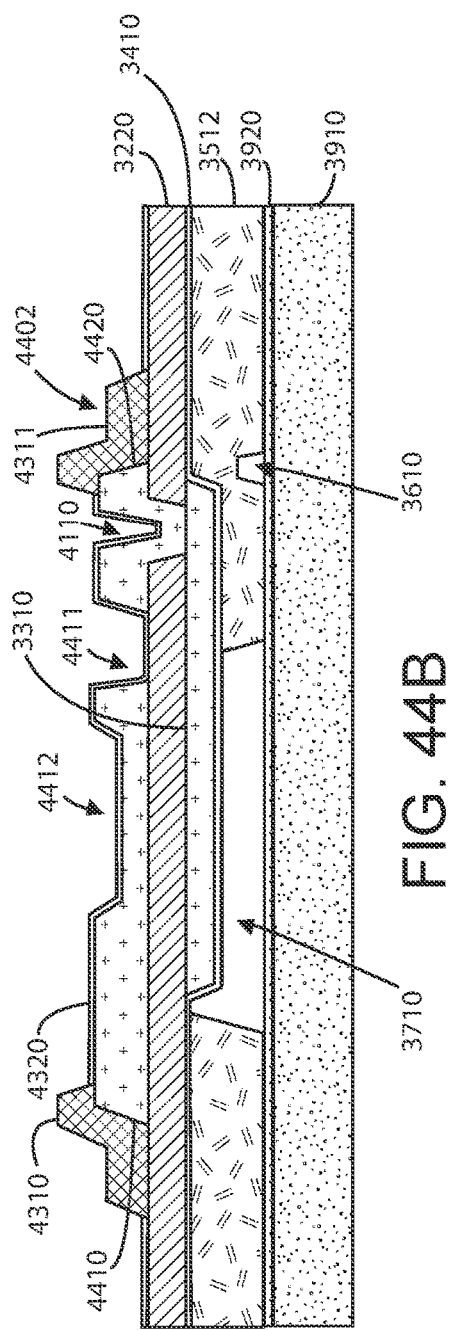

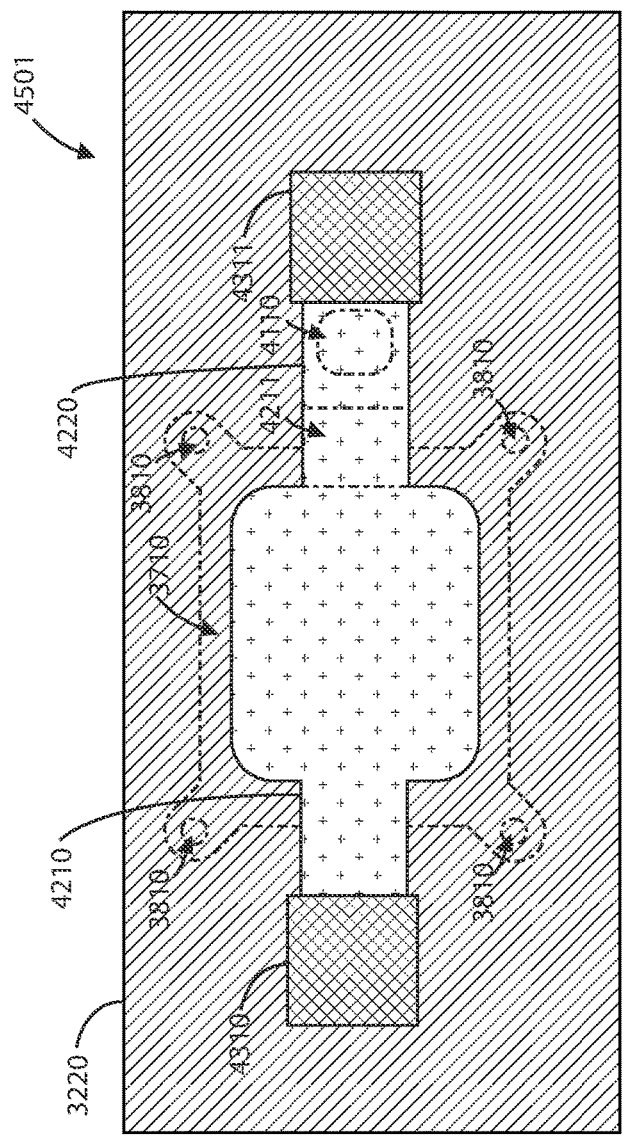
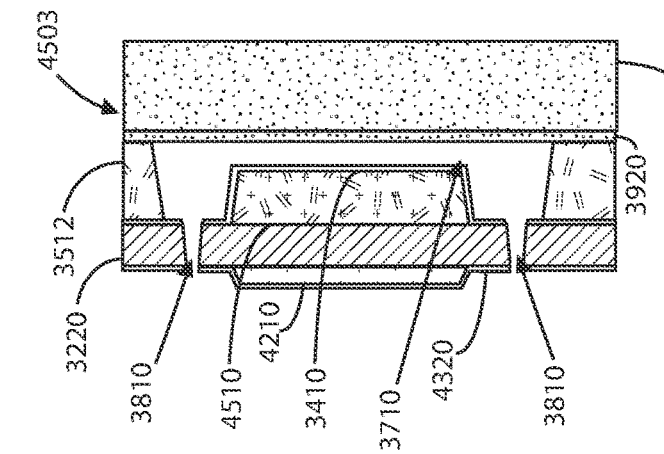
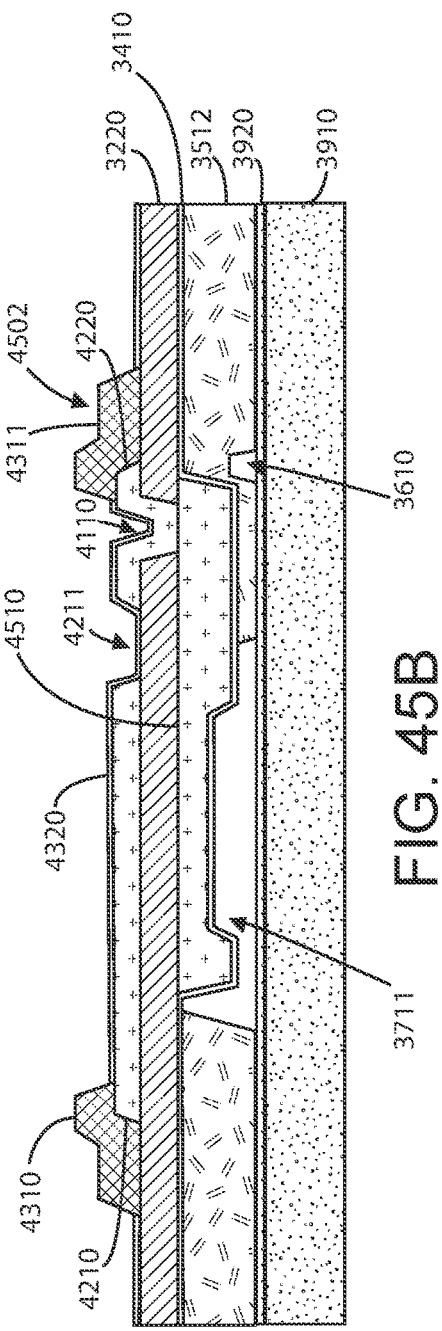
FIG. 45A
FIG. 45B
FIG. 45C

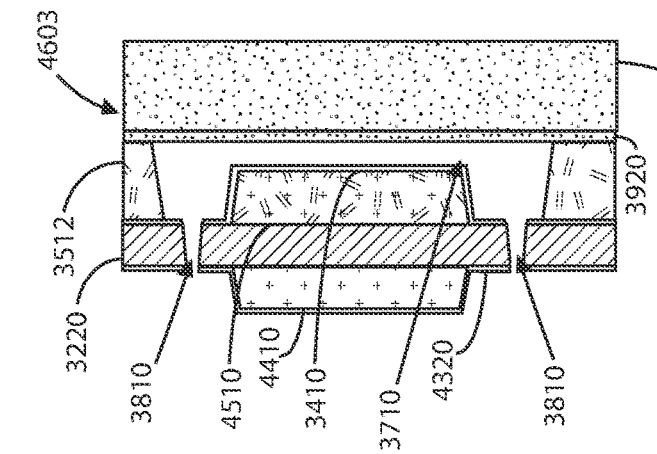
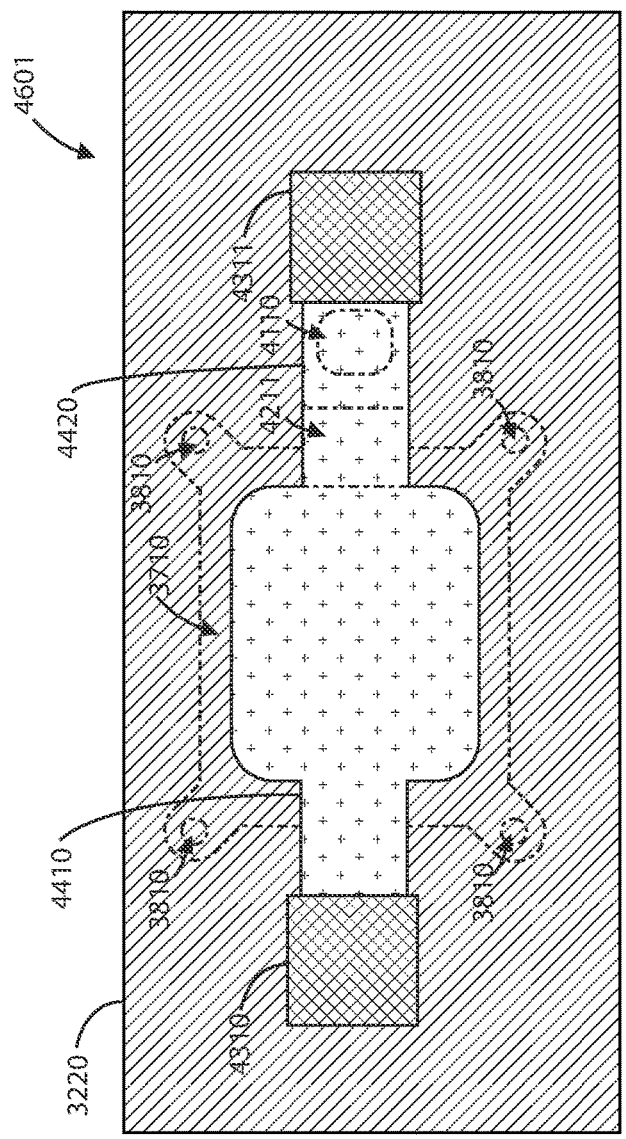
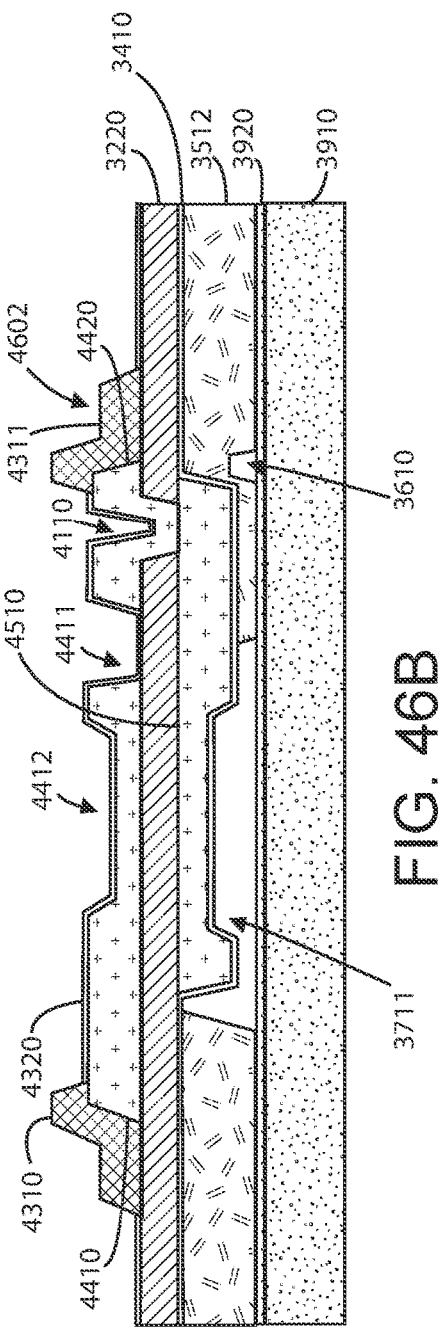
FIG. 46C
FIG. 46A
FIG. 46B

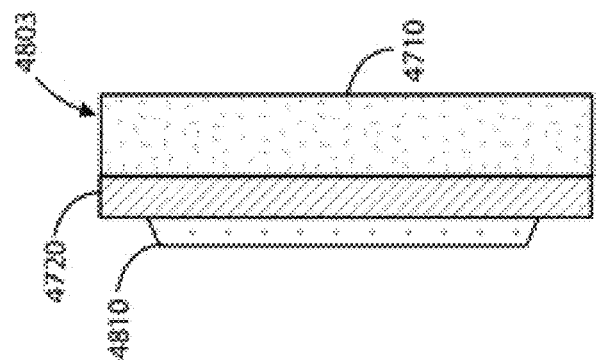
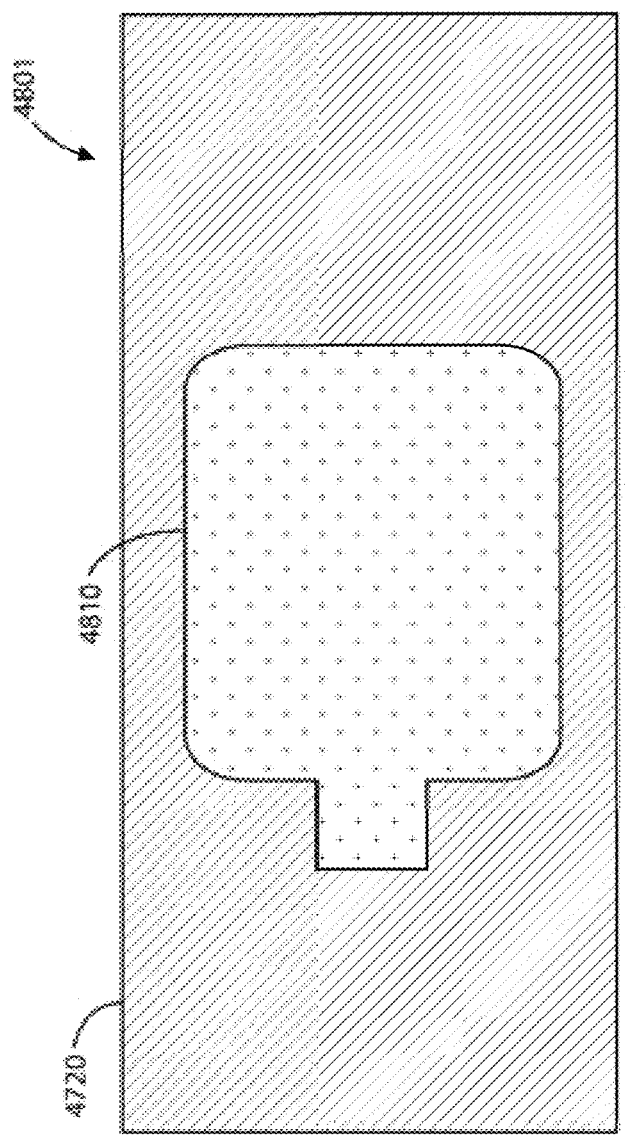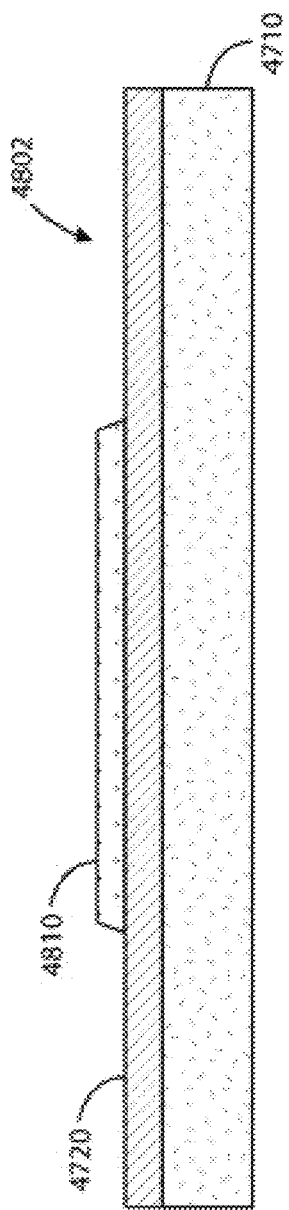

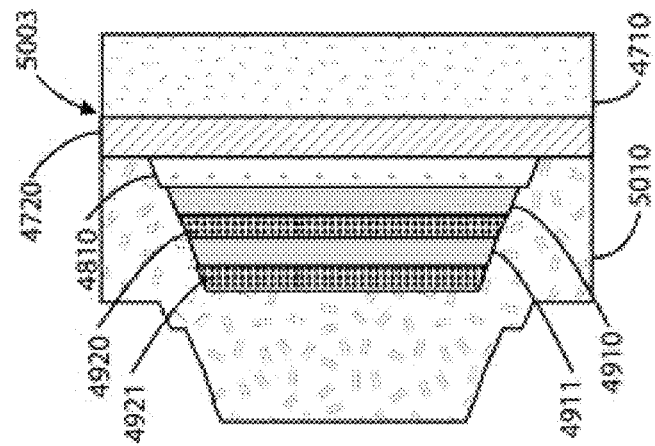
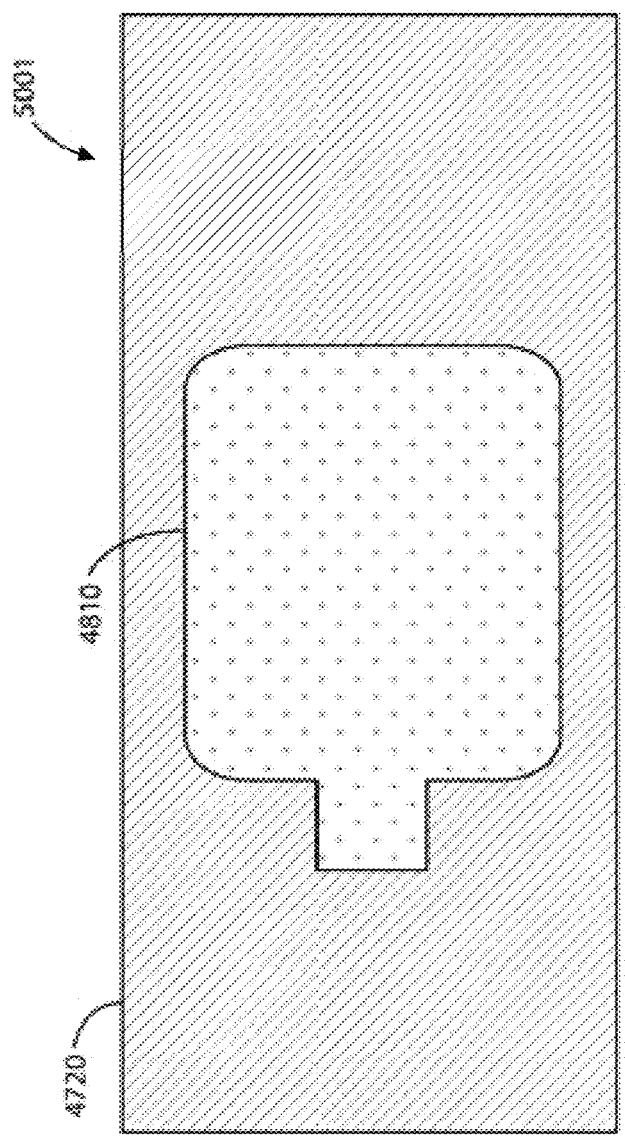
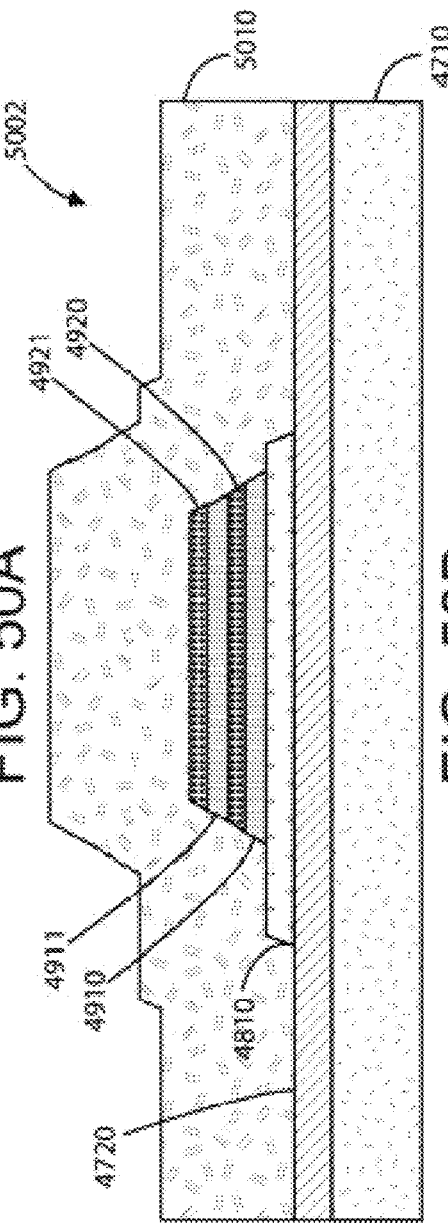

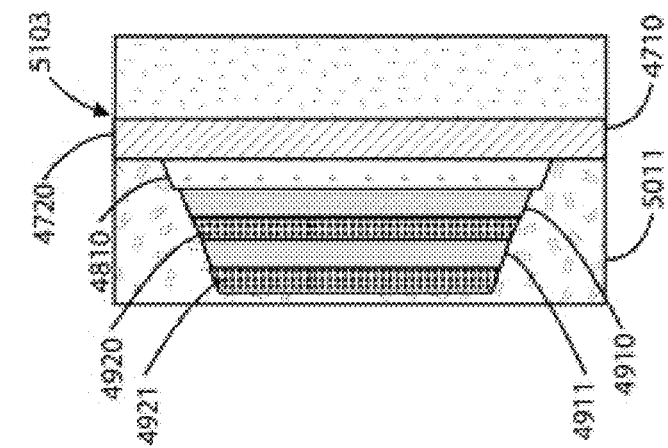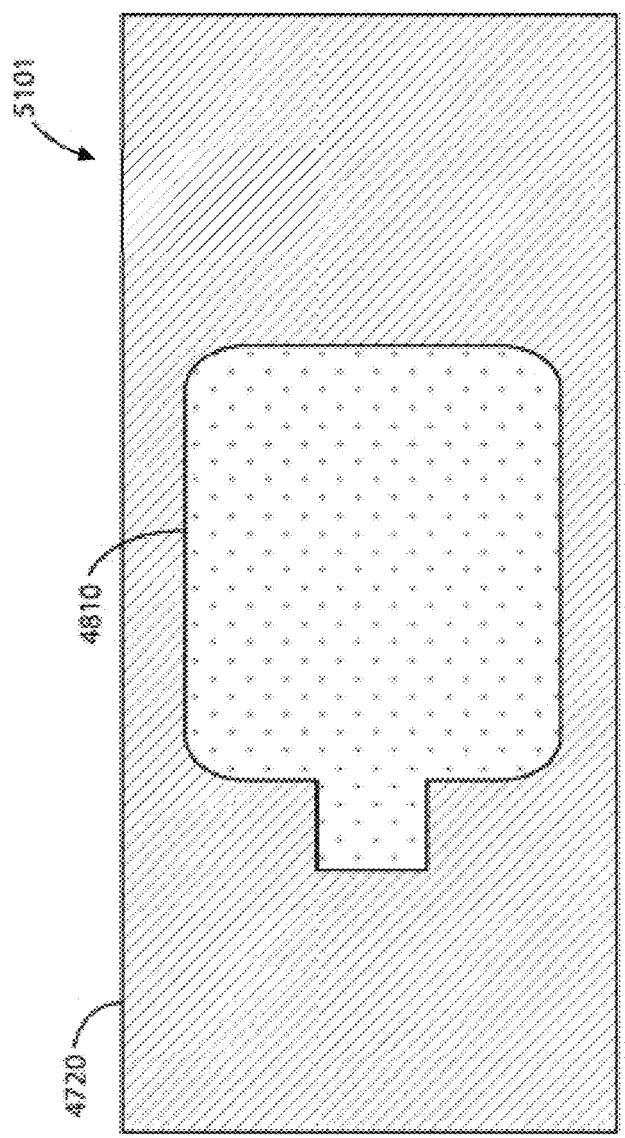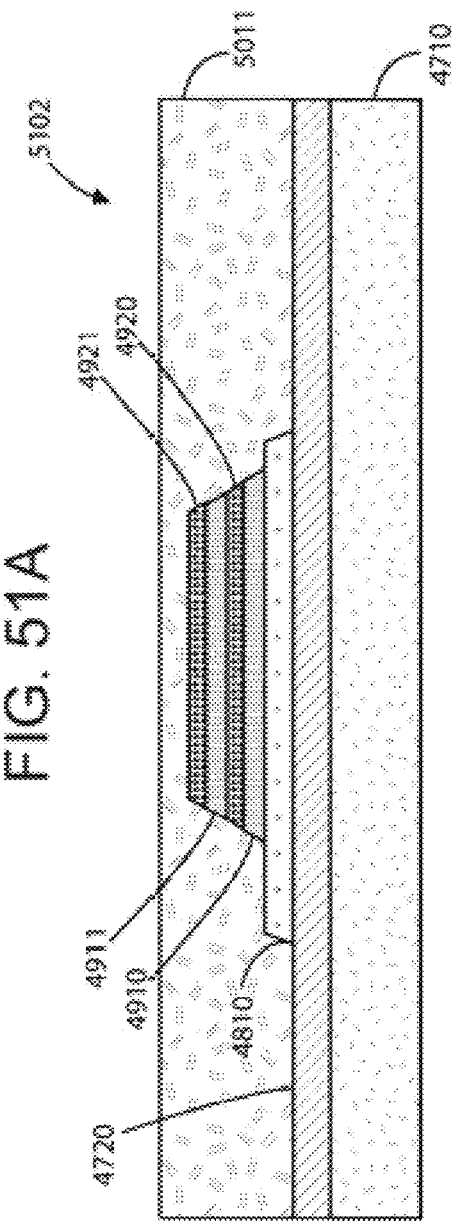

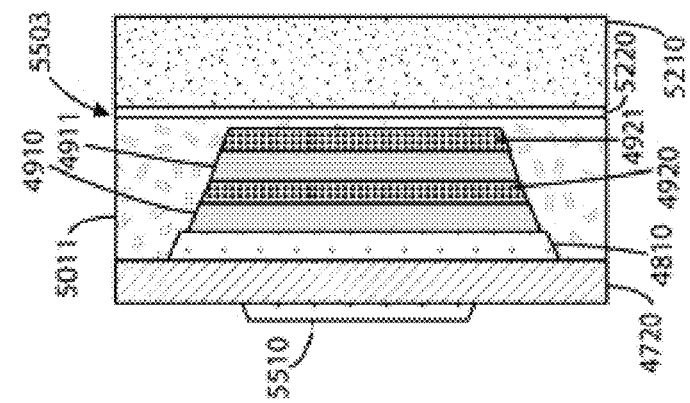
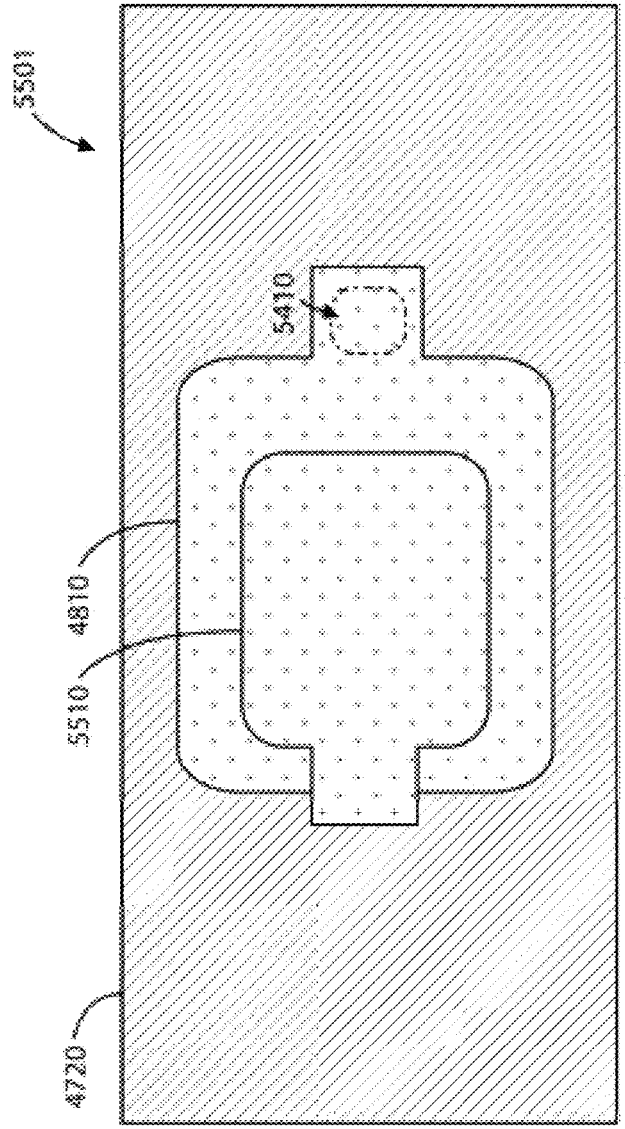
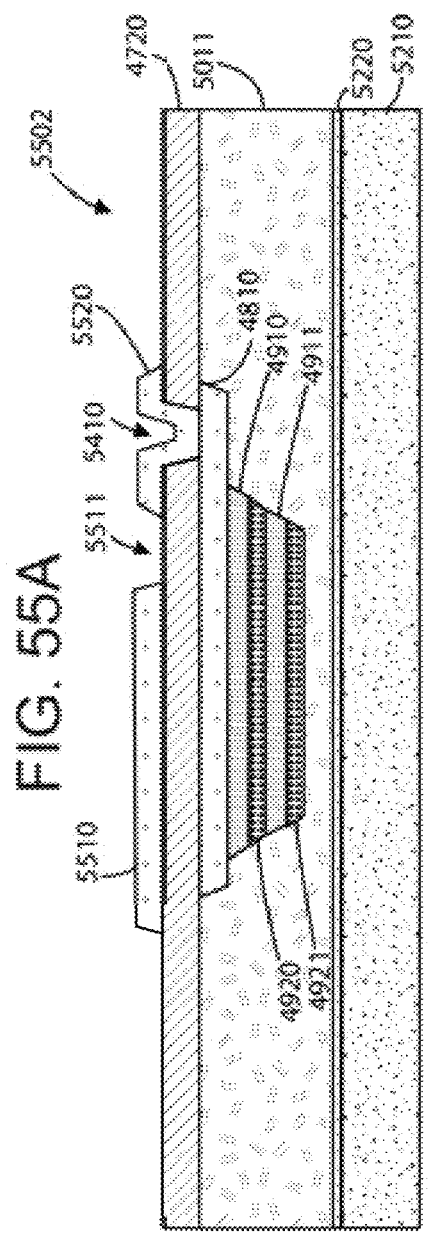

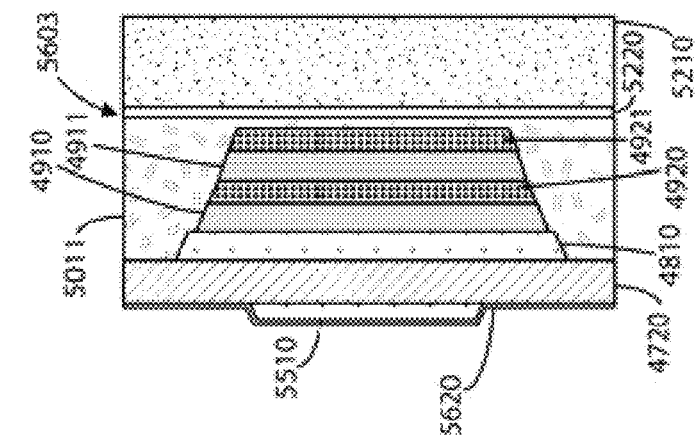
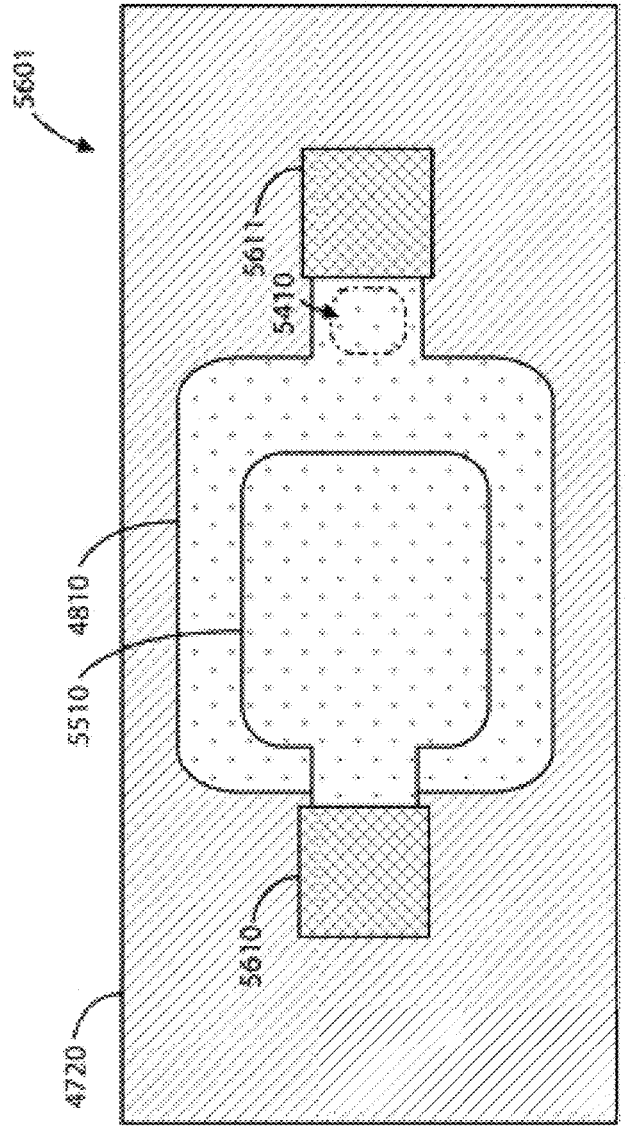
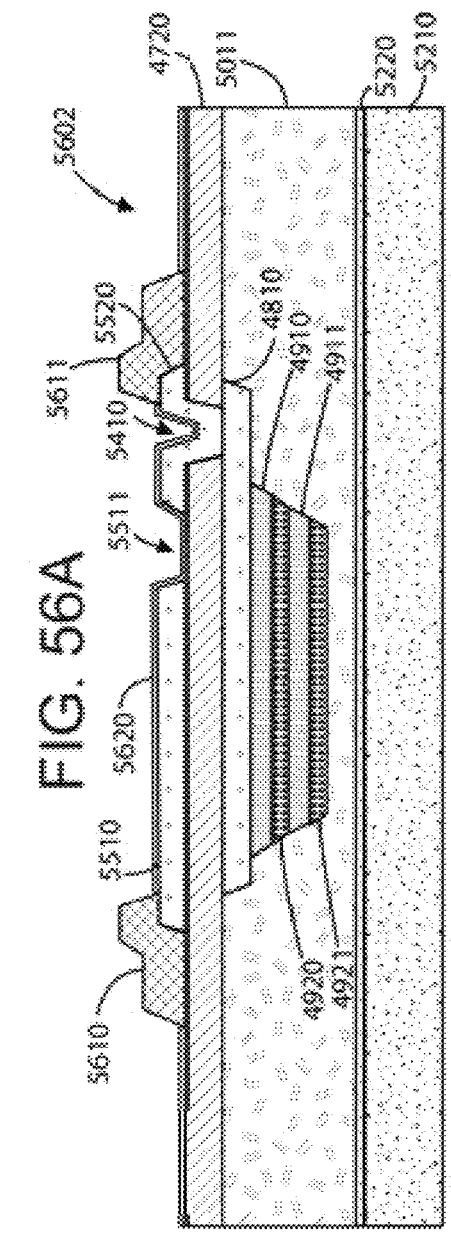

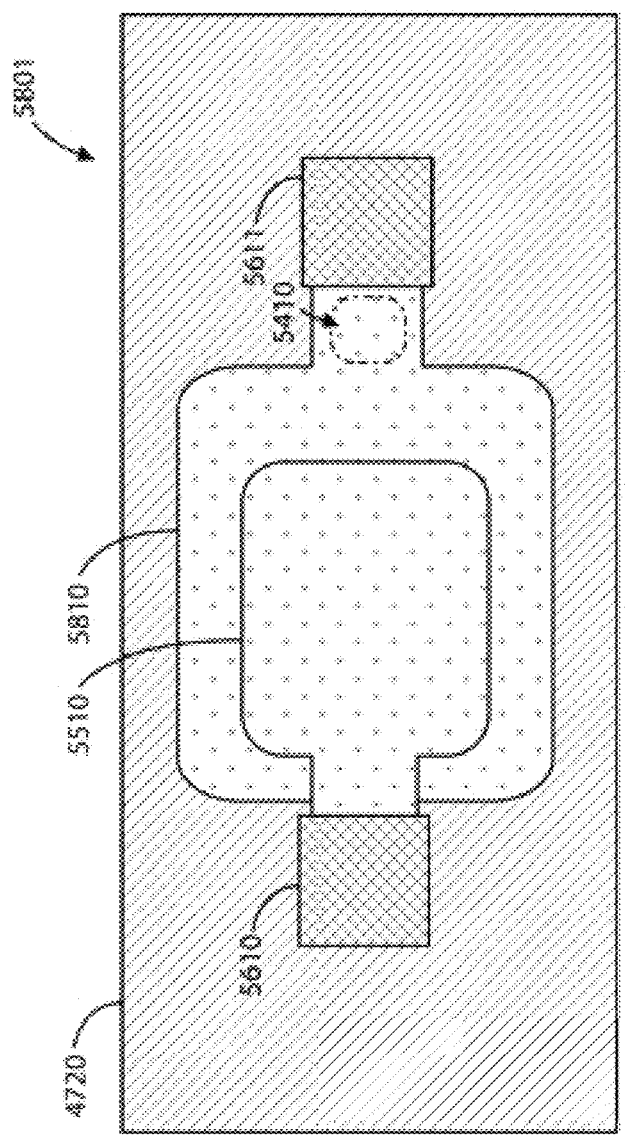
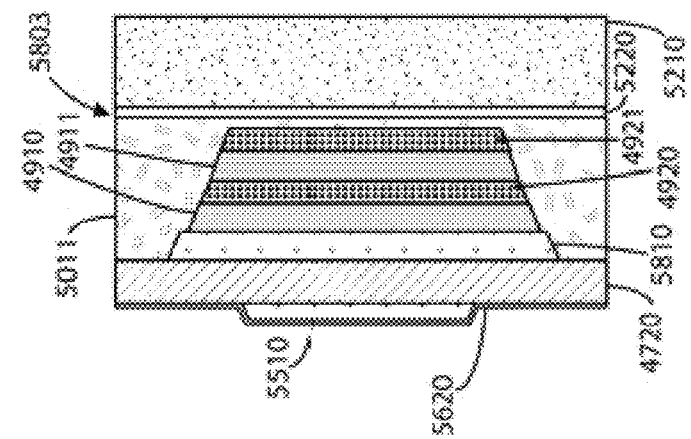
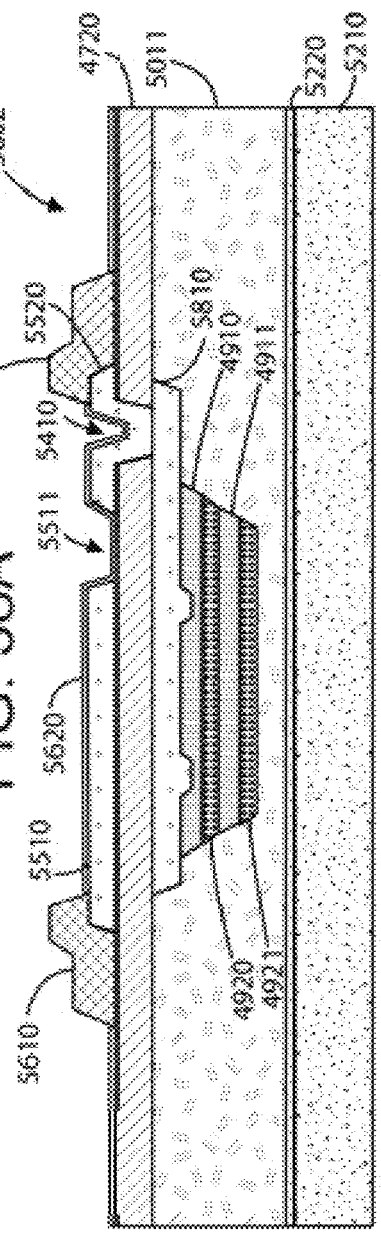
FIG. 58A
FIG. 58B
FIG. 58C

| Application | 4G LTE MOBILE | 5G MOBILE | Wi-Fi | BTS | Military |
|---|---|---|---|---|---|
| | Smartphones, Tablets, Pucks | Smartphones, Tablets, Pucks | Tri-Band Routers, Set-Top Boxes, CPE | FD-MIMO, Small Cells | Radar, Milcom |
| RF FILTER SOLUTIONS | 1.8-3GHz BAW Discrete/Multiplexer Filter | 3-6GHz BAW Discrete/Multiplexer Filter | 2.4/5.2/5.7GHz BAW Discrete Filter | 1.8-6GHz BAW Discrete/Multiplexer Filter | 1-10GHz Discrete, Multiplexer, Integrated Switch Filter |
| VALUE PROPOSITION | Improve battery life & reduce dropped calls | Size reduction, improve battery life & reduce dropped calls | Size reduction, support 5GHz multi-band simultaneous operation | Size reduction, support higher power, improve receiver sensitivity | Size reduction, support higher power |
| 2017 FILTER MARKET SIZE | $8.3 Billion | | | $2.2 Billion | |

FIG. 61

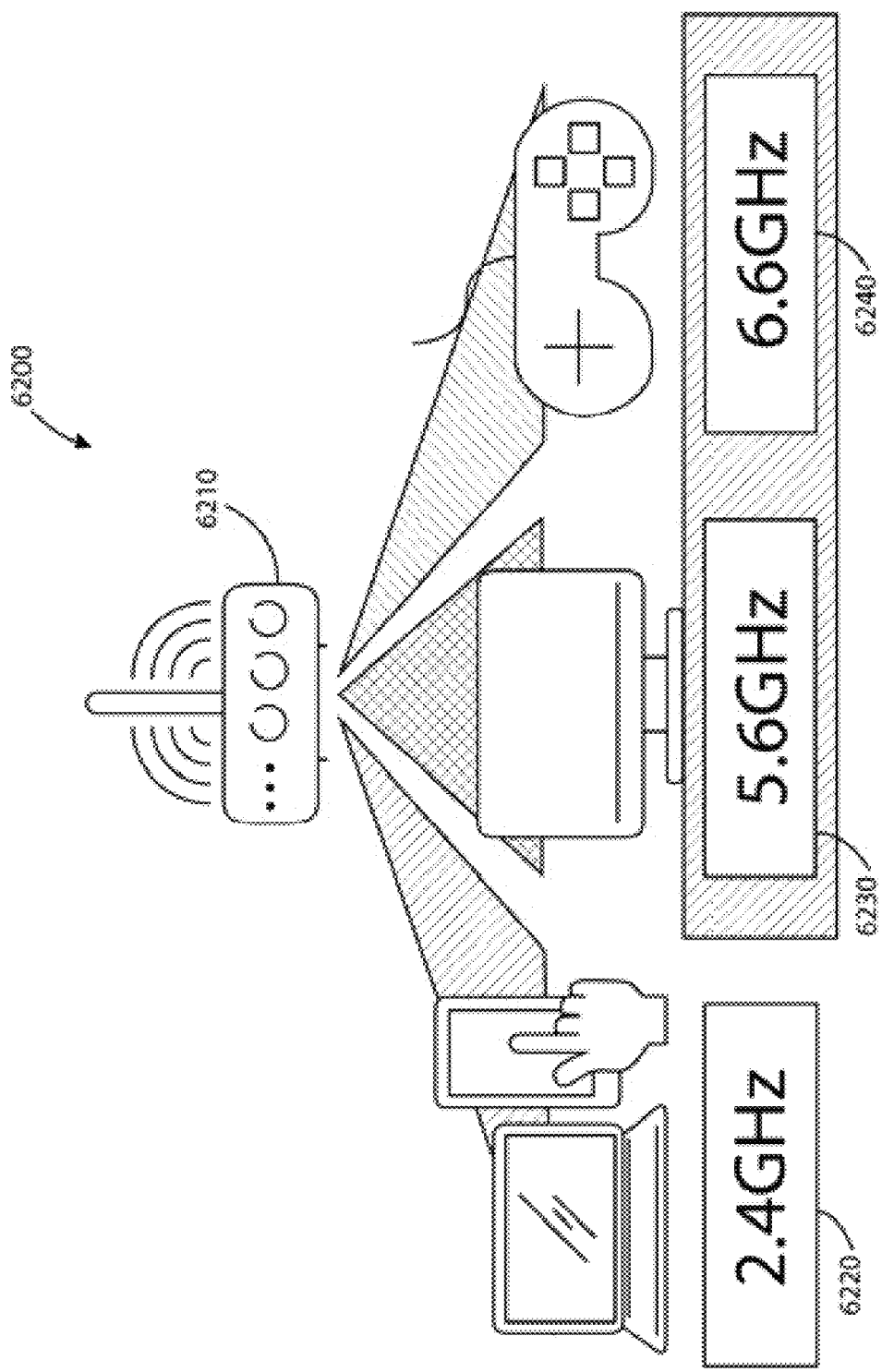

| Parameter | Units | Min. | Typ. | Max. |
|---|---|---|---|---|
| Center Frequency (Fc) | MHz | | 5532 | |
| Passband Frequency Band | MHz | | 5170 - 5895 | |
| Insertion Loss (|s21|) | | | | |
| 5170 - 5895 MHz | dB | | 2.4 | |
| Amplitude Variation (Δs21) | | | | |
| 5170 - 5895 MHz | dB | | 0.8 | |
| Attenuation (|s21|) | | | | |
| 1000 - 4000 MHz | dB | | 10 | |
| 4000 - 5000 MHz | dB | | 20 | |
| 5935 - 7125 MHz | dB | | 52 | |
| 7500 - 9000 MHz | dB | | 15 | |
| Return Loss (|s11|) | | | | |
| 5170 - 5895 MHz | dB | | 14 | |
| Operating Temperature | C | -40 | | 85 |
| Load Impedance (Zo) | Ohm | | 50 | |
| Max Power Handling (Pmax) | dBm | | 30 | |

FIG. 68A

| Parameter | Units | Min. | Typ. | Max. |
|---|---|---|---|---|
| Center Frequency (Fc) | MHz | | 6615 | |
| Passband Frequency Band | MHz | | 6105 – 7125 | |
| Insertion Loss (|s21|) | | | | |
| 5935 – 7125 MHz | dB | | 2.4 | |
| Amplitude Variation (Δs21) | | | | |
| 5935 – 7125 MHz | dB | | 0.8 | |
| Attenuation (|s21|) | | | | |
| 1000 – 4000 MHz | dB | | 10 | |
| 4000 – 5000 MHz | dB | | 20 | |
| 5170 – 5835 MHz | dB | | 52 | |
| 5900 – 7000 MHz | dB | | 15 | |
| Return Loss (|s11|) | | | | |
| 5935 – 7125 MHz | dB | | 14 | |
| Operating Temperature | C | -40 | | 85 |
| Load Impedance (Zo) | Ohm | | 50 | |
| Max Power Handling (Pmax) | dBm | | 30 | |

FIG. 68B

FRONT END MODULES FOR 5.6 GHZ AND 6.6 GHZ WI-FI ACOUSTIC WAVE RESONATOR RF FILTER CIRCUITS

CROSS-REFERENCES TO RELATED APPLICATIONS

The present application is a continuation-in-part application of U.S. patent application Ser. No. 17/198,927, titled "FRONT END MODULE FOR 6.1 GHz Wi-Fi ACOUSTIC WAVE RESONATOR RF FILTER CIRCUIT", filed Mar. 11, 2021, which is a continuation-in-part of U.S. patent application Ser. No. 15/931,413 filed May 13, 2020, now U.S. Pat. No. 11,031,989, which is a continuation of U.S. patent application Ser. No. 16/135,276 filed Sep. 19, 2018, now U.S. Pat. No. 10,673,513, which is a continuation-in-part of U.S. patent application Ser. No. 16/019,267 filed Jun. 26, 2018, now U.S. Pat. No. 10,979,022, which is a continuation-in-part of U.S. patent application Ser. No. 15/784,919 filed Oct. 16, 2017, now U.S. Pat. No. 10,355,659, which is a continuation-in-part of U.S. patent application Ser. No. 15/068,510 filed Mar. 11, 2016, now U.S. Pat. No. 10,217,930, which are hereby incorporated by reference in its entireties.

BACKGROUND OF THE INVENTION

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

With 4G LTE and growing more popular by the day, wireless data communication demands high performance RF filters with frequencies around 5 GHz and higher. Bulk acoustic wave resonators (BAWR) using crystalline piezoelectric thin films are leading candidates for meeting such demands. Current BAWRs using polycrystalline piezoelectric thin films are adequate for bulk acoustic wave (BAW) filters operating at frequencies ranging from 1 to 3 GHz; however, the quality of the polycrystalline piezoelectric films degrades quickly as the thicknesses decrease below around 0.5 um, which is required for resonators and filters operating at frequencies around 5 GHz and above. Single crystalline or epitaxial piezoelectric thin films grown on compatible crystalline substrates exhibit good crystalline quality and high piezoelectric performance even down to very thin thicknesses, e.g., 0.4 um. Even so, there are challenges to using and transferring single crystal piezoelectric thin films in the manufacture of BAWR and BAW filters.

From the above, it is seen that techniques for improving methods of manufacture and structures for acoustic resonator devices are highly desirable.

BRIEF SUMMARY OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

In an example, the present invention provides a front end module (FEM) for a 5.6 GHz or a 6.6 GHz Wi-Fi acoustic wave resonator RF filter circuit. The device can include a power amplifier (PA), a 5.6/6.6 GHz resonator, a diversity switch, and a low noise amplifier (LNA). The PA is electrically coupled to an input node and can be configured to a DC power detector or an RF power detector. The resonator can be configured between the PA and the diversity switch, or between the diversity switch and an antenna. The LNA may be configured to the diversity switch or be electrically isolated from the switch. Another 5.6/6.6 GHZ resonator may be configured between the diversity switch and the LNA. In a specific example, this device integrates a 5.6/6.6 GHz PA, a 5.6/6.6 GHz bulk acoustic wave (BAW) RF filter, a single pole two throw (SP2T) switch, and a bypassable low noise amplifier (LNA) into a single device.

One or more benefits are achieved over pre-existing techniques using the invention. In particular, the present device can be manufactured in a relatively simple and cost effective manner while using conventional materials and/or methods according to one of ordinary skill in the art. In an example, the present FEM design provides a compact form factor and integrated matching minimizes layout area in applications. The PA can be optimized for a 5V supply voltage that conserves power consumption while maintaining a high linear output power and throughput. Also, an integrated BAW filter reduces the overall size for Wi-Fi radio applications and allows coexistence between the 5.6 GHz (or 6.6 GHz) radio band and adjacent 2.4 GHz and 6.5 GHz (or 5.6 GHz) bands in a tri-band router configuration. The present device can be configured with an ultra-small form factor RF resonator filter with high rejection, high power rating, and low insertion loss. Such filters or resonators can be implemented in an RF filter device, an RF filter system, or the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 16A-16C through FIGS. 31A-31C are simplified diagrams illustrating various cross-sectional views of a single crystal acoustic resonator device and of method steps for a transfer process using a sacrificial layer for single crystal acoustic resonator devices according to an example of the present invention.

FIGS. 32A-32C through FIGS. 46A-46C are simplified diagrams illustrating various cross-sectional views of a single crystal acoustic resonator device and of method steps for a cavity bond transfer process for single crystal acoustic resonator devices according to an example of the present invention.

FIG. 61 is a simplified diagram illustrating an overview of key markets that are applications for acoustic wave RF filters according to an example of the present invention.

FIG. 62 is a simplified diagram illustrating application areas for 5.6 and 6.6 GHz RF filters in Tri-Band Wi-Fi radios according to examples of the present invention.

FIG. 68A is a simplified table of 5.6 GHz filter parameters according to an example of the present invention.

FIG. 68B is a simplified table of 6.6 GHz filter parameters according to an example of the present invention.

DETAILED DESCRIPTION OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Figure 1A:
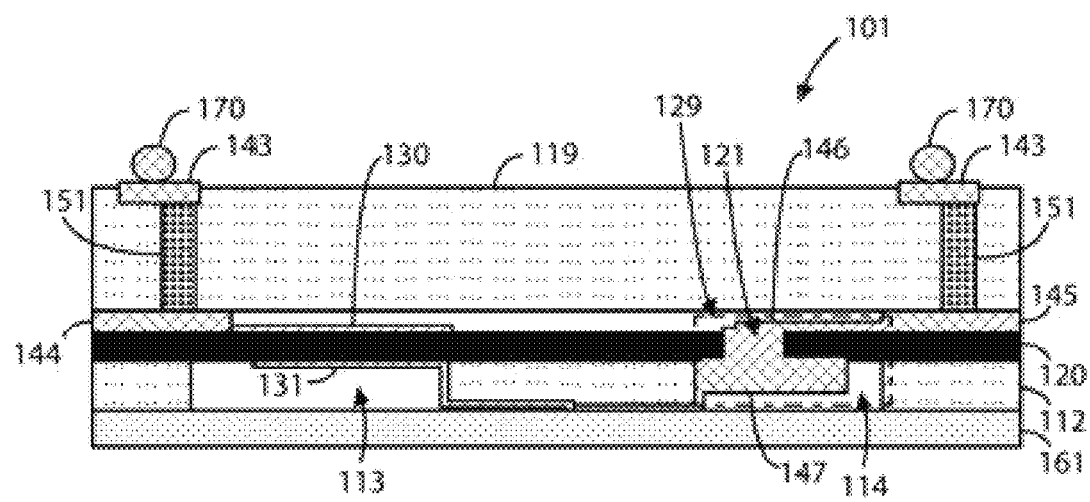
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
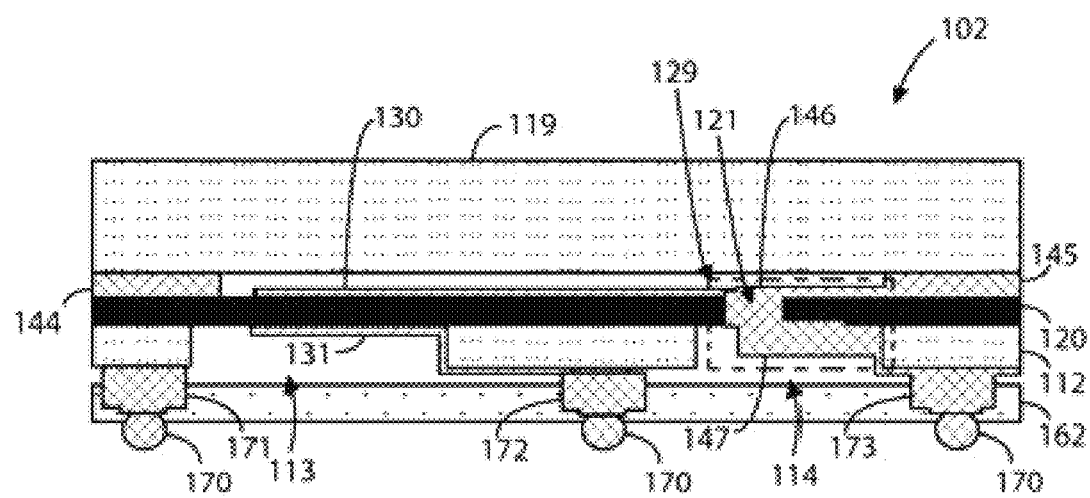
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
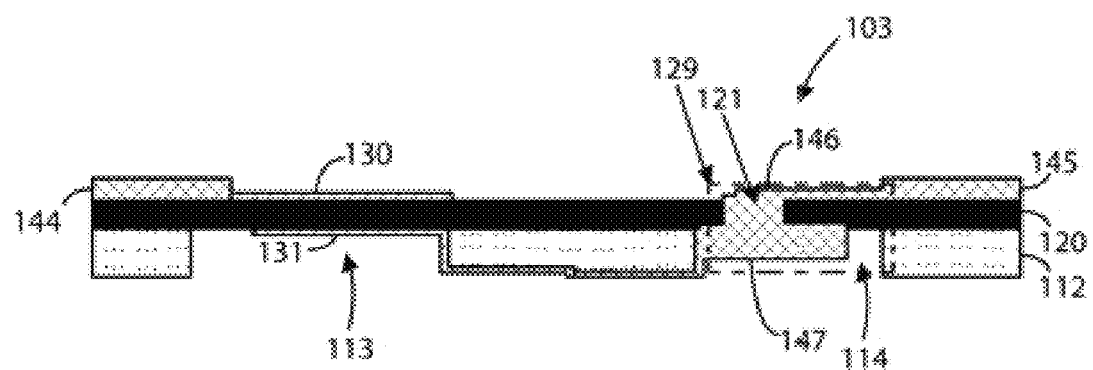
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
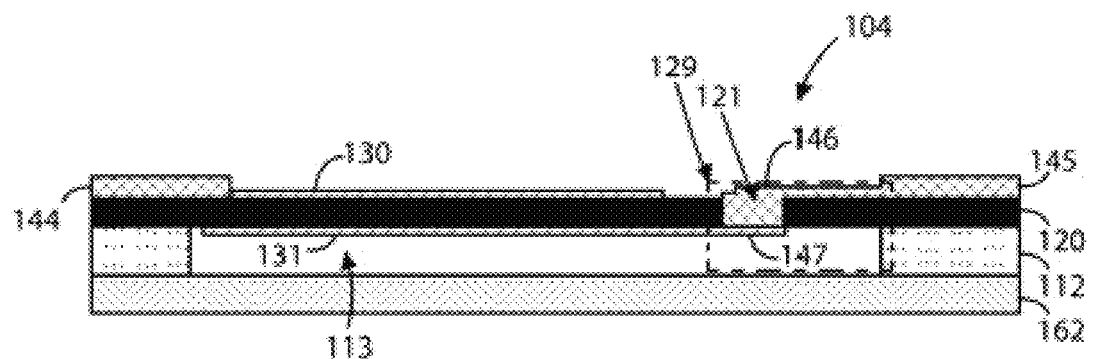
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
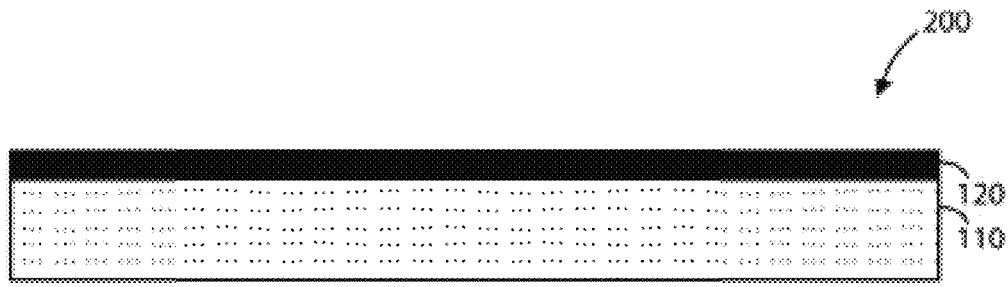
FIGS. 2 and 3 are simplified diagrams illustrating steps for a method of manufacture for an acoustic resonator device according to an example of the present invention.
Figure 3:
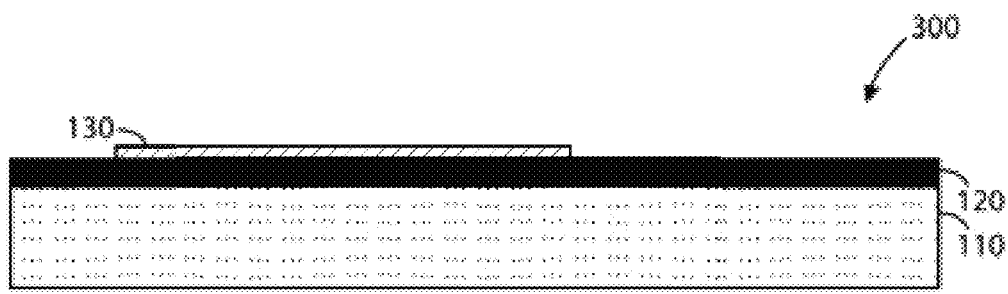

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
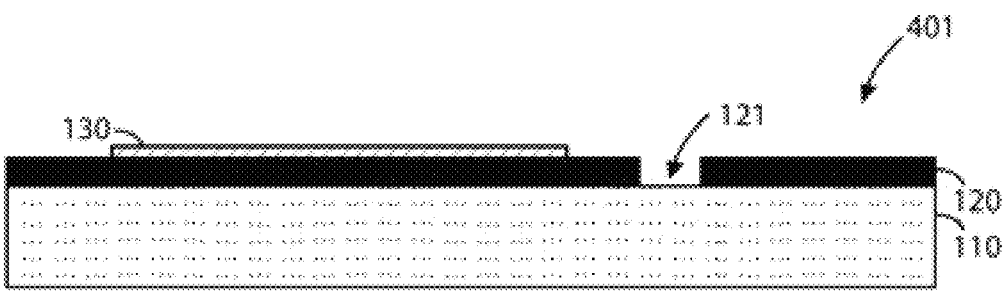
FIG. 4A is a simplified diagram illustrating a step for a method creating a topside micro-trench according to an example of the present invention.
Figure 4B:
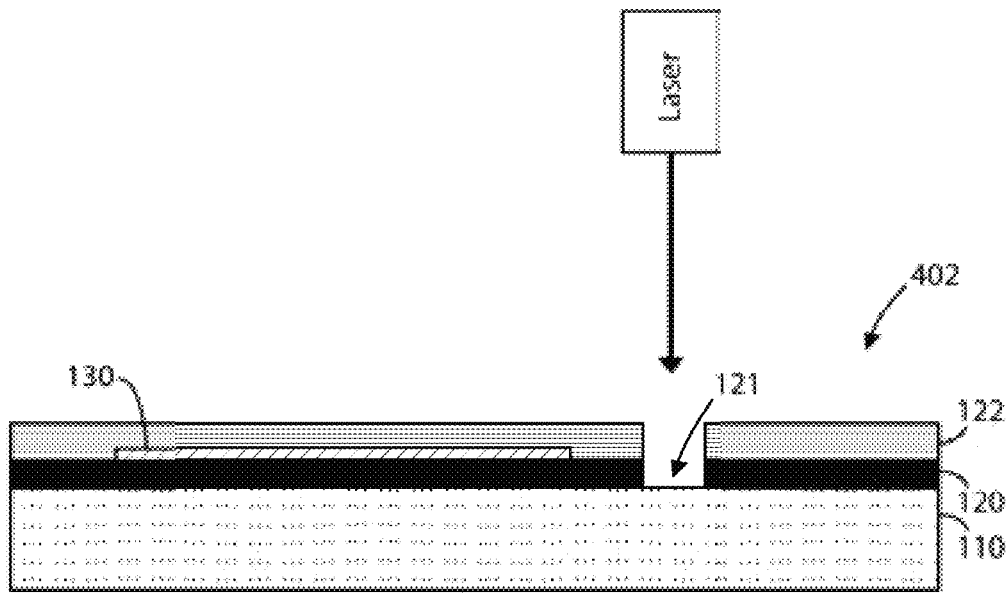
FIGS. 4B and 4C are simplified diagrams illustrating alternative methods for conducting the method step of forming a topside micro-trench as described in FIG. 4A.
Figure 4C:
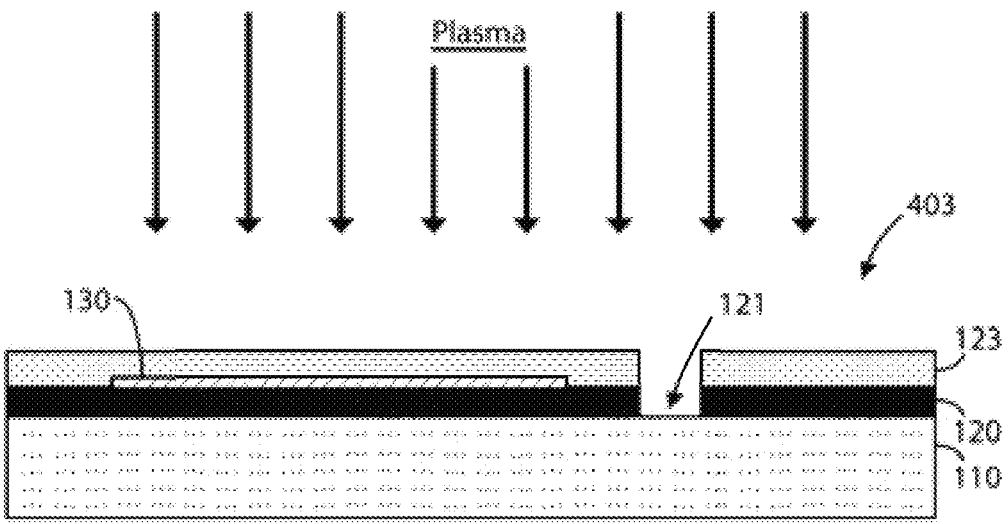

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11 W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
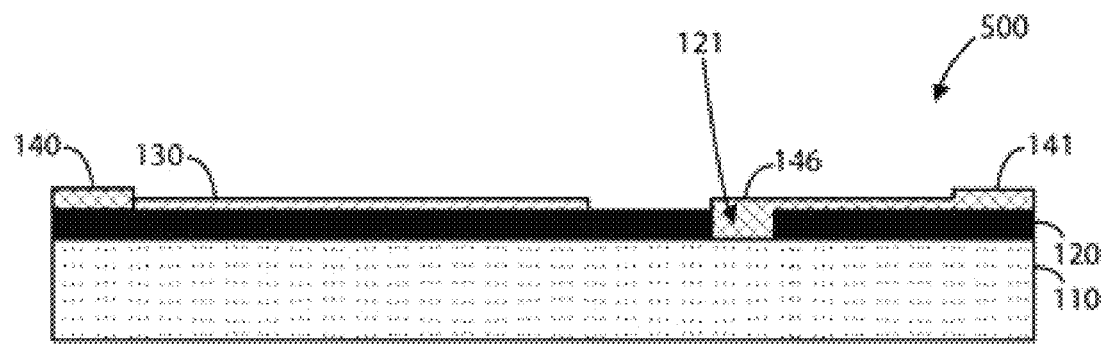
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
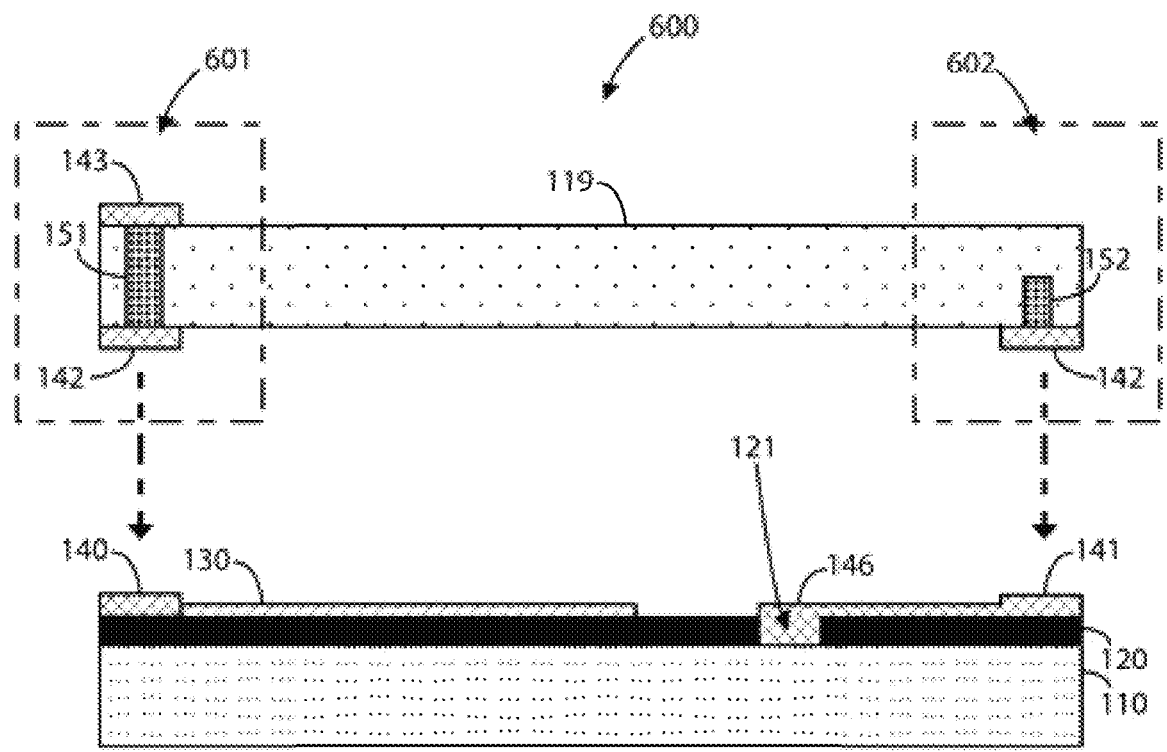

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
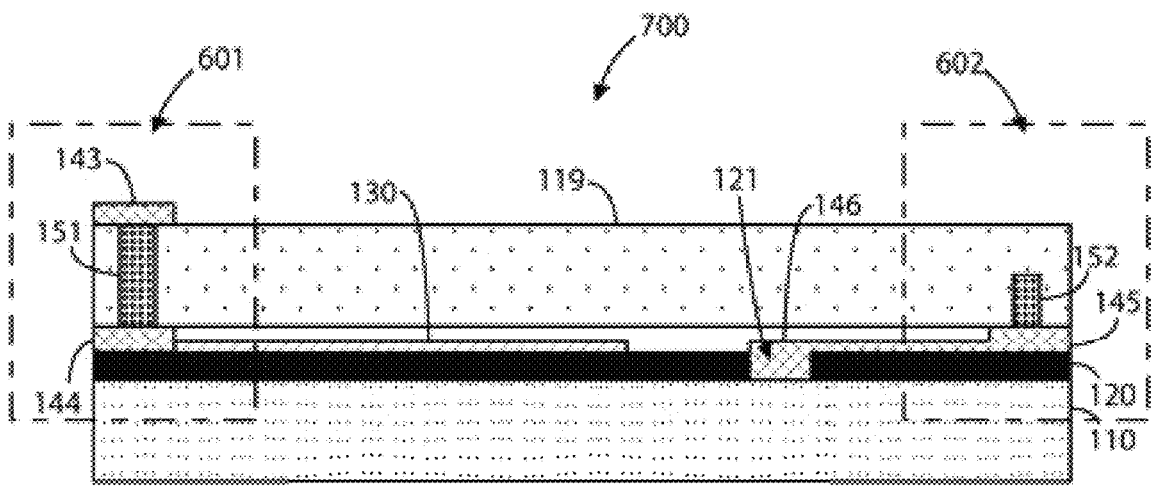
Figure 8:
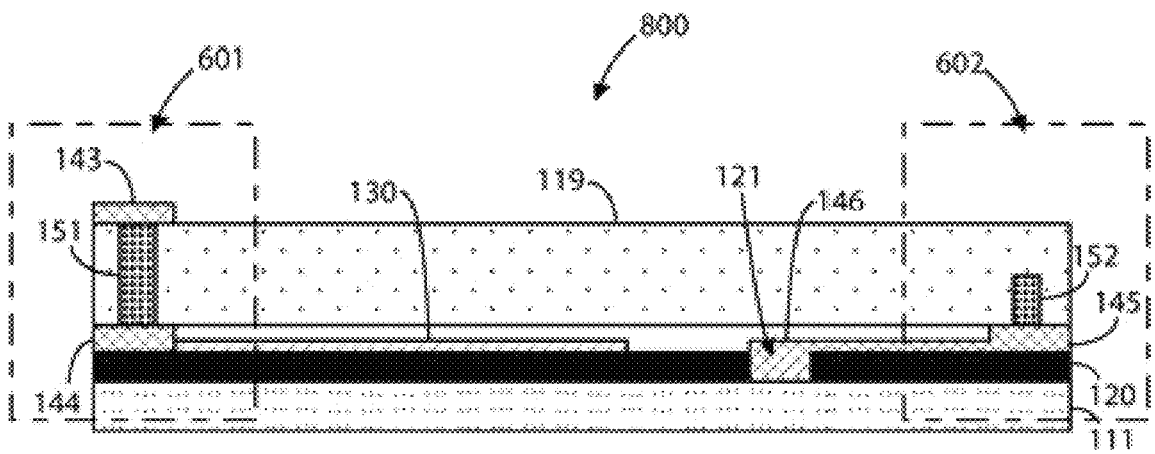

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
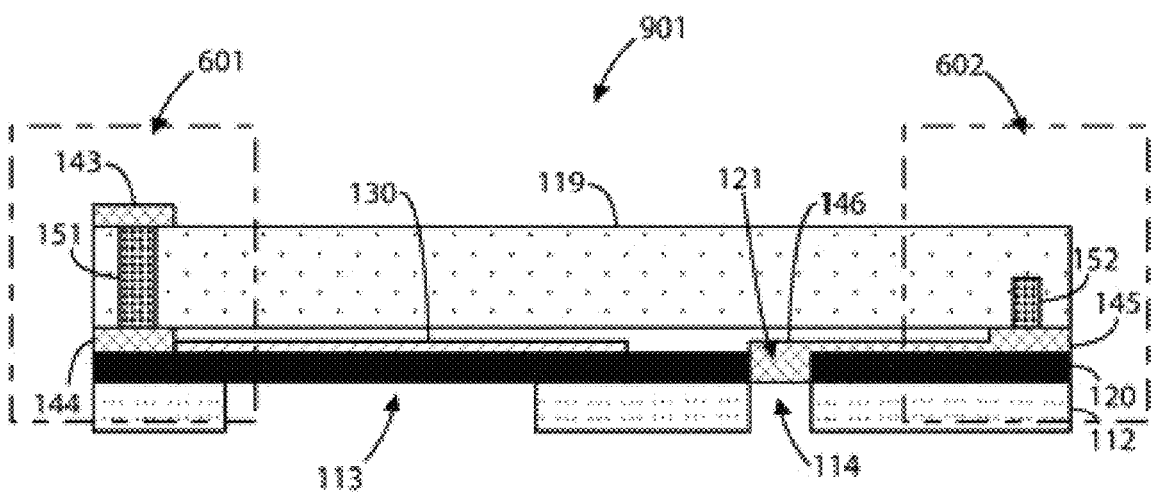
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

Figure 9B:
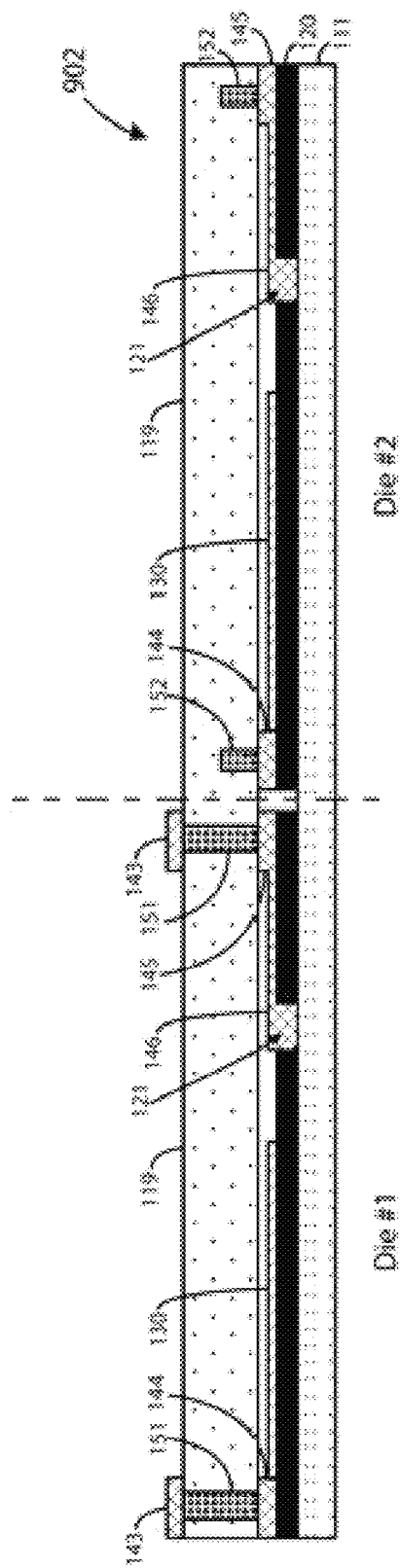
FIGS. 9B and 9C are simplified diagrams illustrating an alternative method for conducting the method step of forming backside trenches, as described in FIG. 9A, and simultaneously singulating a seed substrate according to an embodiment of the present invention.
Figure 9C:
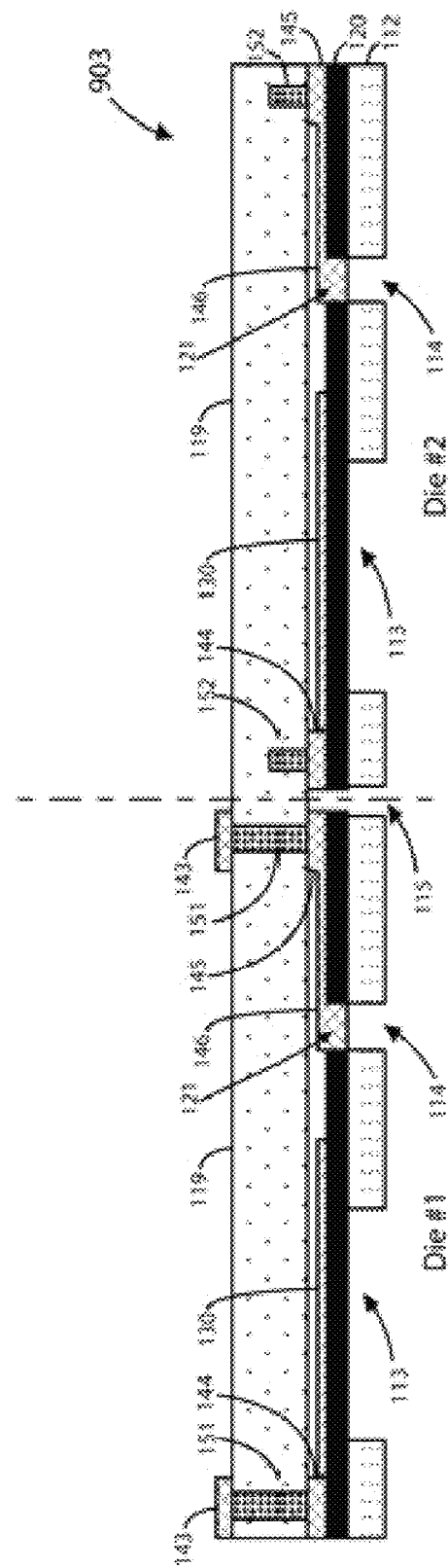

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
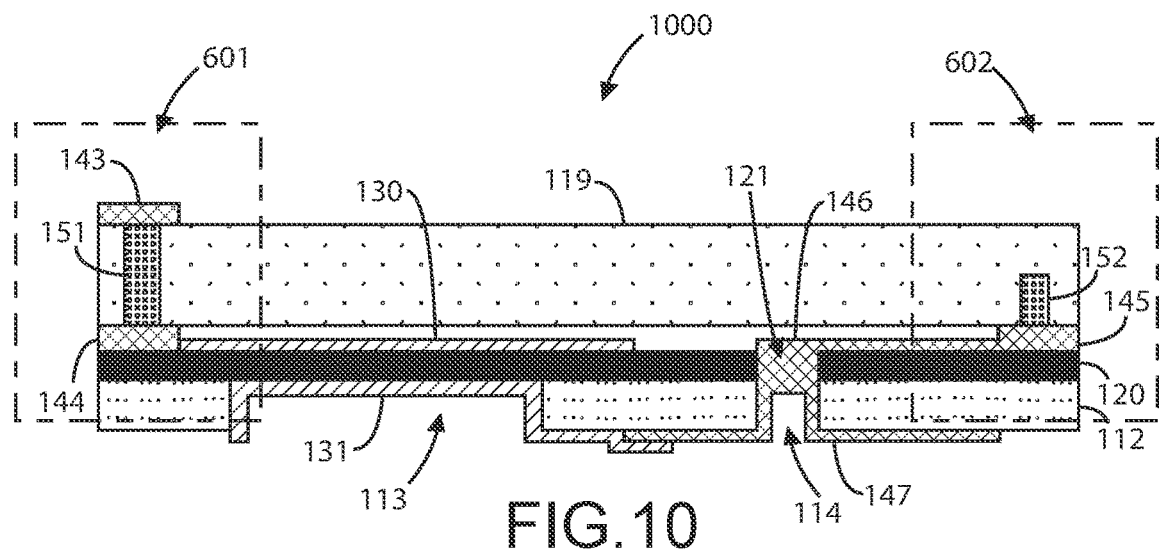
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
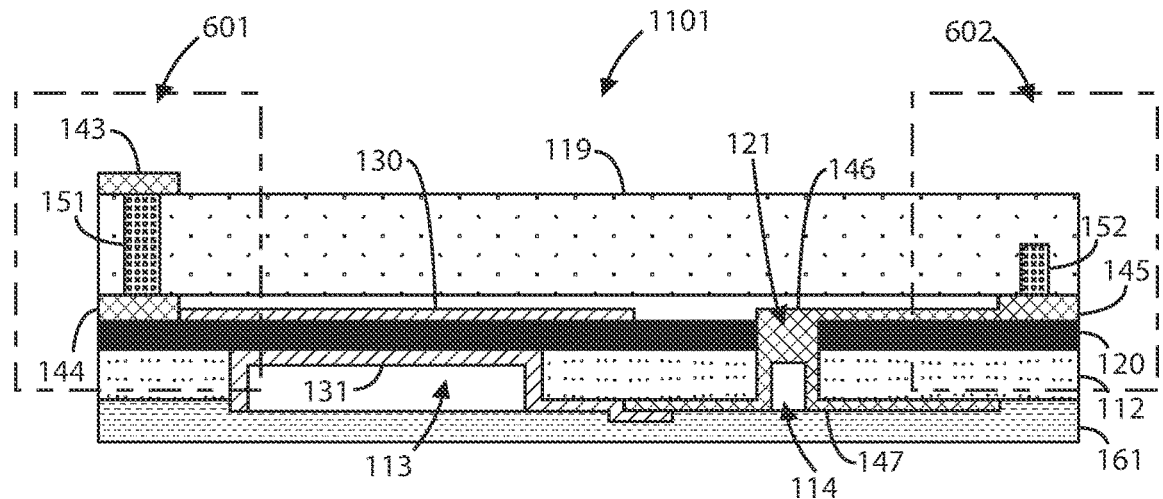
FIGS. 11A and 11B are simplified diagrams illustrating alternative steps for a method of manufacture for an acoustic resonator device according to an example of the present invention.
Figure 11B:
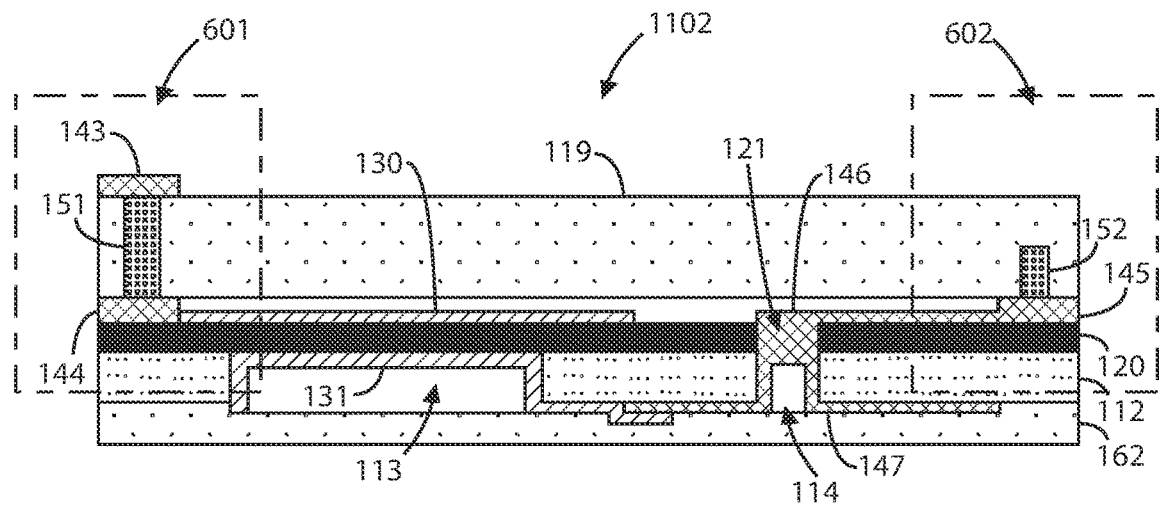

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
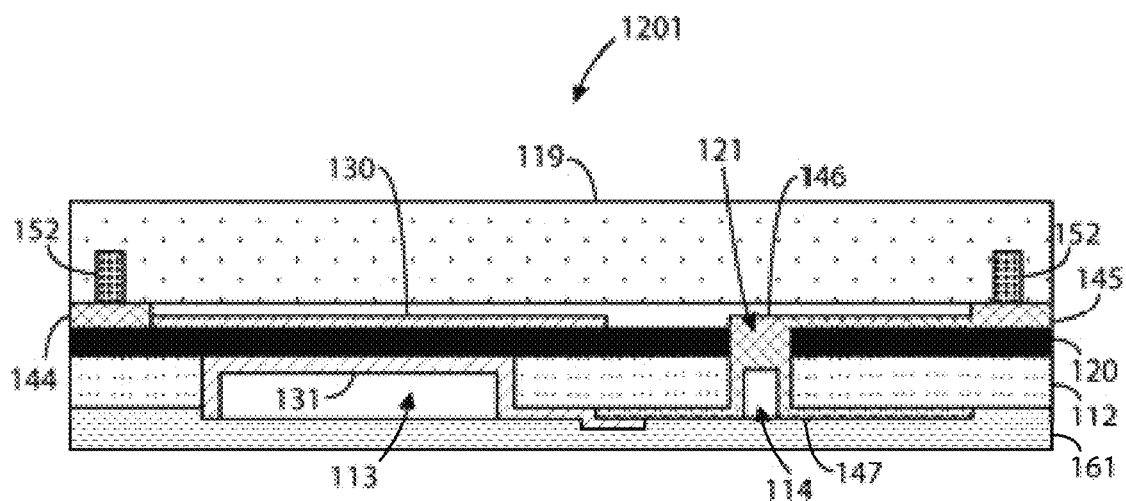
FIGS. 12A to 12E are simplified diagrams illustrating steps for a method of manufacture for an acoustic resonator device using a blind via interposer according to an example of the present invention.
Figure 12B:
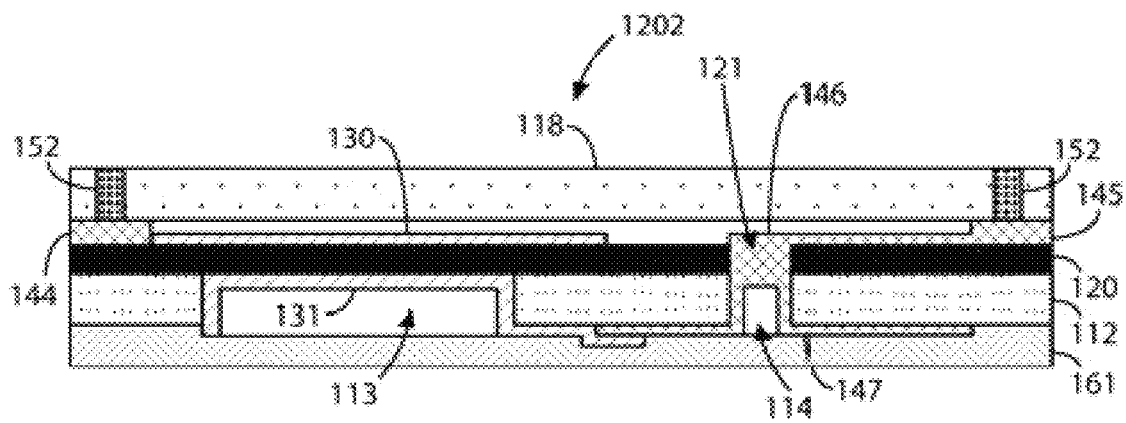
Figure 12C:
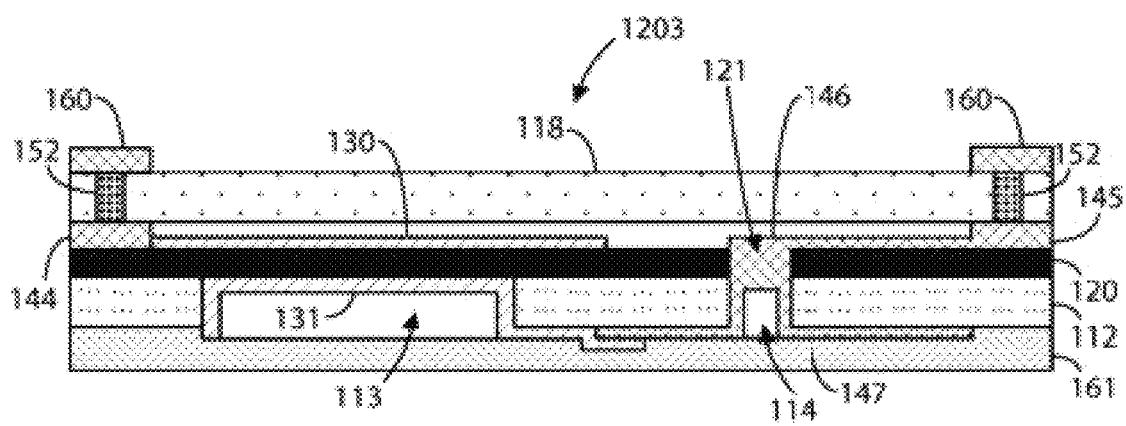
Figure 12D:
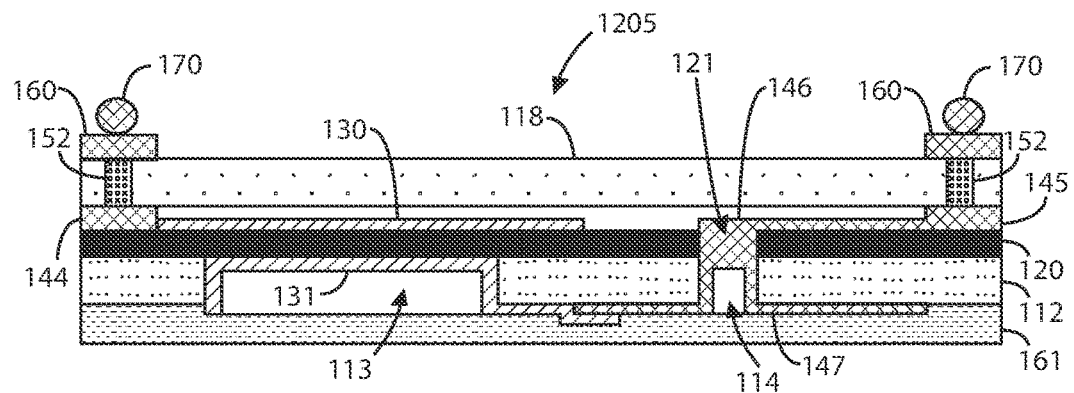
Figure 12E:
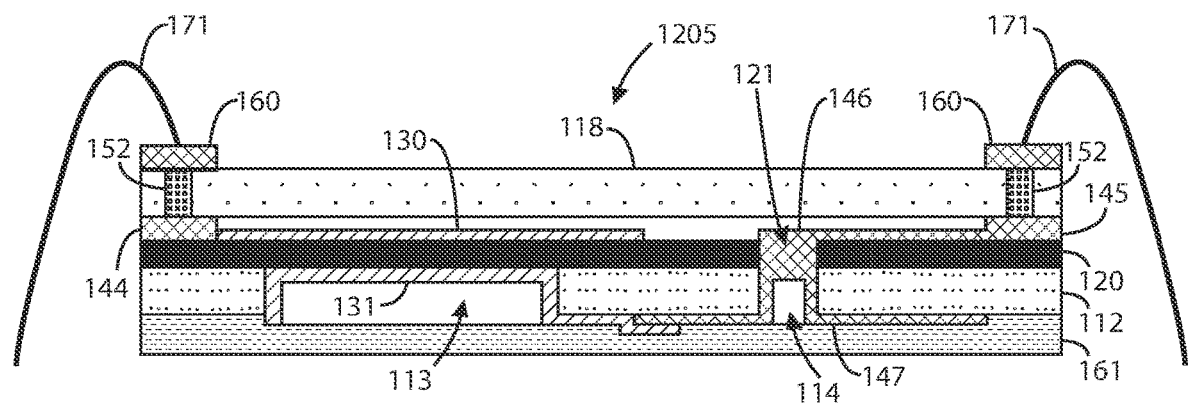

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
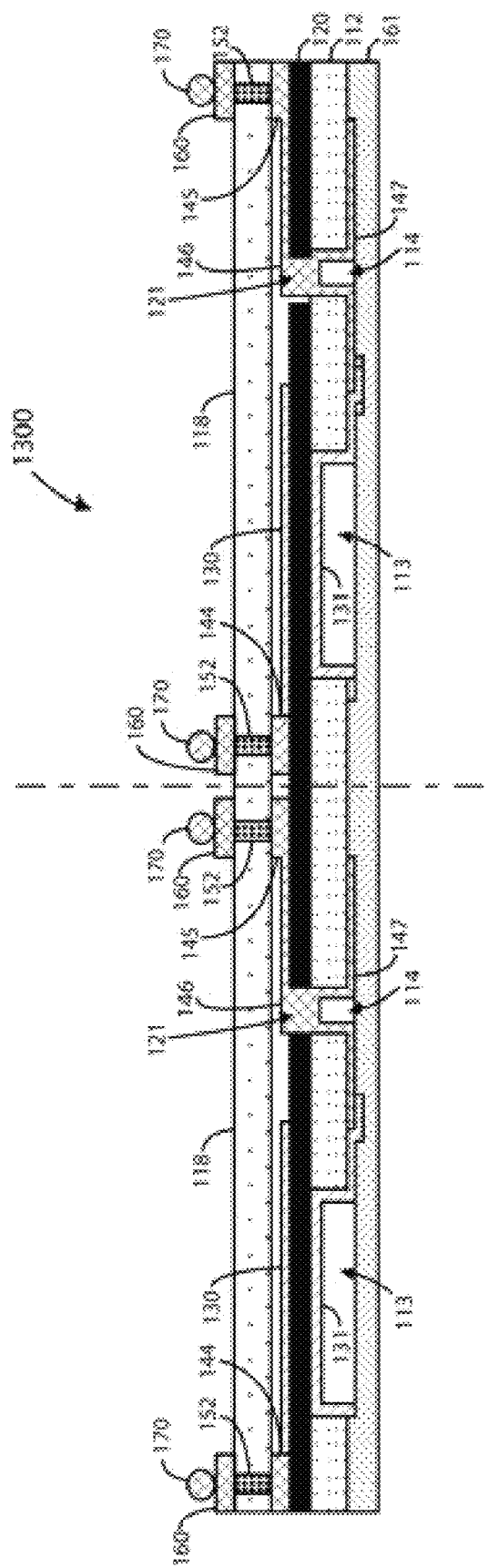
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
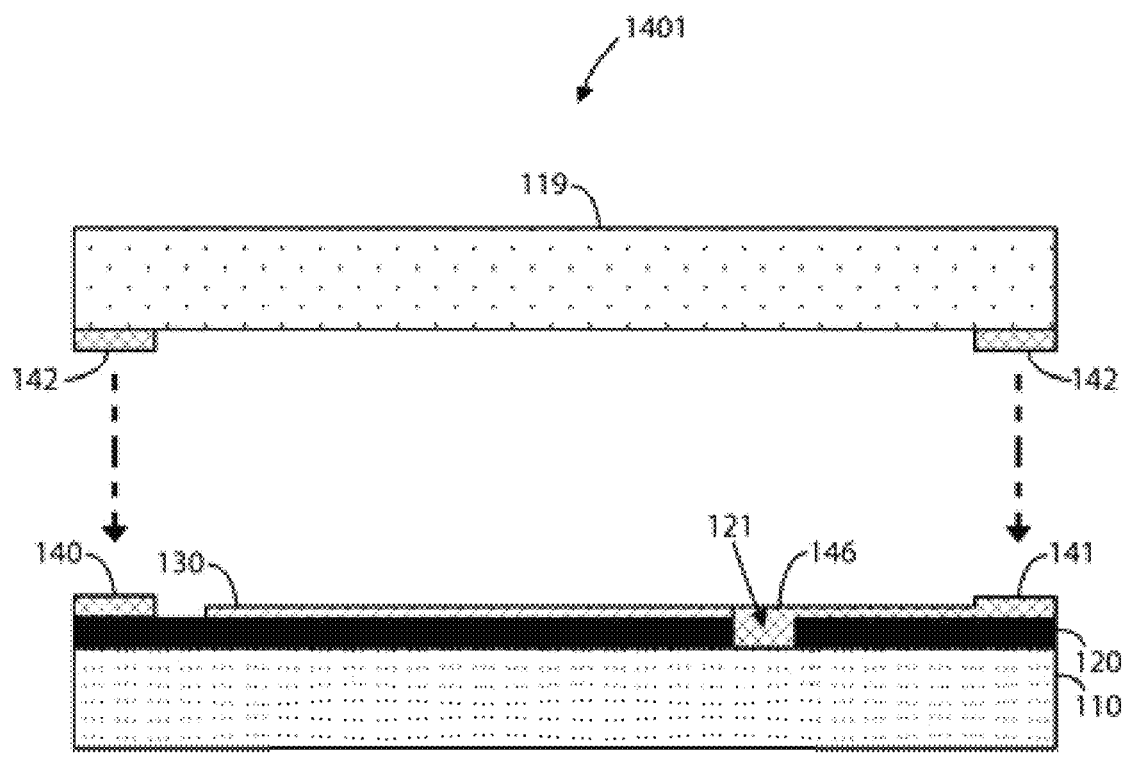
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
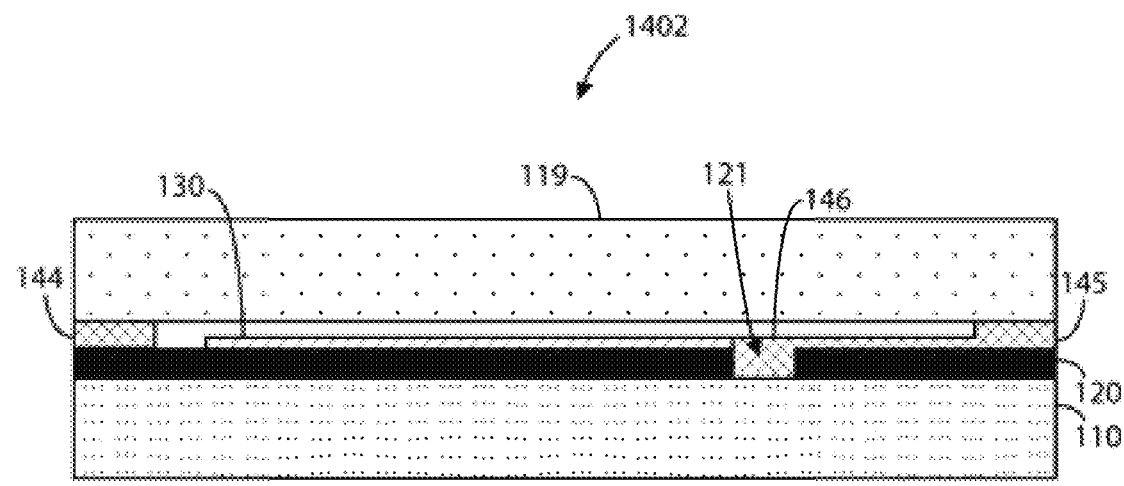
Figure 14C:
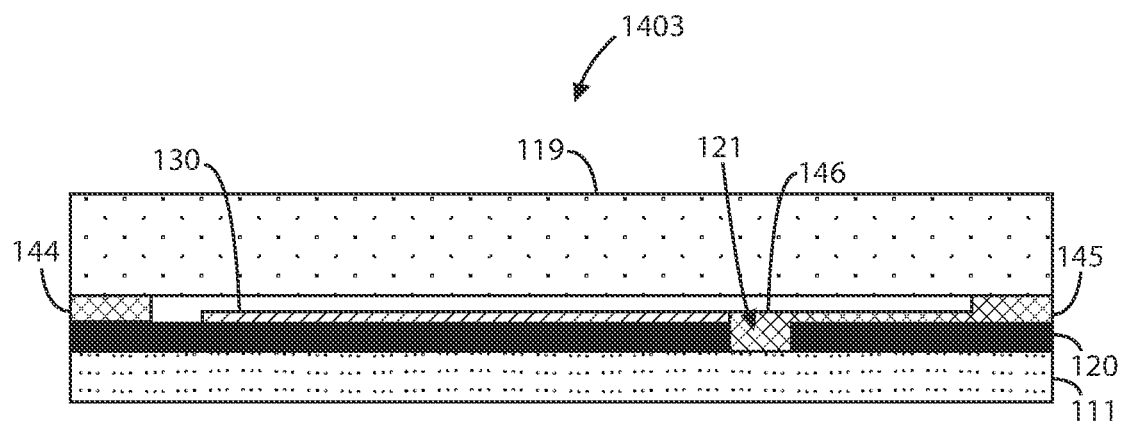
Figure 14D:
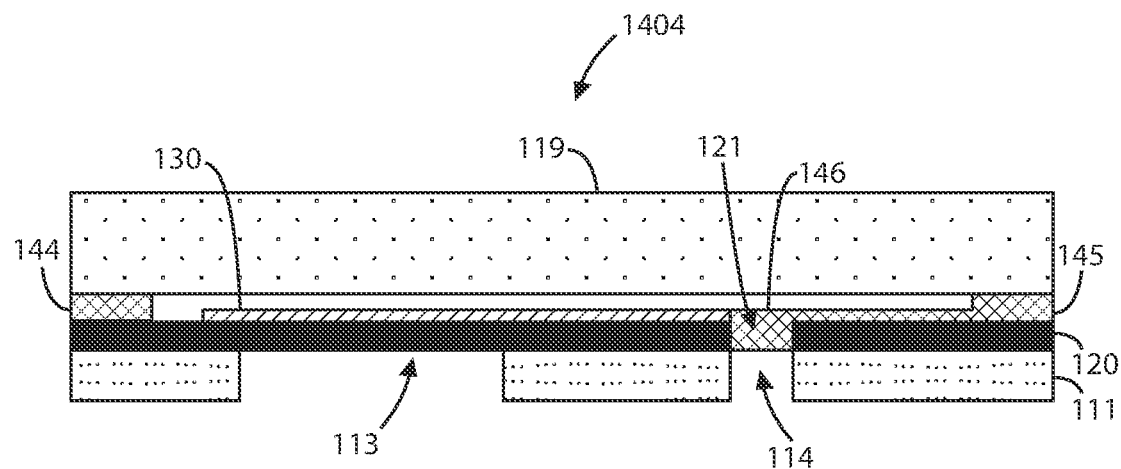
Figure 14E:
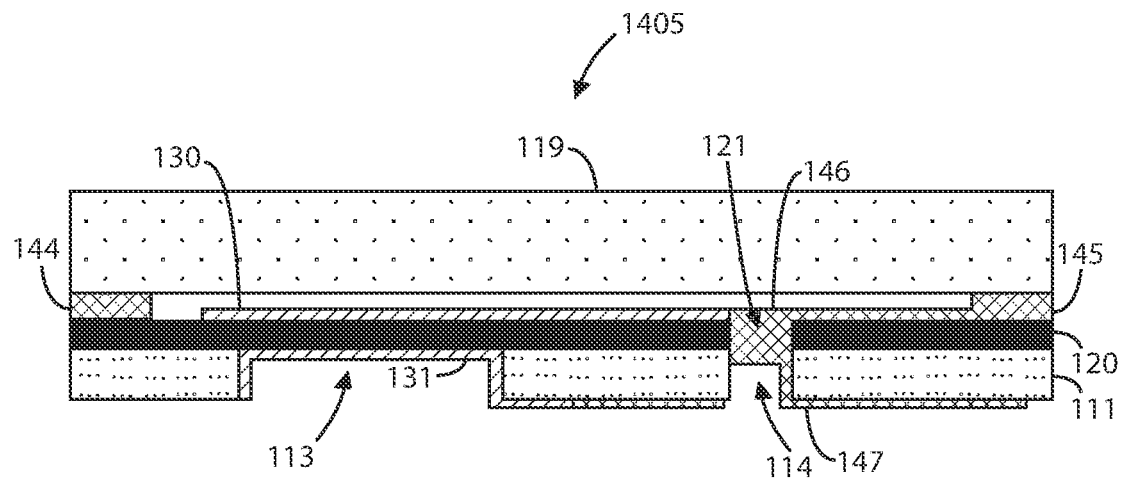
Figure 14F:
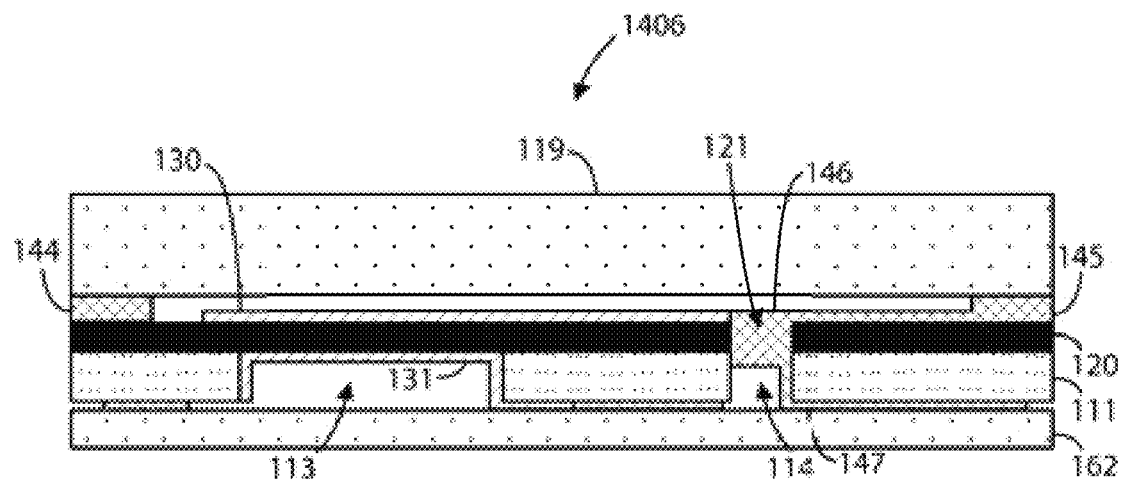

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
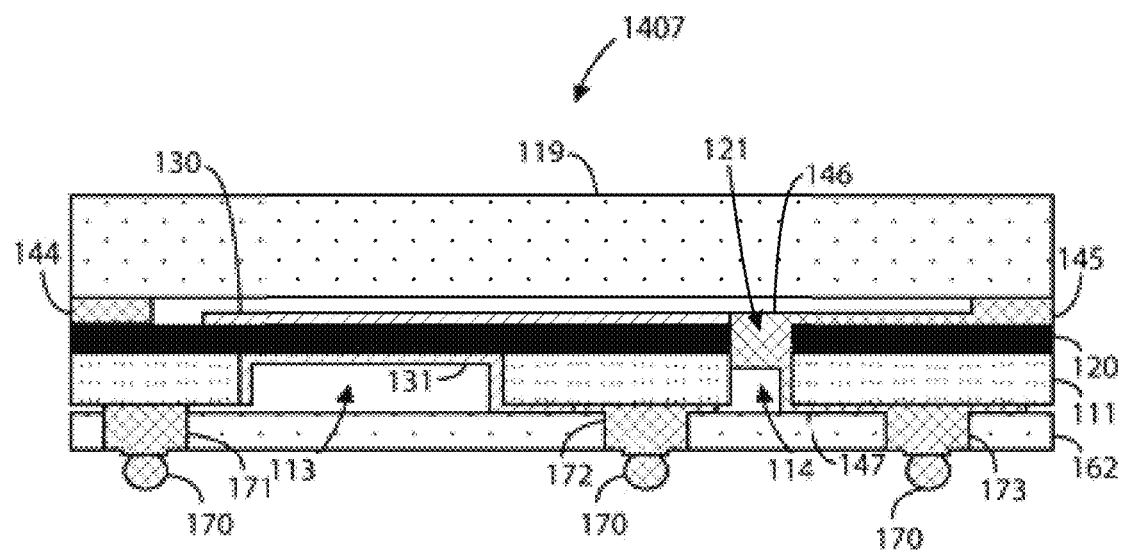

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
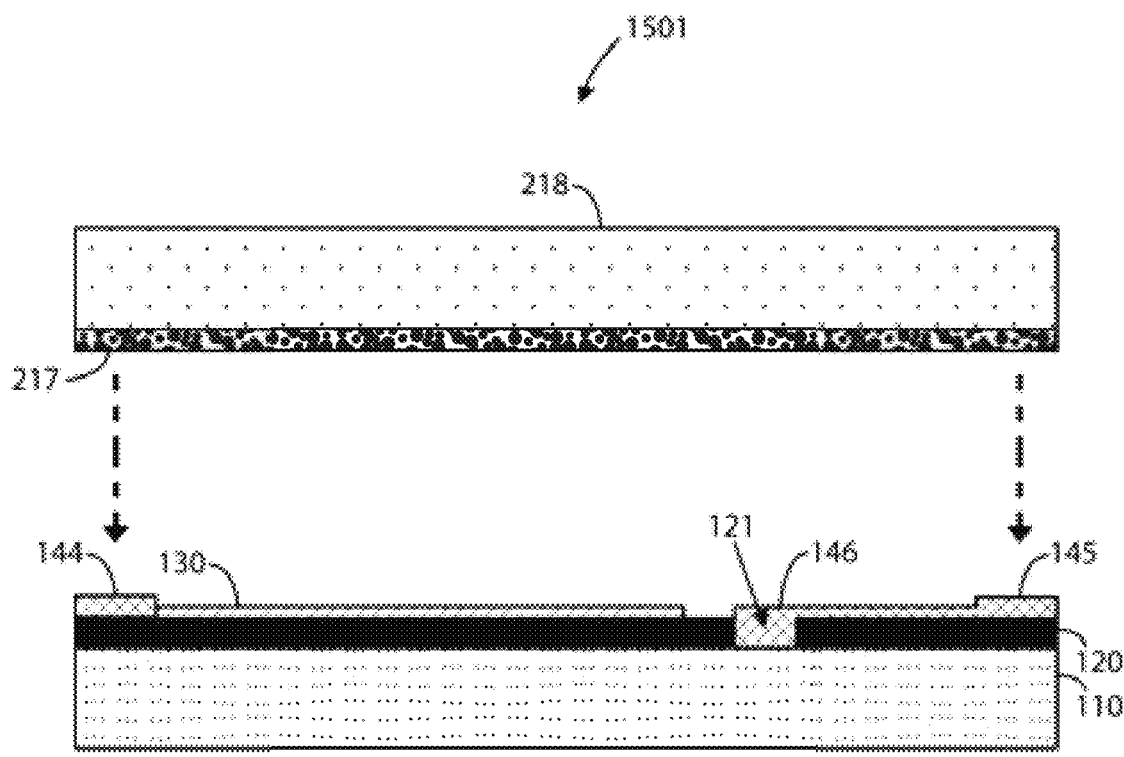
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
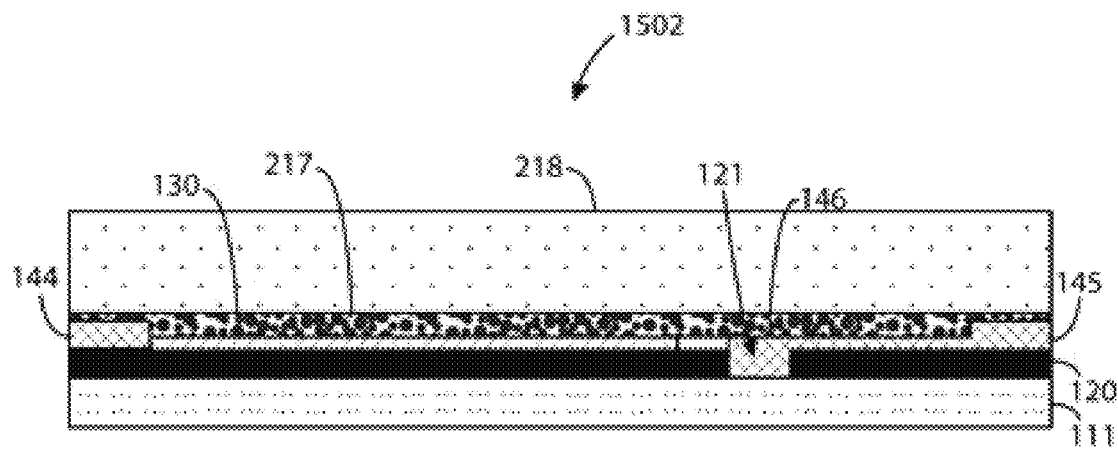

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
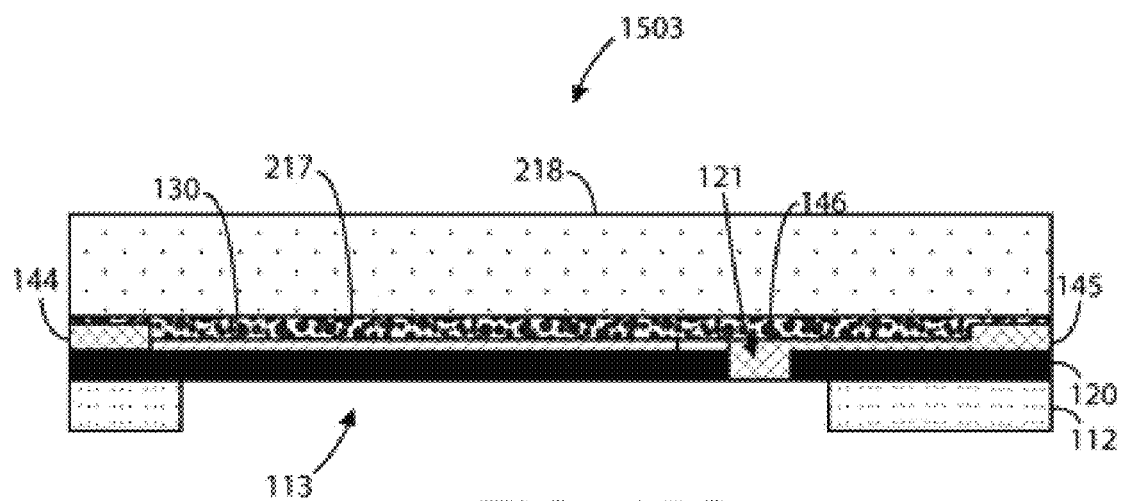

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
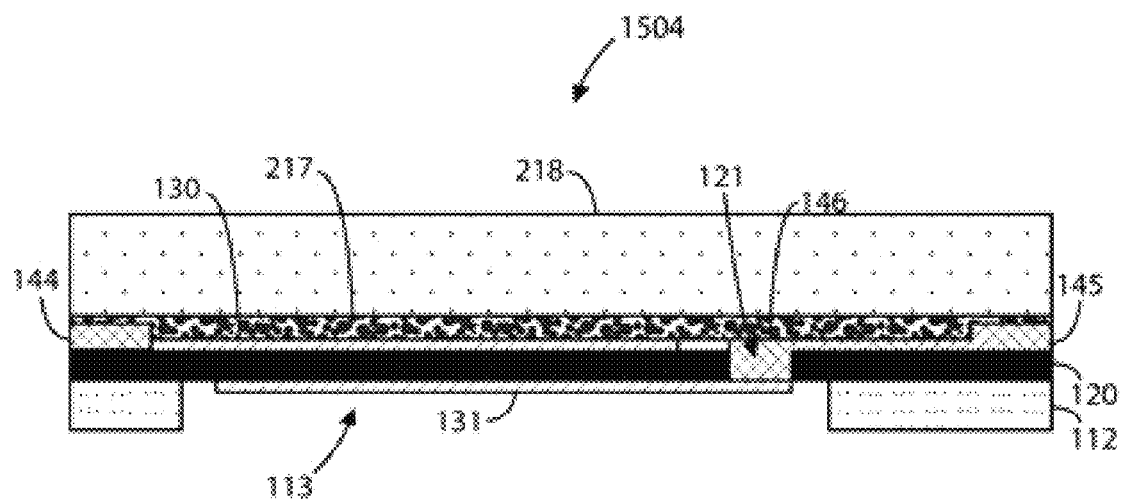

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
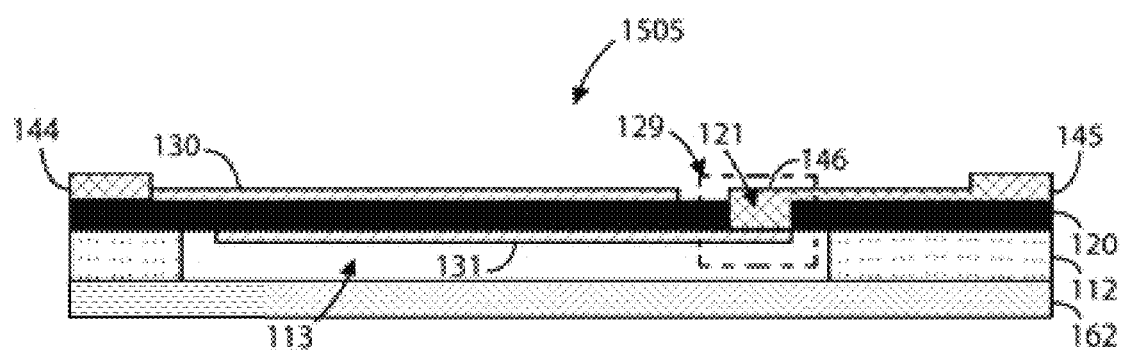

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

With 4G LTE and 5G growing more popular by the day, wireless data communication demands high performance RF filters with frequencies around 5 GHz and higher. Bulk acoustic wave resonators (BAWR), widely used in such filters operating at frequencies around 3 GHz and lower, are leading candidates for meeting such demands. Current bulk acoustic wave resonators use polycrystalline piezoelectric AlN thin films where each grain's c-axis is aligned perpendicular to the film's surface to allow high piezoelectric performance whereas the grains' a- or b-axis are randomly distributed. This peculiar grain distribution works well when the piezoelectric film's thickness is around 1 um and above, which is the perfect thickness for bulk acoustic wave (BAW) filters operating at frequencies ranging from 1 to 3 GHz. However, the quality of the polycrystalline piezoelectric films degrades quickly as the thicknesses decrease below around 0.5 um, which is required for resonators and filters operating at frequencies around 5 GHz and above.

Single crystalline or epitaxial piezoelectric thin films grown on compatible crystalline substrates exhibit good crystalline quality and high piezoelectric performance even down to very thin thicknesses, e.g., 0.4 um. The present invention provides manufacturing processes and structures for high quality bulk acoustic wave resonators with single crystalline or epitaxial piezoelectric thin films for high frequency BAW filter applications.

BAWRs require a piezoelectric material, e.g., AlN, in crystalline form, i.e., polycrystalline or single crystalline. The quality of the film heavy depends on the chemical, crystalline, or topographical quality of the layer on which the film is grown. In conventional BAWR processes (including film bulk acoustic resonator (FBAR) or solidly mounted resonator (SMR) geometry), the piezoelectric film is grown on a patterned bottom electrode, which is usually made of molybdenum (Mo), tungsten (W), or ruthenium (Ru). The surface geometry of the patterned bottom electrode significantly influences the crystalline orientation and crystalline quality of the piezoelectric film, requiring complicated modification of the structure.

Thus, the present invention uses single crystalline piezoelectric films and thin film transfer processes to produce a BAWR with enhanced ultimate quality factor and electro-mechanical coupling for RF filters. Such methods and structures facilitate methods of manufacturing and structures for RF filters using single crystalline or epitaxial piezoelectric films to meet the growing demands of contemporary data communication.

In an example, the present invention provides transfer structures and processes for acoustic resonator devices, which provides a flat, high-quality, single-crystal piezoelectric film for superior acoustic wave control and high Q in high frequency. As described above, polycrystalline piezoelectric layers limit Q in high frequency. Also, growing epitaxial piezoelectric layers on patterned electrodes affects the crystalline orientation of the piezoelectric layer, which limits the ability to have tight boundary control of the resulting resonators. Embodiments of the present invention, as further described below, can overcome these limitations and exhibit improved performance and cost-efficiency.

FIGS. 16A-16C through FIGS. 31A-31C illustrate a method of fabrication for an acoustic resonator device using a transfer structure with a sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

FIGS. 16A-16C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a piezoelectric film 1620 overlying a growth substrate 1610. In an example, the growth substrate 1610 can include silicon (S), silicon carbide (SiC), or other like materials. The piezoelectric film 1620 can be an epitaxial film including aluminum nitride (AlN), gallium nitride (GaN), or other like materials. Additionally, this piezoelectric substrate can be subjected to a thickness trim.

Figure 17C:
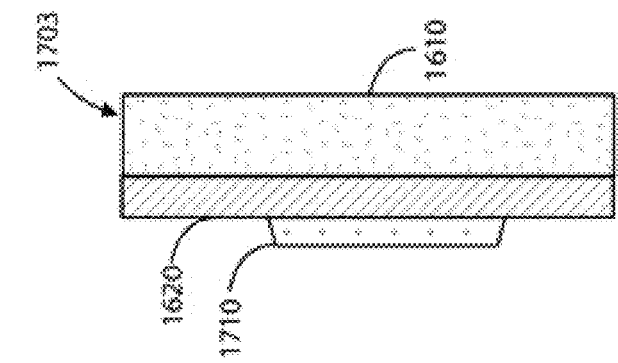
Figure 17A:
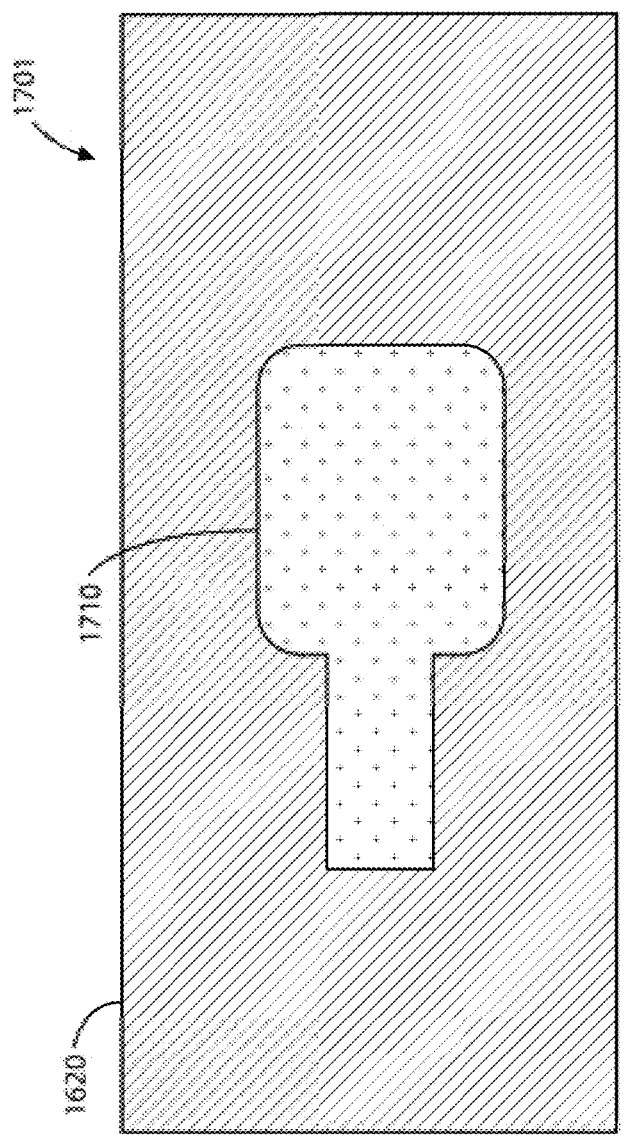
Figure 17B:
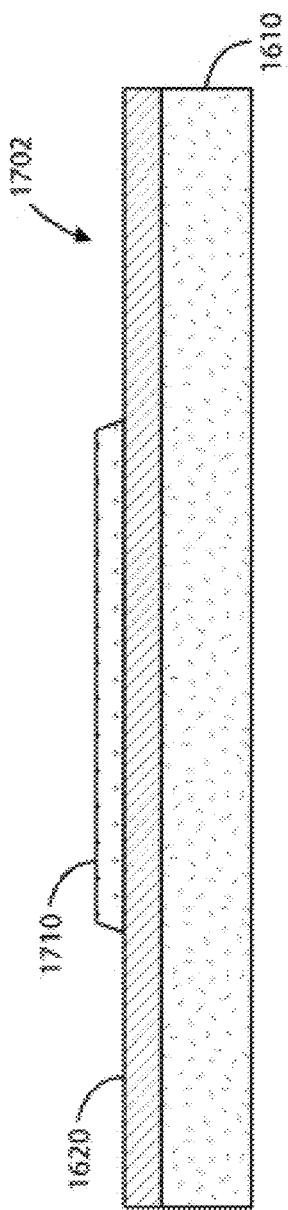

FIGS. 17A-17C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first electrode 1710 overlying the surface region of the piezoelectric film 1620. In an example, the first electrode 1710 can include molybdenum (Mo), ruthenium (Ru), tungsten (W), or other like materials. In a specific example, the first electrode 1710 can be subjected to a dry etch with a slope. As an example, the slope can be about 60 degrees.

FIGS. 18A-18C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first passivation layer 1810 overlying the first electrode 1710 and the piezoelectric film 1620. In an example, the first passivation layer 1810 can include silicon nitride (SiN), silicon oxide (SiOx), or other like materials. In a specific example, the first passivation layer 1810 can have a thickness ranging from about 50 nm to about 100 nm.

FIGS. 19A-19C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a sacrificial layer 1910 overlying a portion of the first electrode 1810 and a portion of the piezoelectric film 1620. In an example, the sacrificial layer 1910 can include polycrystalline silicon (poly-Si), amorphous silicon (a-Si), or other like materials. In a specific example, this sacrificial layer 1910 can be subjected to a dry etch with a slope and be deposited with a thickness of about 1 um. Further, phosphorous doped $SiO_2$ (PSG) can be used as the sacrificial layer with different combinations of support layer (e.g., SiNx).

FIGS. 20A-20C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a support layer 2010 overlying the sacrificial layer 1910, the first electrode 1710, and the piezoelectric film 1620. In an example, the support layer 2010 can include silicon dioxide ($SiO_2$), silicon nitride (SiN), or other like materials. In a specific example, this support layer 2010 can be deposited with a thickness of about 2-3 um. As described above, other support layers (e.g., SiNx) can be used in the case of a PSG sacrificial layer.

Figure 21C:
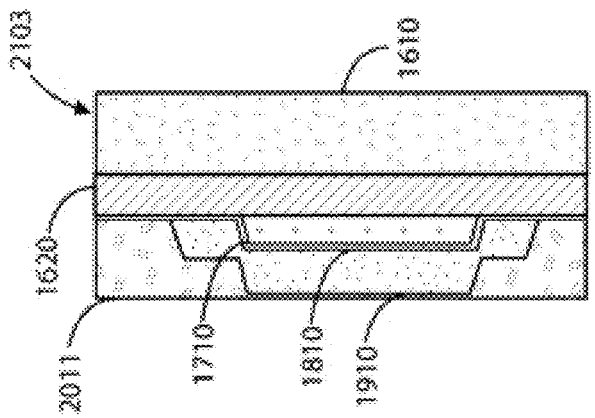
Figure 21A:
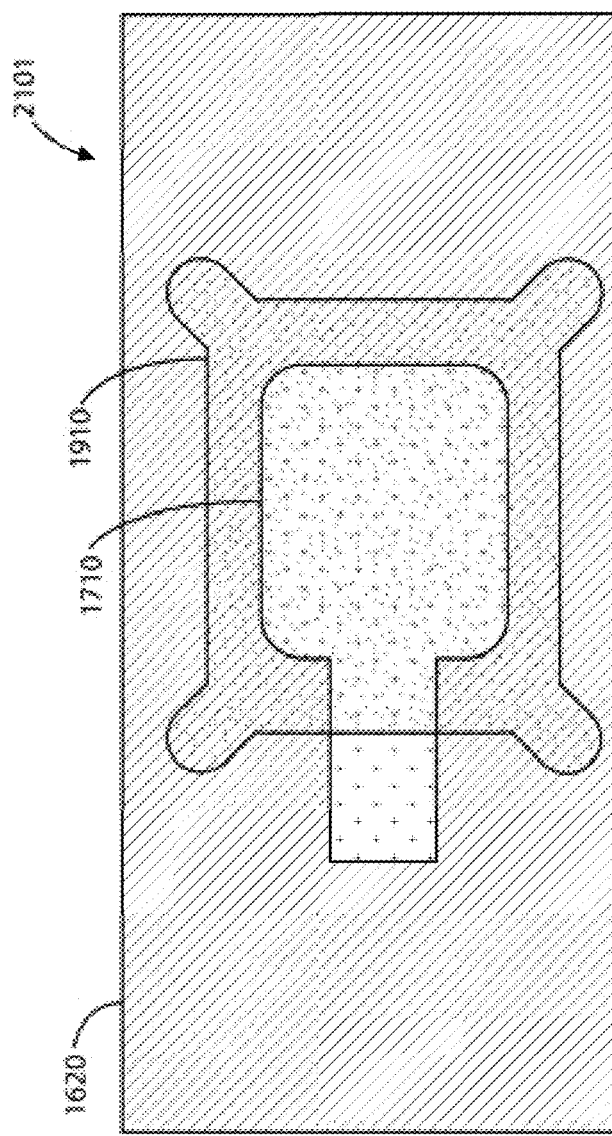
Figure 21B:
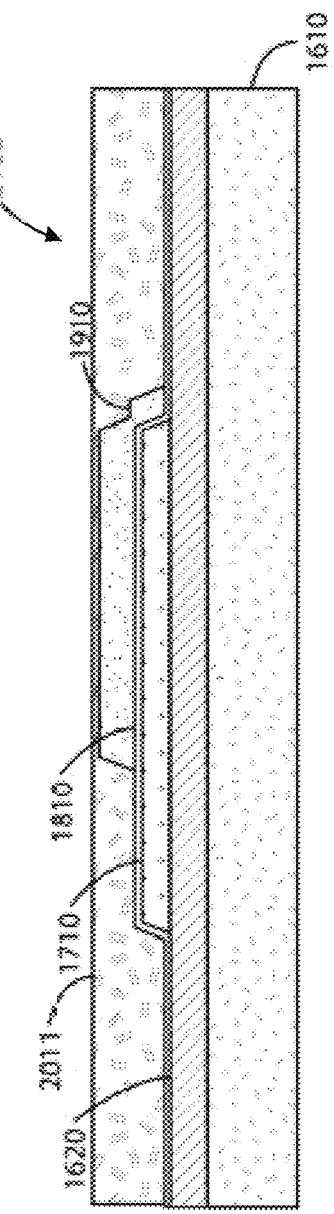

FIGS. 21A-21C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of polishing the support layer 2010 to form a polished support layer 2011. In an example, the polishing process can include a chemical-mechanical planarization process or the like.

FIGS. 22A-22C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate flipping the device and physically coupling overlying the support layer 2011 overlying a bond substrate 2210. In an example, the bond substrate 2210 can include a bonding support layer 2220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 2220 of the bond substrate 2210 is physically coupled to the polished support layer 2011. Further, the physical coupling process can include a room temperature bonding process followed by a 300 degrees Celsius annealing process.

Figure 23C:
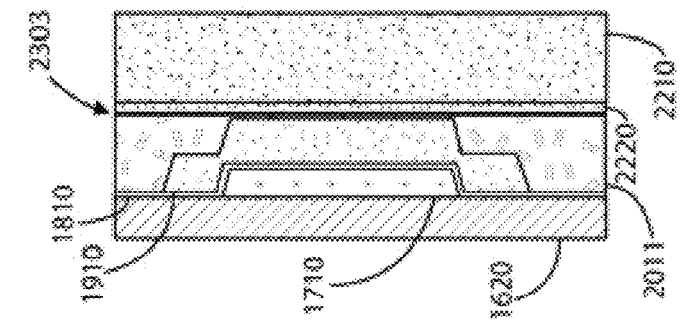
Figure 23A:
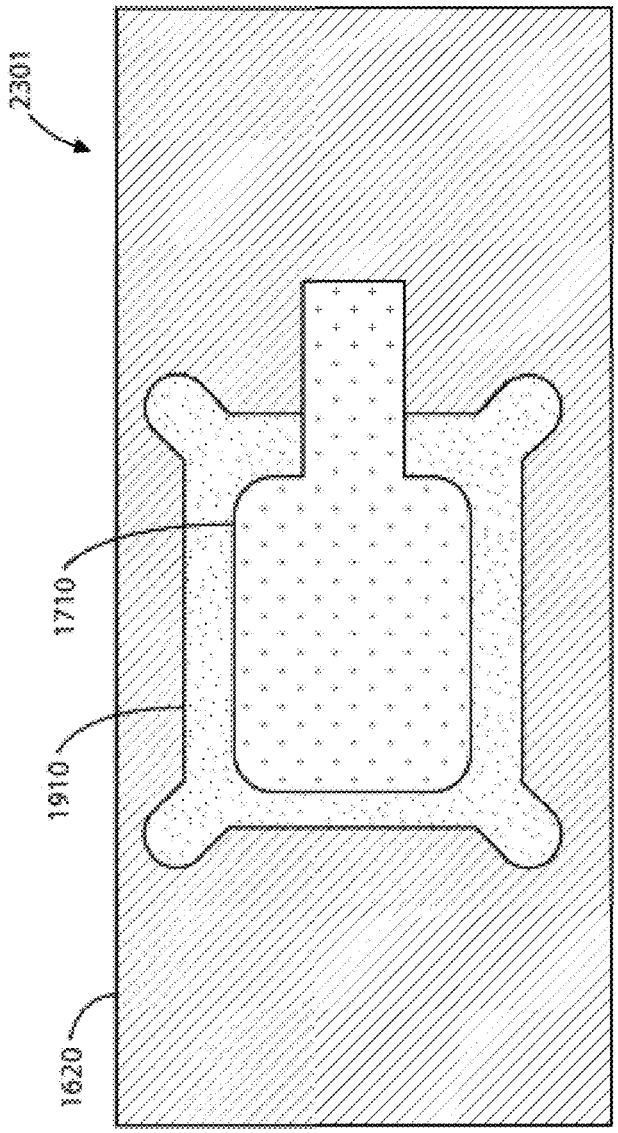
Figure 23B:
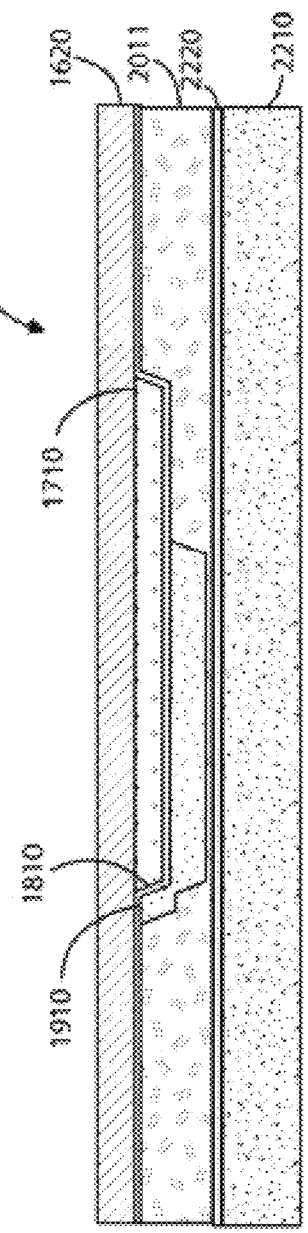

FIGS. 23A-23C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the growth substrate 1610 or otherwise the transfer of the piezoelectric film 1620. In an example, the removal process can include a grinding process, a blanket etching process, a film transfer process, an ion implantation transfer process, a laser crack transfer process, or the like and combinations thereof.

Figure 24C:
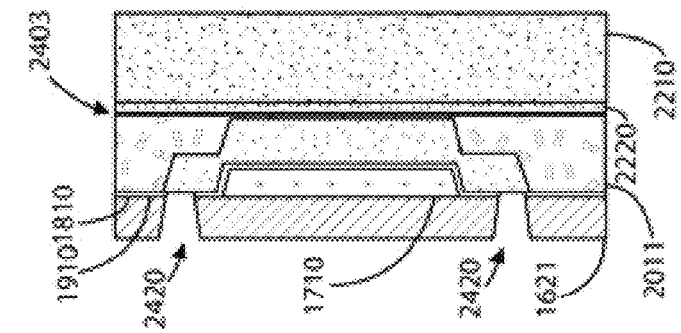
Figure 24A:
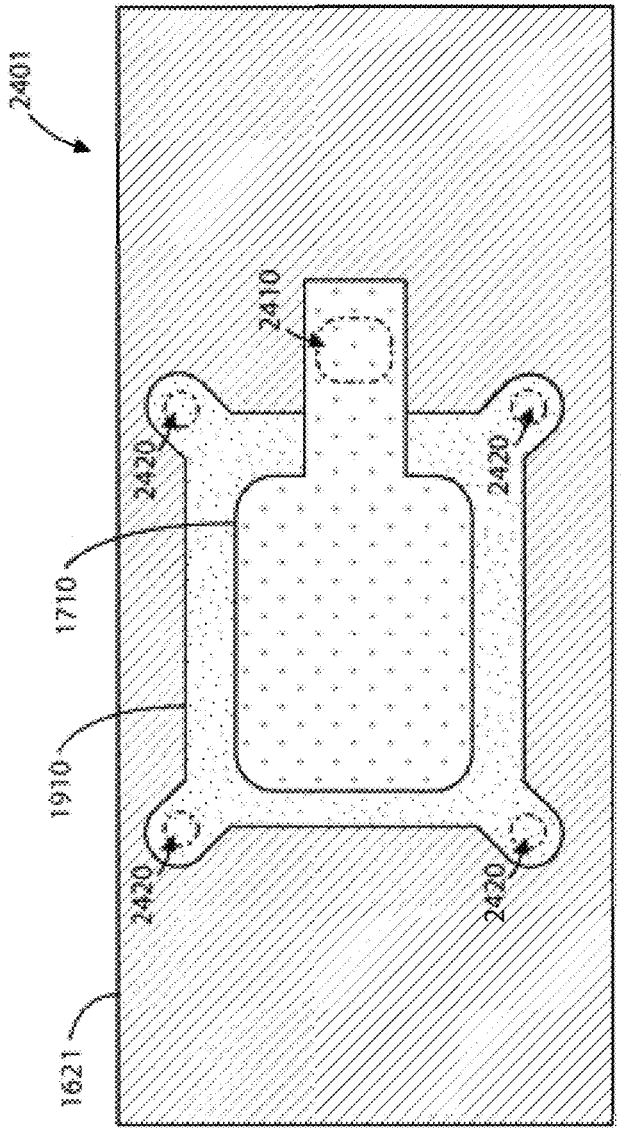
Figure 24B:
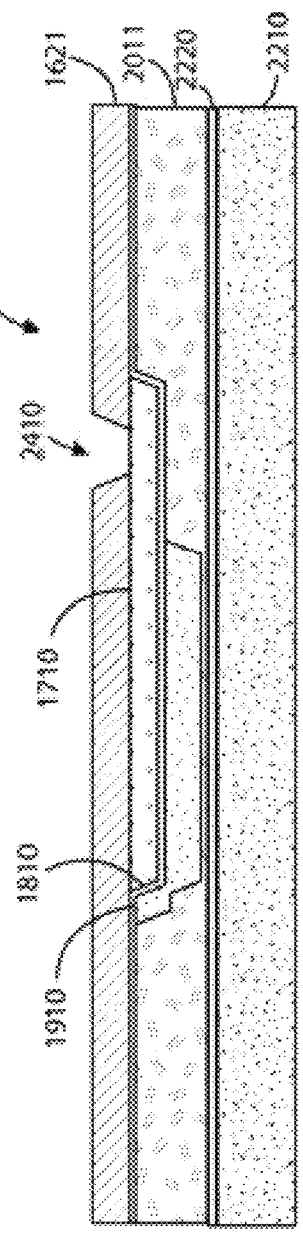

FIGS. 24A-24C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming an electrode contact via 2410 within the piezoelectric film 1620 (becoming piezoelectric film 1621) overlying the first electrode 1710 and forming one or more release holes 2420 within the piezoelectric film 1620 and the first passivation layer 1810 overlying the sacrificial layer 1910. The via forming processes can include various types of etching processes.

FIGS. 25A-25C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second electrode 2510 overlying the piezoelectric film 1621. In an example, the formation of the second electrode 2510 includes depositing molybdenum (Mo), ruthenium (Ru), tungsten (W), or other like materials; and then etching the second electrode 2510 to form an electrode cavity 2511 and to remove portion 2511 from the second electrode to form a top metal 2520. Further, the top metal 2520 is physically coupled to the first electrode 1720 through electrode contact via 2410.

FIGS. 26A-26C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. In an example, the first and second contact metals can include gold (Au), aluminum (Al), copper (Cu), nickel (Ni), aluminum bronze (AlCu), or related alloys of these materials or other like materials.

FIGS. 27A-27C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second passivation layer 2710 overlying the second electrode 2510, the top metal 2520, and the piezoelectric film 1621. In an example, the second passivation layer 2710 can include silicon nitride (SiN), silicon oxide (SiOx), or other like materials. In a specific example, the second passivation layer 2710 can have a thickness ranging from about 50 nm to about 100 nm.

FIGS. 28A-28C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the sacrificial layer 1910 to form an air cavity 2810. In an example, the removal process can include a poly-Si etch or an a-Si etch, or the like.

FIGS. 29A-29C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the second electrode 2510 and the top metal 2520 to form a processed second electrode 2910 and a processed top metal 2920. This step can follow the formation of second electrode 2510 and top metal 2520. In an example, the processing of these two components includes depositing molybdenum (Mo), ruthenium (Ru), tungsten (W), or other like materials; and then etching (e.g., dry etch or the like) this material to form the processed second electrode 2910 with an electrode cavity 2912 and the processed top metal 2920. The processed top metal 2920 remains separated from the processed second electrode 2910 by the removal of portion 2911. In a specific example, the processed second electrode 2910 is characterized by the addition of an energy confinement structure configured on the processed second electrode 2910 to increase Q.

FIGS. 30A-30C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710 to form a processed first electrode 2310. This step can follow the formation of first electrode 1710. In an example, the processing of these two components includes depositing molybdenum (Mo), ruthenium (Ru), tungsten (W), or other like materials; and then etching (e.g., dry etch or the like) this material to form the processed first electrode 3010 with an electrode cavity, similar to the processed second electrode 2910. Air cavity 2811 shows the change in cavity shape due to the processed first electrode 3010. In a specific example, the processed first electrode 3010 is characterized by the addition of an energy confinement structure configured on the processed second electrode 3010 to increase Q.

FIGS. 31A-31C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710, to form a processed first electrode 2310, and the second electrode 2510/top metal 2520 to form a processed second electrode 2910/processed top metal 2920. These steps can follow the formation of each respective electrode, as described for FIGS. 29A-29C and 30A-30C. Those of ordinary skill in the art will recognize other variations, modifications, and alternatives.

FIGS. 32A-32C through FIGS. 46A-46C illustrate a method of fabrication for an acoustic resonator device using a transfer structure without sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 32C:
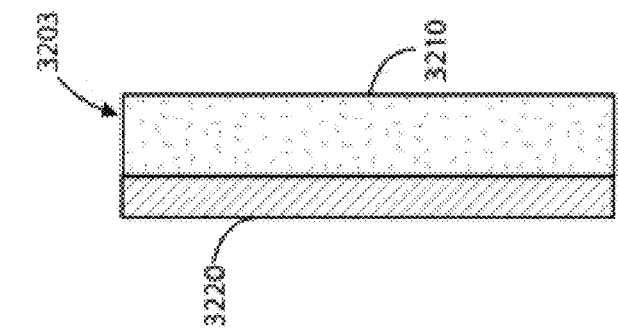
Figure 32A:
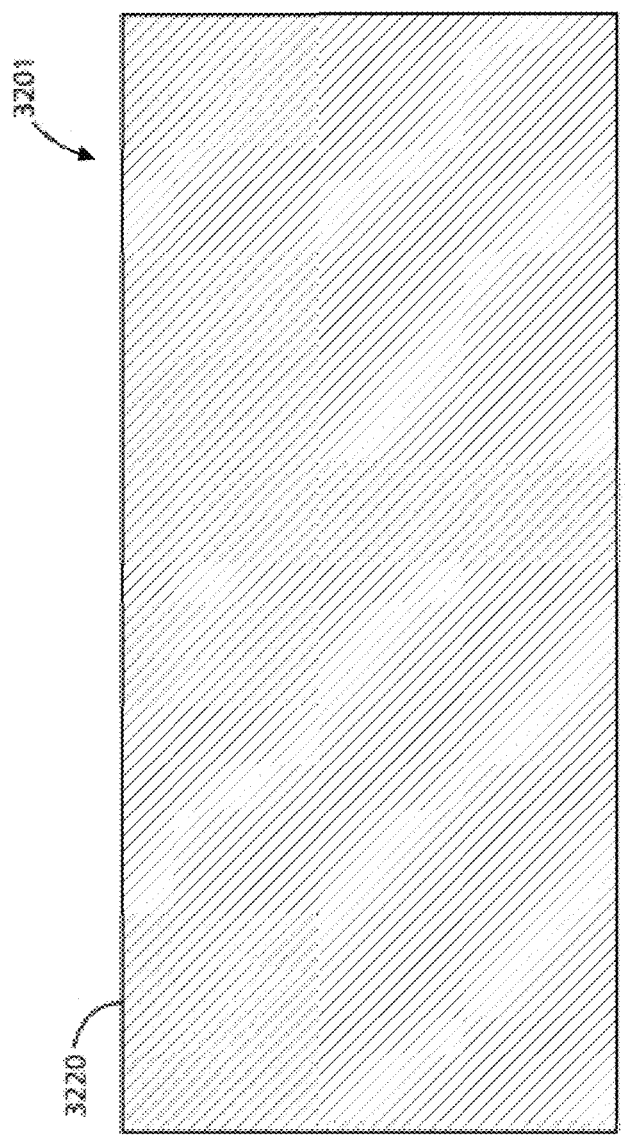
Figure 32B:
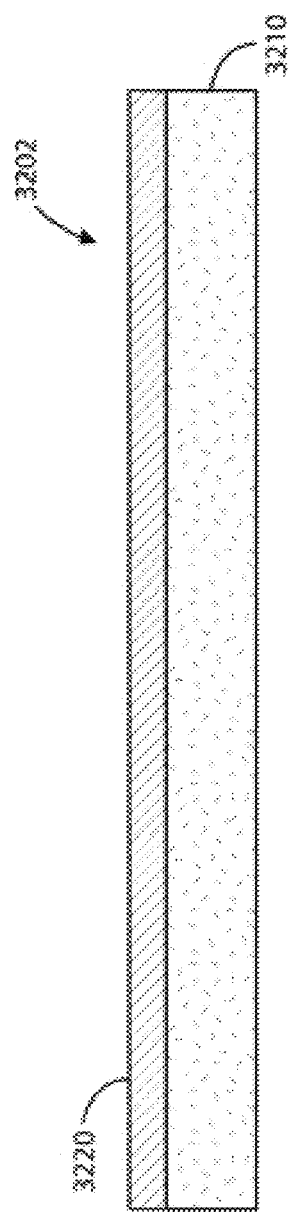

FIGS. 32A-32C are simplified diagrams illustrating various cross-sectional views of a single crystal acoustic resonator device and of method steps for a transfer process for single crystal acoustic resonator devices according to an example of the present invention. As shown, these figures illustrate the method step of forming a piezoelectric film 3220 overlying a growth substrate 3210. In an example, the growth substrate 3210 can include silicon (S), silicon carbide (SiC), or other like materials. The piezoelectric film 3220 can be an epitaxial film including aluminum nitride (AlN), gallium nitride (GaN), or other like materials. Additionally, this piezoelectric substrate can be subjected to a thickness trim.

Figure 33C:
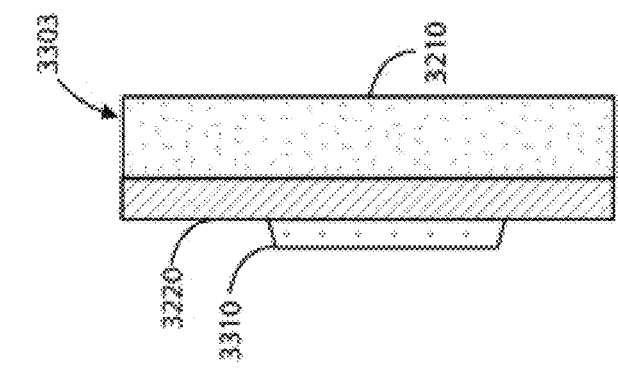
Figure 33A:
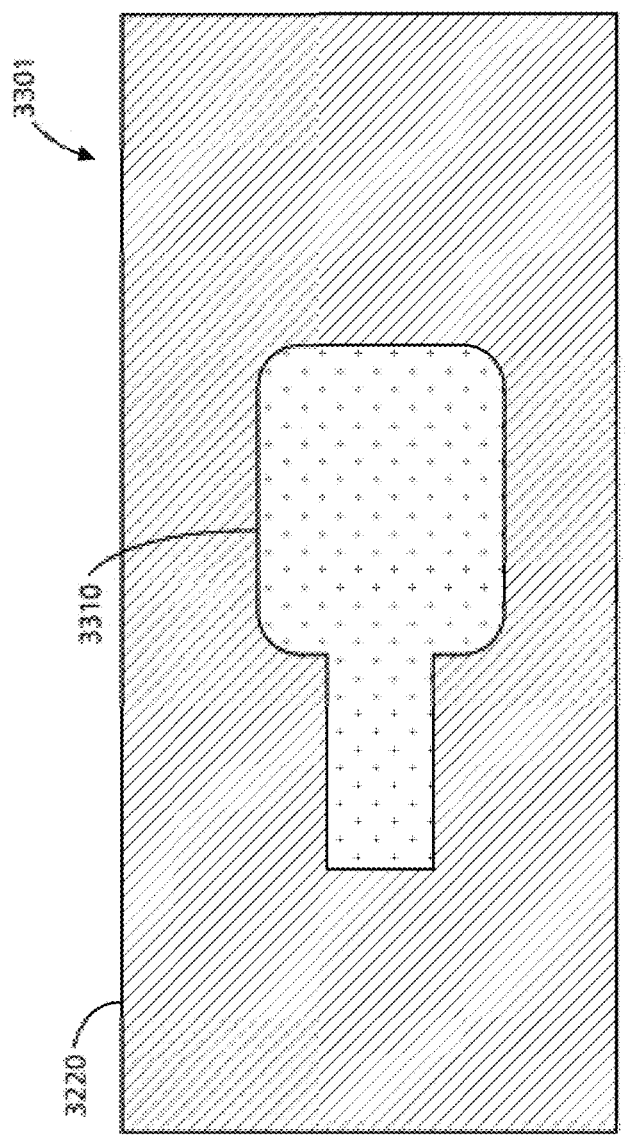
Figure 33B:
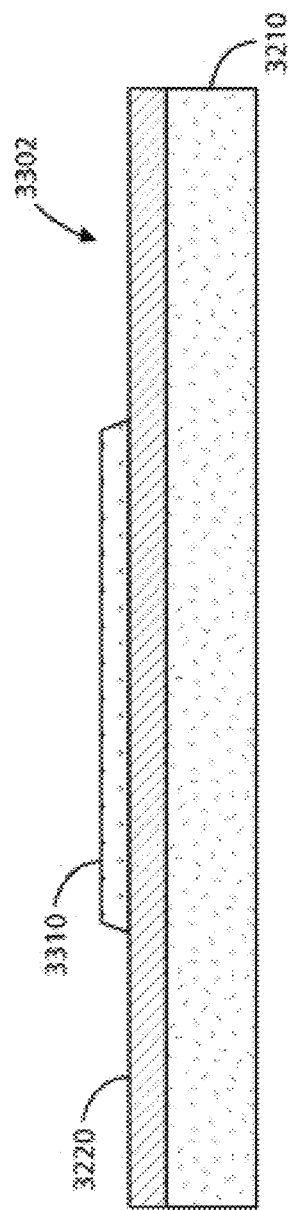

FIGS. 33A-33C are simplified diagrams illustrating various cross-sectional views of a single crystal acoustic resonator device and of method steps for a transfer process for single crystal acoustic resonator devices according to an example of the present invention. As shown, these figures illustrate the method step of forming a first electrode 3310 overlying the surface region of the piezoelectric film 3220. In an example, the first electrode 3310 can include molybdenum (Mo), ruthenium (Ru), tungsten (W), or other like materials. In a specific example, the first electrode 3310 can be subjected to a dry etch with a slope. As an example, the slope can be about 60 degrees.

FIGS. 34A-34C are simplified diagrams illustrating various cross-sectional views of a single crystal acoustic resonator device and of method steps for a transfer process for single crystal acoustic resonator devices according to an example of the present invention. As shown, these figures illustrate the method step of forming a first passivation layer 3410 overlying the first electrode 3310 and the piezoelectric film 3220. In an example, the first passivation layer 3410 can include silicon nitride (SiN), silicon oxide (SiOx), or other like materials. In a specific example, the first passivation layer 3410 can have a thickness ranging from about 50 nm to about 100 nm.

Figure 35C:
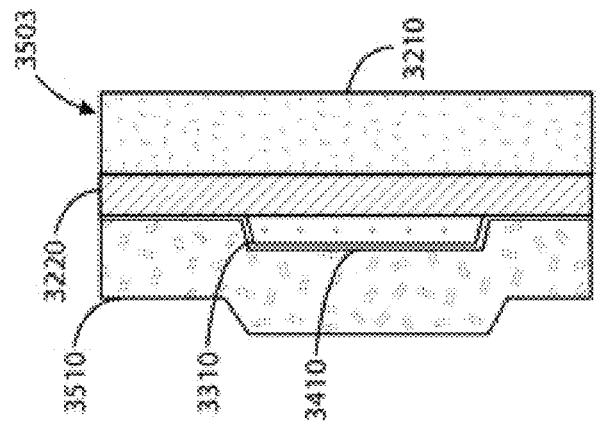
Figure 35A:
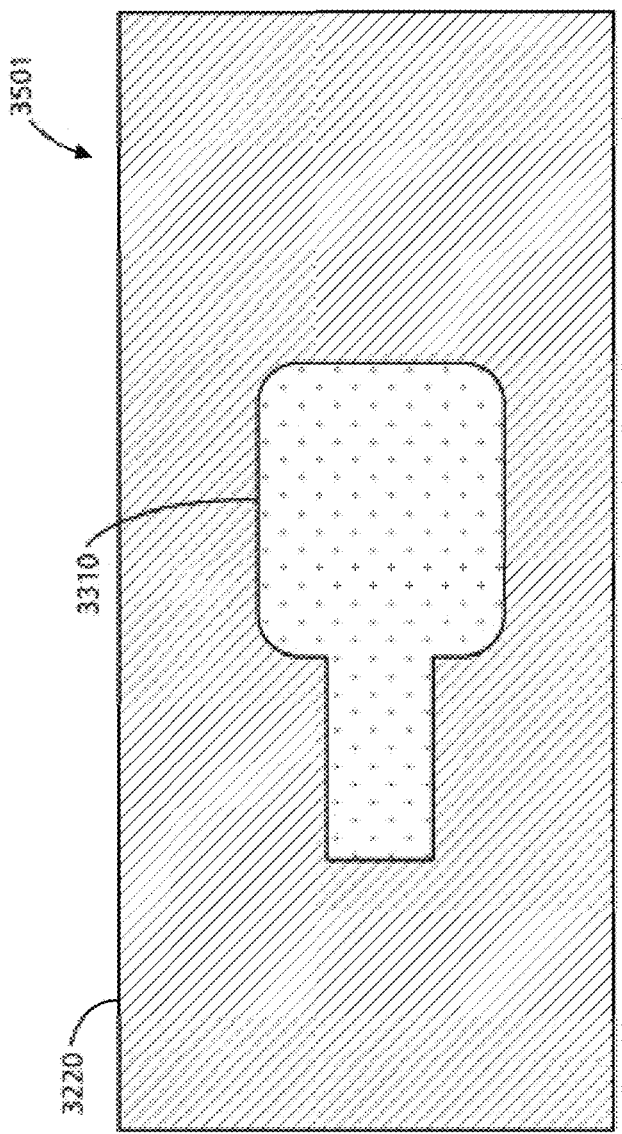
Figure 35B:
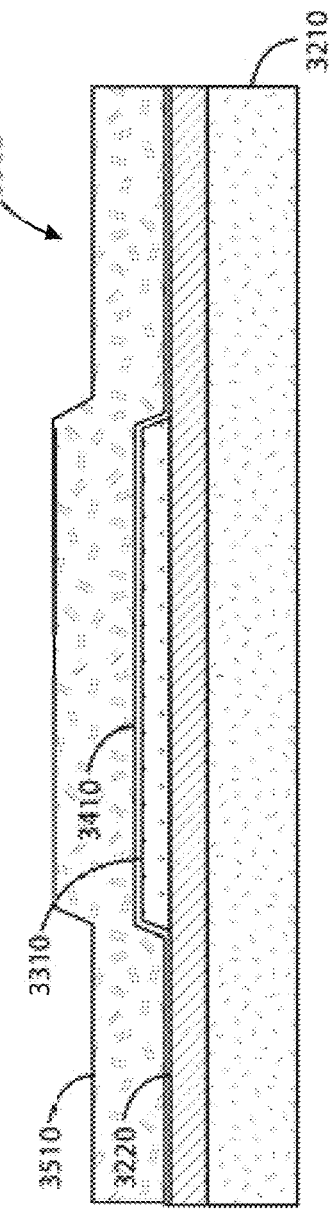

FIGS. 35A-35C are simplified diagrams illustrating various cross-sectional views of a single crystal acoustic resonator device and of method steps for a transfer process for single crystal acoustic resonator devices according to an example of the present invention. As shown, these figures illustrate the method step of forming a support layer 3510 overlying the first electrode 3310, and the piezoelectric film 3220. In an example, the support layer 3510 can include silicon dioxide (SiO$_2$), silicon nitride (SiN), or other like materials. In a specific example, this support layer 3510 can be deposited with a thickness of about 2-3 um. As described above, other support layers (e.g., SiNx) can be used in the case of a PSG sacrificial layer.

Figure 36C:
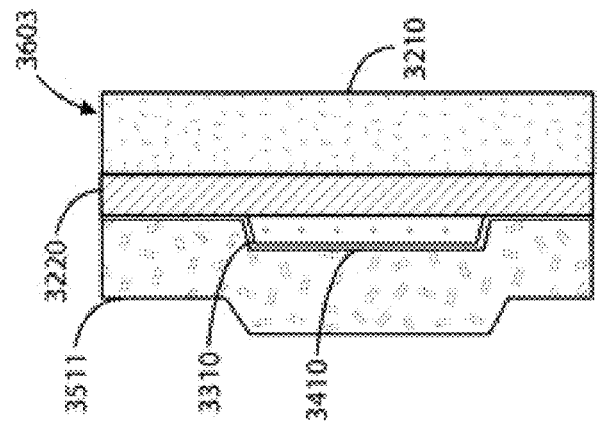
Figure 36A:
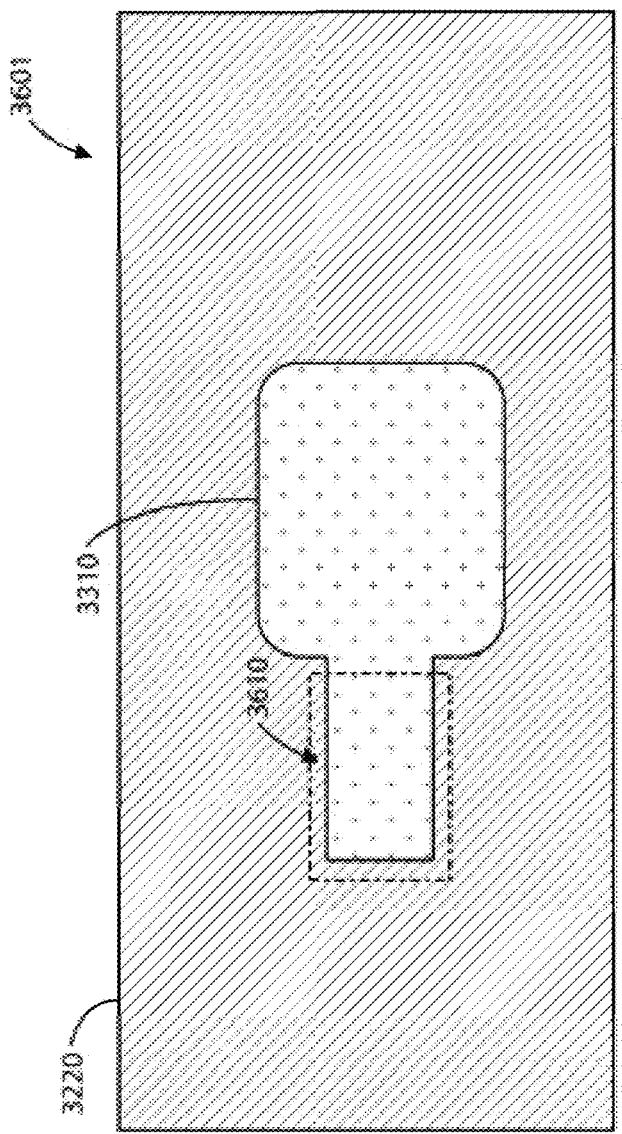
Figure 36B:
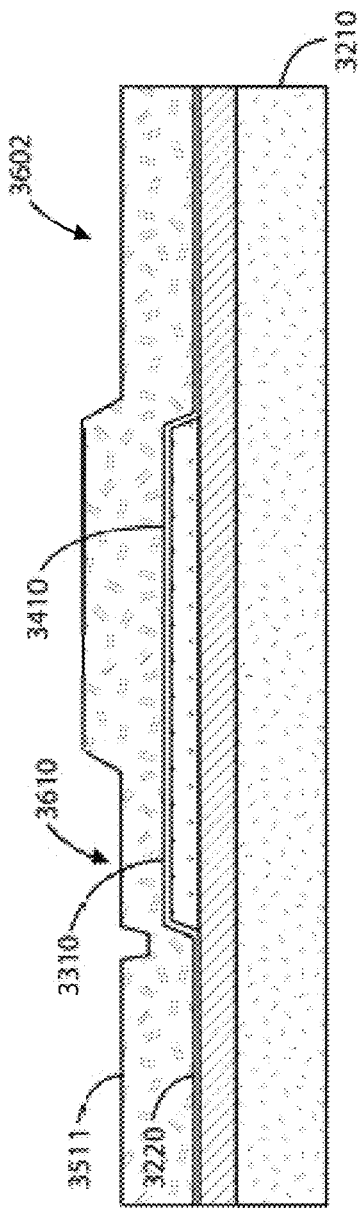

FIGS. 36A-36C are simplified diagrams illustrating various cross-sectional views of a single crystal acoustic resonator device and of method steps for a transfer process for single crystal acoustic resonator devices according to an example of the present invention. As shown, these figures illustrate the optional method step of processing the support layer 3510 (to form support layer 3511) in region 3610. In an example, the processing can include a partial etch of the support layer 3510 to create a flat bond surface. In a specific example, the processing can include a cavity region. In other examples, this step can be replaced with a polishing process such as a chemical-mechanical planarization process or the like.

FIGS. 37A-37C are simplified diagrams illustrating various cross-sectional views of a single crystal acoustic resonator device and of method steps for a transfer process for single crystal acoustic resonator devices according to an example of the present invention. As shown, these figures illustrate the method step of forming an air cavity 3710 within a portion of the support layer 3511 (to form support layer 3512). In an example, the cavity formation can include an etching process that stops at the first passivation layer 3410.

FIGS. 38A-38C are simplified diagrams illustrating various cross-sectional views of a single crystal acoustic resonator device and of method steps for a transfer process for single crystal acoustic resonator devices according to an example of the present invention. As shown, these figures illustrate the method step of forming one or more cavity vent holes 3810 within a portion of the piezoelectric film 3220 through the first passivation layer 3410. In an example, the cavity vent holes 3810 connect to the air cavity 3710.

Figure 39C:
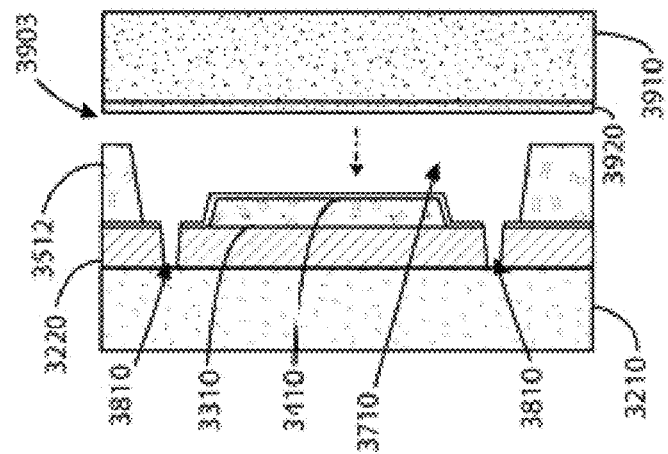
Figure 39A:
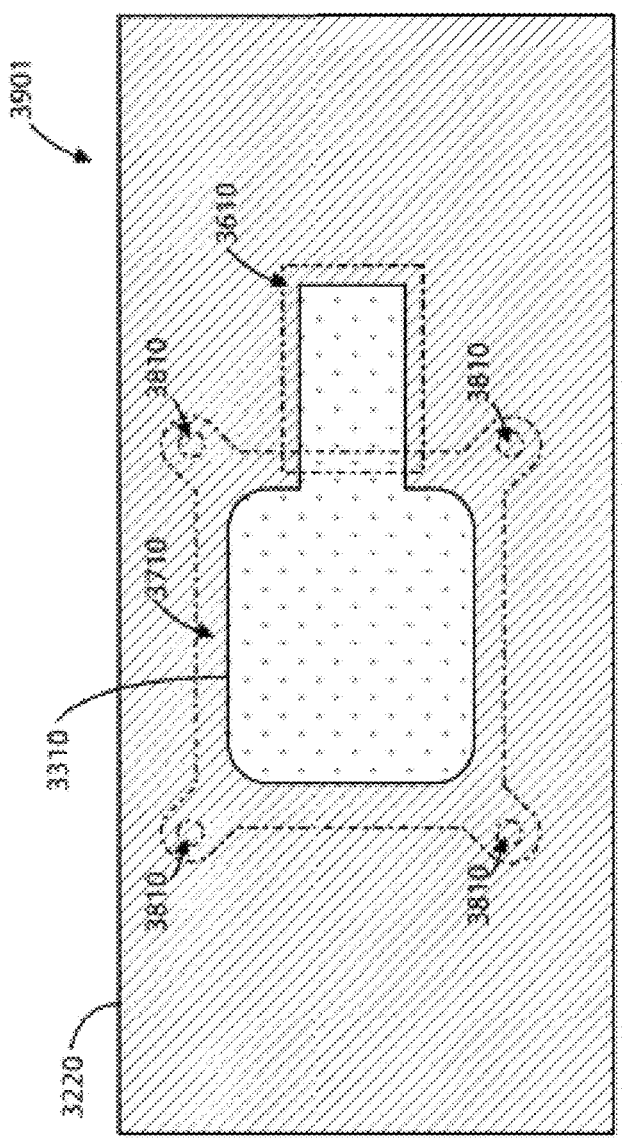
Figure 39B:
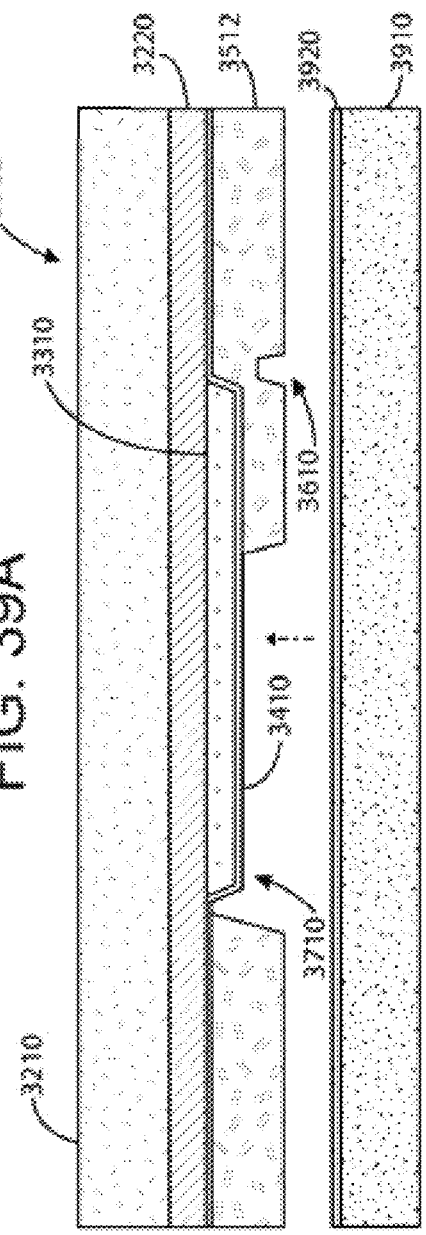

FIGS. 39A-39C are simplified diagrams illustrating various cross-sectional views of a single crystal acoustic resonator device and of method steps for a transfer process for single crystal acoustic resonator devices according to an example of the present invention. As shown, these figures illustrate flipping the device and physically coupling overlying the support layer 3512 overlying a bond substrate 3910. In an example, the bond substrate 3910 can include a bonding support layer 3920 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 3920 of the bond substrate 3910 is physically coupled to the polished support layer 3512. Further, the physical coupling process can include a room temperature bonding process followed by a 300 degrees Celsius annealing process.

FIGS. 40A-40C are simplified diagrams illustrating various cross-sectional views of a single crystal acoustic resonator device and of method steps for a transfer process for single crystal acoustic resonator devices according to an example of the present invention. As shown, these figures illustrate the method step of removing the growth substrate 3210 or otherwise the transfer of the piezoelectric film 3220. In an example, the removal process can include a grinding process, a blanket etching process, a film transfer process, an ion implantation transfer process, a laser crack transfer process, or the like and combinations thereof.

FIGS. 41A-41C are simplified diagrams illustrating various cross-sectional views of a single crystal acoustic resonator device and of method steps for a transfer process for single crystal acoustic resonator devices according to an example of the present invention. As shown, these figures illustrate the method step of forming an electrode contact via 4110 within the piezoelectric film 3220 overlying the first electrode 3310. The via forming processes can include various types of etching processes.

Figure 42C:
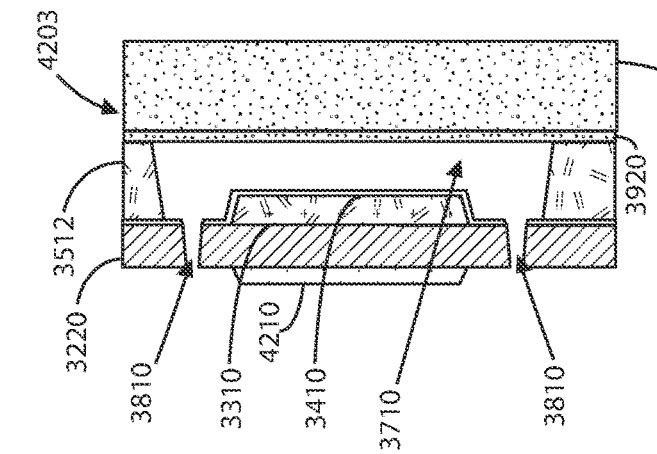
Figure 42A:
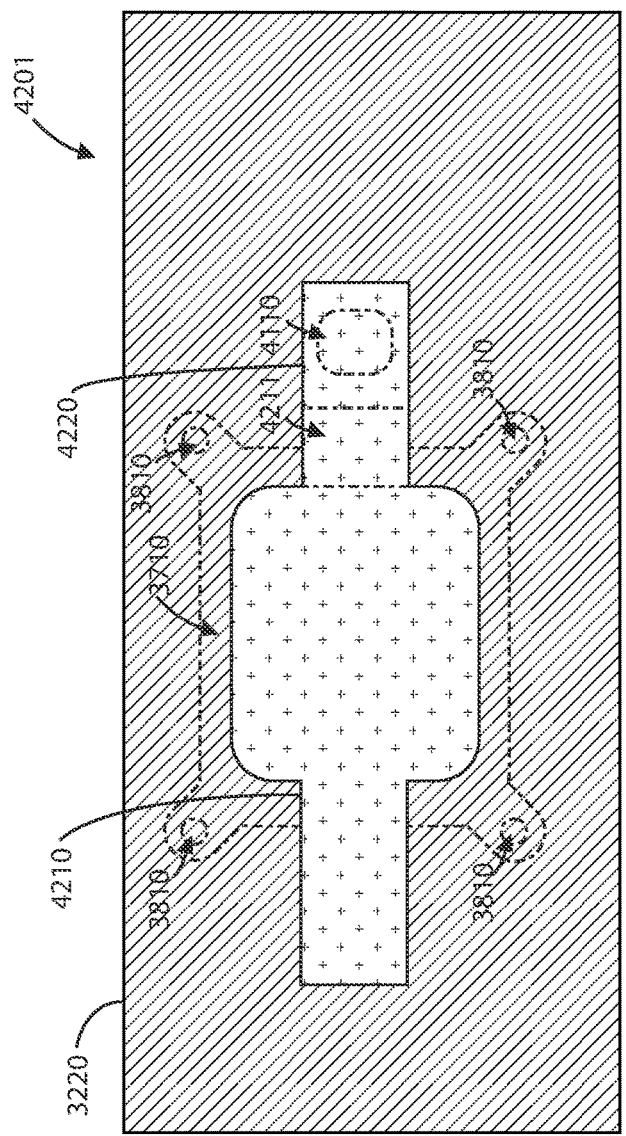
Figure 42B:
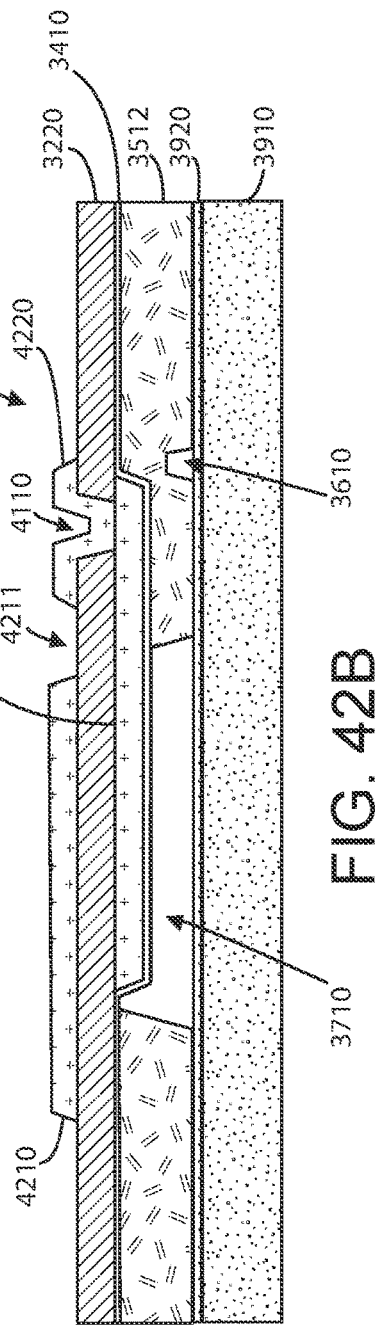

FIGS. 42A-42C are simplified diagrams illustrating various cross-sectional views of a single crystal acoustic resonator device and of method steps for a transfer process for single crystal acoustic resonator devices according to an example of the present invention. As shown, these figures illustrate the method step of forming a second electrode 4210 overlying the piezoelectric film 3220. In an example, the formation of the second electrode 4210 includes depositing molybdenum (Mo), ruthenium (Ru), tungsten (W), or other like materials; and then etching the second electrode 4210 to form an electrode cavity 4211 and to remove portion 4211 from the second electrode to form a top metal 4220. Further, the top metal 4220 is physically coupled to the first electrode 3310 through electrode contact via 4110.

FIGS. 43A-43C are simplified diagrams illustrating various cross-sectional views of a single crystal acoustic resonator device and of method steps for a transfer process for single crystal acoustic resonator devices according to an example of the present invention. As shown, these figures illustrate the method step of forming a first contact metal 4310 overlying a portion of the second electrode 4210 and a portion of the piezoelectric film 3220, and forming a second contact metal 4311 overlying a portion of the top metal 4220 and a portion of the piezoelectric film 3220. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the piezoelectric film 3220. In an example, the second passivation layer 4320 can include silicon nitride (SiN), silicon oxide (SiOx), or other like materials. In a specific example, the second passivation layer 4320 can have a thickness ranging from about 50 nm to about 100 nm.

FIGS. 44A-44C are simplified diagrams illustrating various cross-sectional views of a single crystal acoustic resonator device and of method steps for a transfer process for single crystal acoustic resonator devices according to another example of the present invention. As shown, these figures illustrate the method step of processing the second electrode 4210 and the top metal 4220 to form a processed second electrode 4410 and a processed top metal 4420. This step can follow the formation of second electrode 4210 and top metal 4220. In an example, the processing of these two components includes depositing molybdenum (Mo), ruthenium (Ru), tungsten (W), or other like materials; and then etching (e.g., dry etch or the like) this material to form the processed second electrode 4410 with an electrode cavity 4412 and the processed top metal 4420. The processed top metal 4420 remains separated from the processed second electrode 4410 by the removal of portion 4411. In a specific example, the processed second electrode 4410 is characterized by the addition of an energy confinement structure configured on the processed second electrode 4410 to increase Q.

FIGS. 45A-45C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310 to form a processed first electrode 4510. This step can follow the formation of first electrode 3310. In an example, the processing of these two components includes depositing molybdenum (Mo), ruthenium (Ru), tungsten (W), or other like materials; and then etching (e.g., dry etch or the like) this material to form the processed first electrode 4510 with an electrode cavity, similar to the processed second electrode 4410. Air cavity 3711 shows the change in cavity shape due to the processed first electrode 4510. In a specific example, the processed first electrode 4510 is characterized by the addition of an energy confinement structure configured on the processed second electrode 4510 to increase Q.

FIGS. 46A-46C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310, to form a processed first electrode 4510, and the second electrode 4210/top metal 4220 to form a processed second electrode 4410/processed top metal 4420. These steps can follow the formation of each respective electrode, as described for FIGS. 44A-44C and 45A-45C. Those of ordinary skill in the art will recognize other variations, modifications, and alternatives.

FIGS. 47A-47C through FIGS. 59A-59C illustrate a method of fabrication for an acoustic resonator device using a transfer structure with a multilayer mirror structure. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 47C:
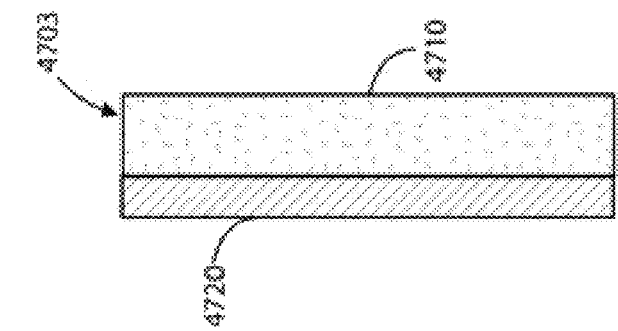
FIGS. 47A-47C though
Figure 47A:
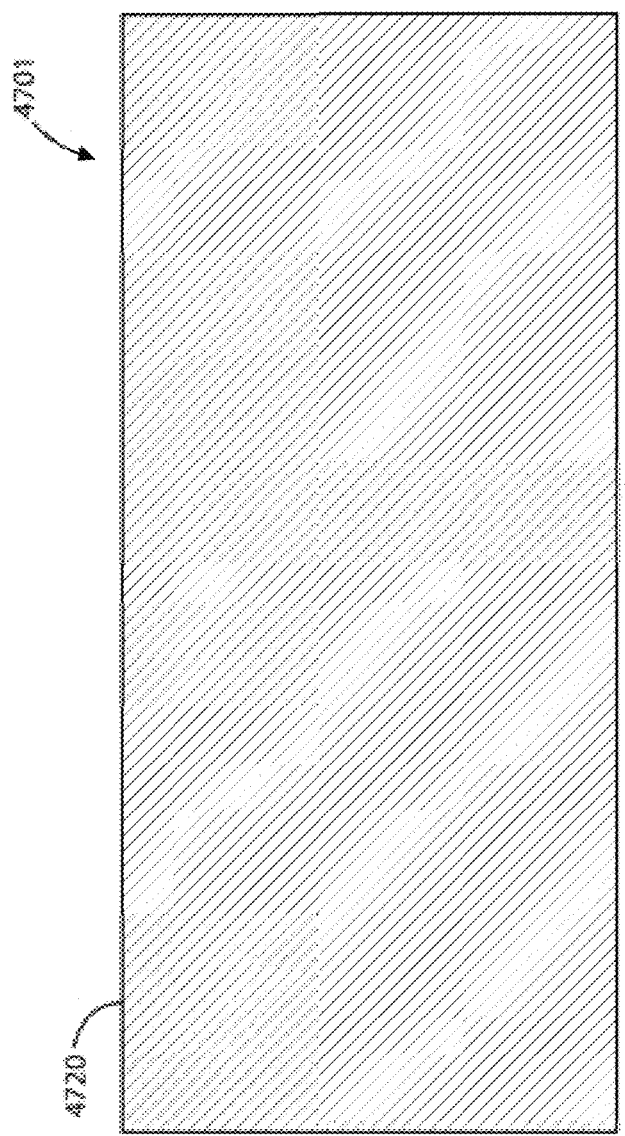
Figure 47B:
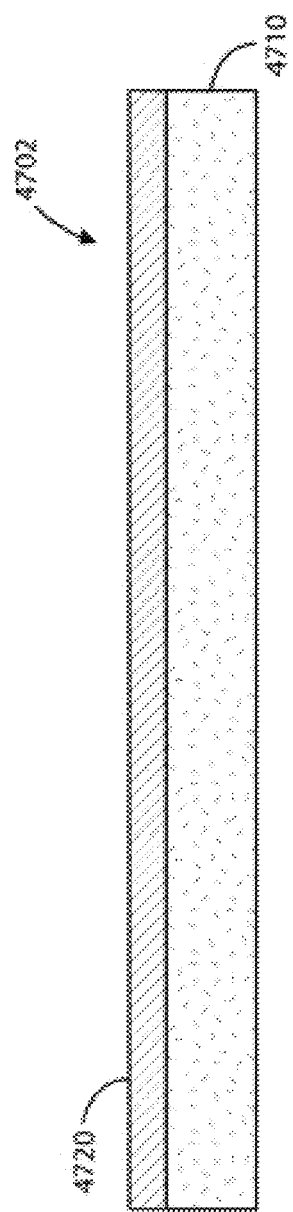

FIGS. 47A-47C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a piezoelectric film 4720 overlying a growth substrate 4710. In an example, the growth substrate 4710 can include silicon (S), silicon carbide (SiC), or other like materials. The piezoelectric film 4720 can be an epitaxial film including aluminum nitride (AlN), gallium nitride (GaN), or other like materials. Additionally, this piezoelectric substrate can be subjected to a thickness trim.

FIGS. 48A-48C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first electrode 4810 overlying the surface region of the piezoelectric film 4720. In an example, the first electrode 4810 can include molybdenum (Mo), ruthenium (Ru), tungsten (W), or other like materials. In a specific example, the first electrode 4810 can be subjected to a dry etch with a slope. As an example, the slope can be about 60 degrees.

Figure 49A:
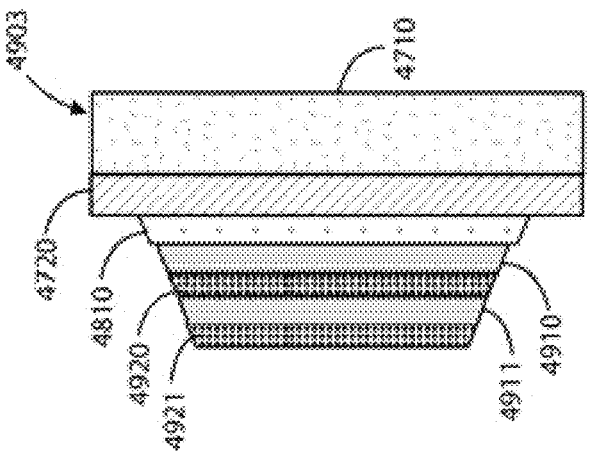
Figure 49B:
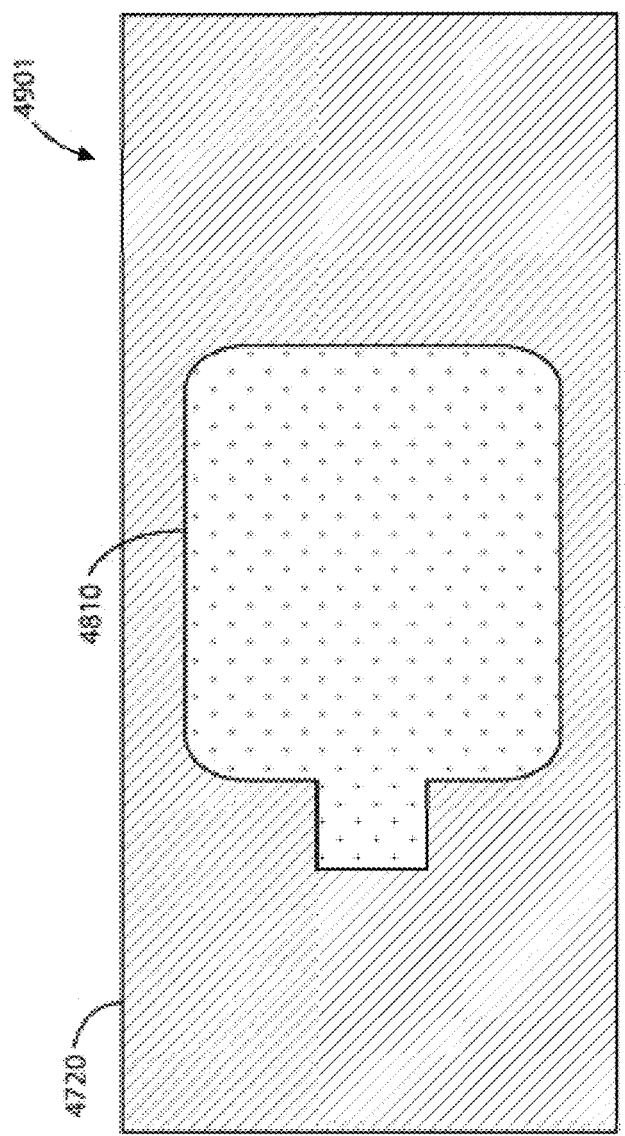
Figure 49C:
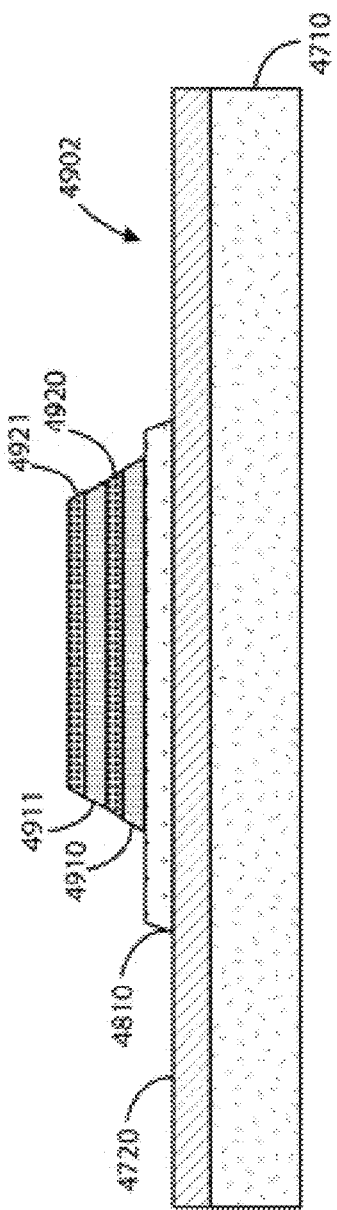

FIGS. 49A-49C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a multilayer mirror or reflector structure. In an example, the multilayer mirror includes at least one pair of layers with a low impedance layer 4910 and a high impedance layer 4920. In FIGS. 49A-49C, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the first electrode 4810 can be patterned after the mirror structure is patterned.

FIGS. 50A-50C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a support layer 5010 overlying the mirror structure (layers 4910, 4911, 4920, and 4921), the first electrode 4810, and the piezoelectric film 4720. In an example, the support layer 5010 can include silicon dioxide ($SiO_2$), silicon nitride (SiN), or other like materials. In a specific example, this support layer 5010 can be deposited with a thickness of about 2-3 um. As described above, other support layers (e.g., SiNx) can be used.

FIGS. 51A-51C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of polishing the support layer 5010 to form a polished support layer 5011. In an example, the polishing process can include a chemical-mechanical planarization process or the like.

Figures 52A, 52B, 52C:
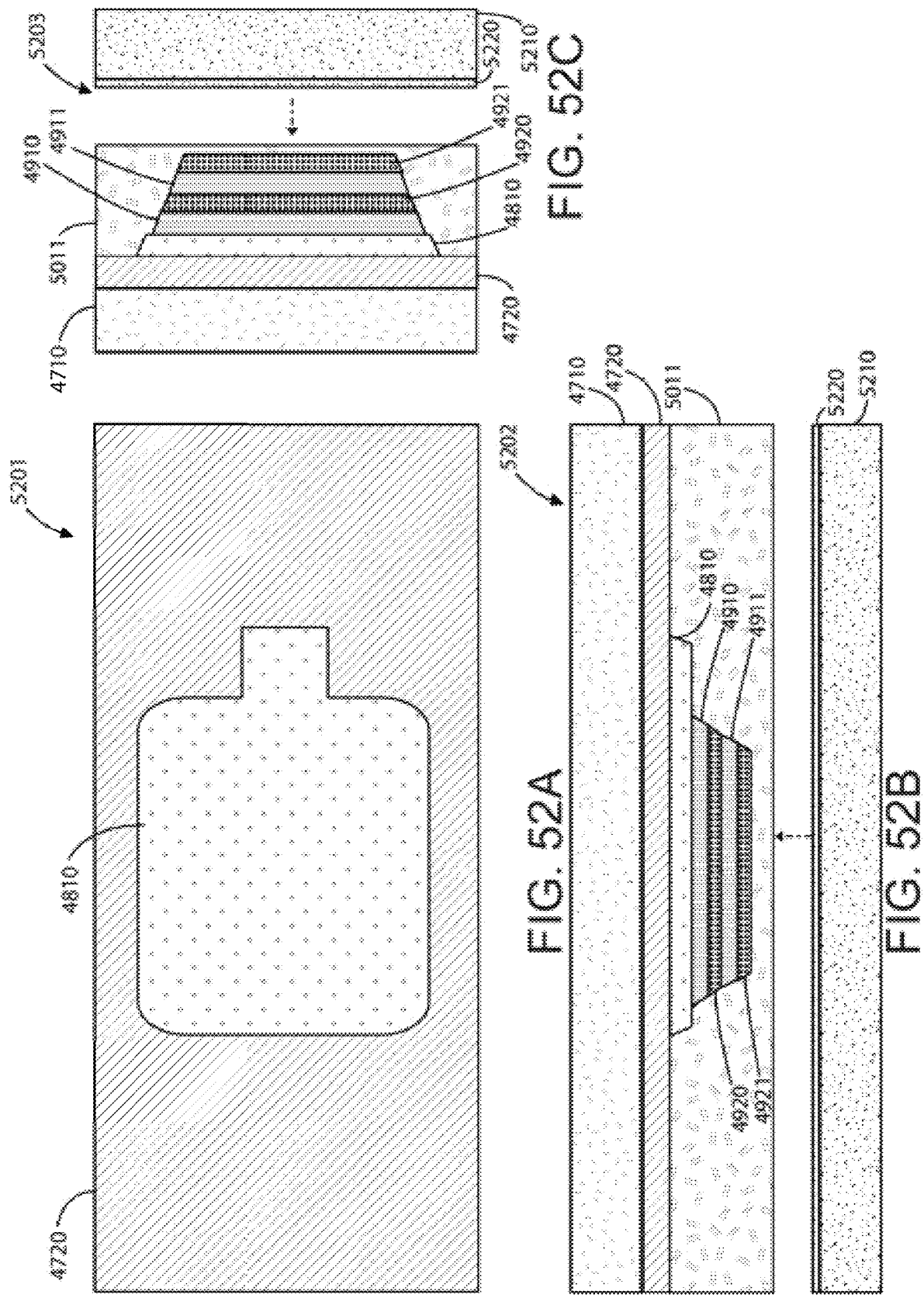

FIGS. 52A-52C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate flipping the device and physically coupling overlying the support layer 5011 overlying a bond substrate 5210. In an example, the bond substrate 5210 can include a bonding support layer 5220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 5220 of the bond substrate 5210 is physically coupled to the polished support layer 5011. Further, the physical coupling process can include a room temperature bonding process followed by a 300 degrees Celsius annealing process.

Figure 53C:
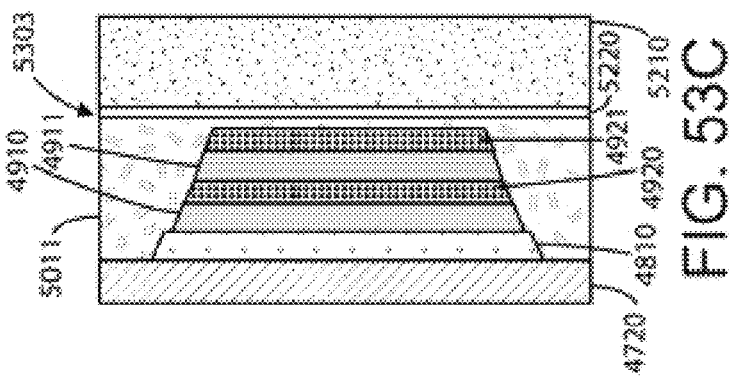
Figure 53A:
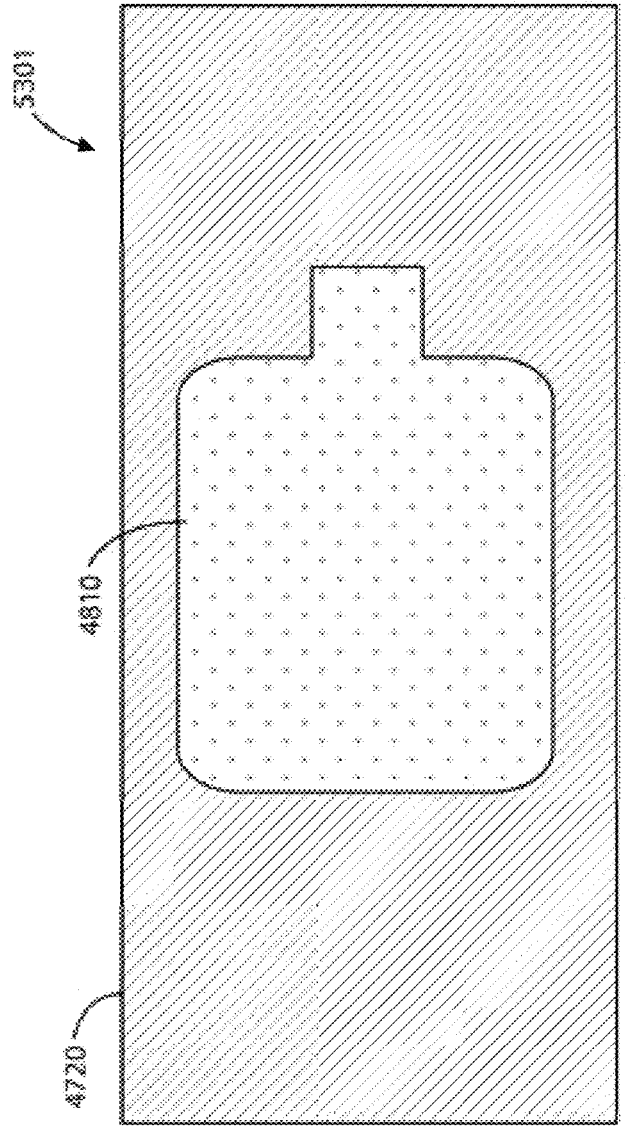
Figure 53B:
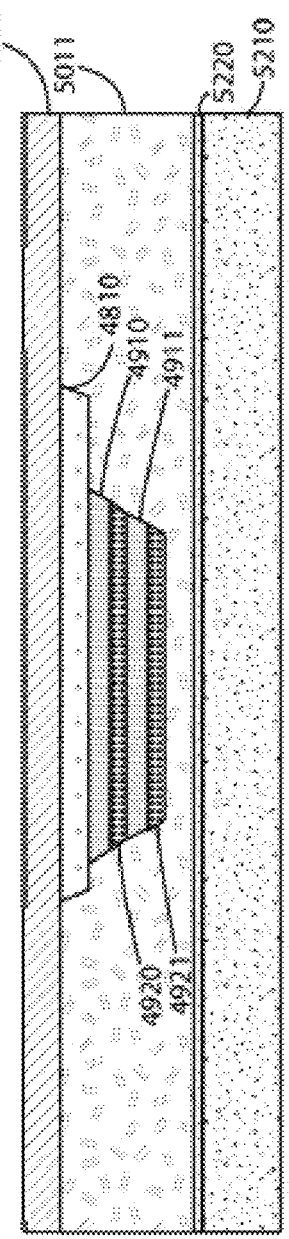

FIGS. 53A-53C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of removing the growth substrate 4710 or otherwise the transfer of the piezoelectric film 4720. In an example, the removal process can include a grinding process, a blanket etching process, a film transfer process, an ion implantation transfer process, a laser crack transfer process, or the like and combinations thereof.

Figure 54C:
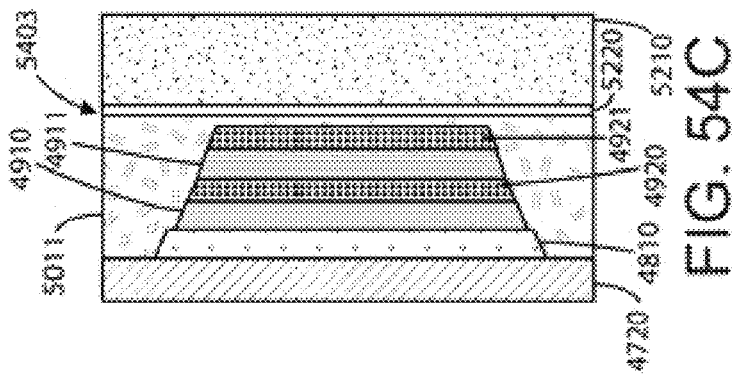
Figure 54A:
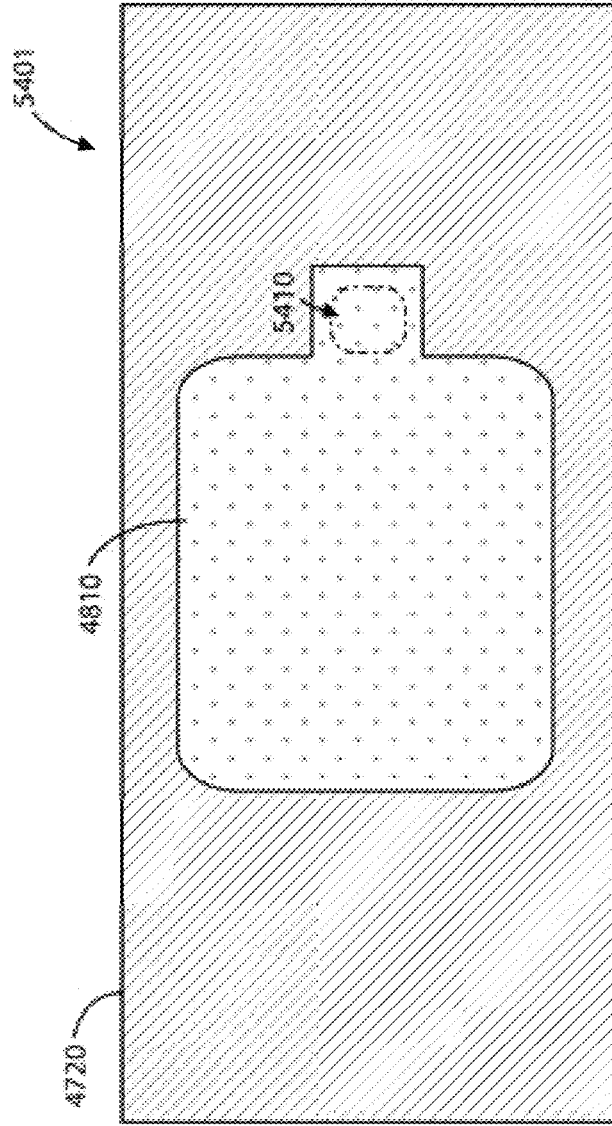
Figure 54B:
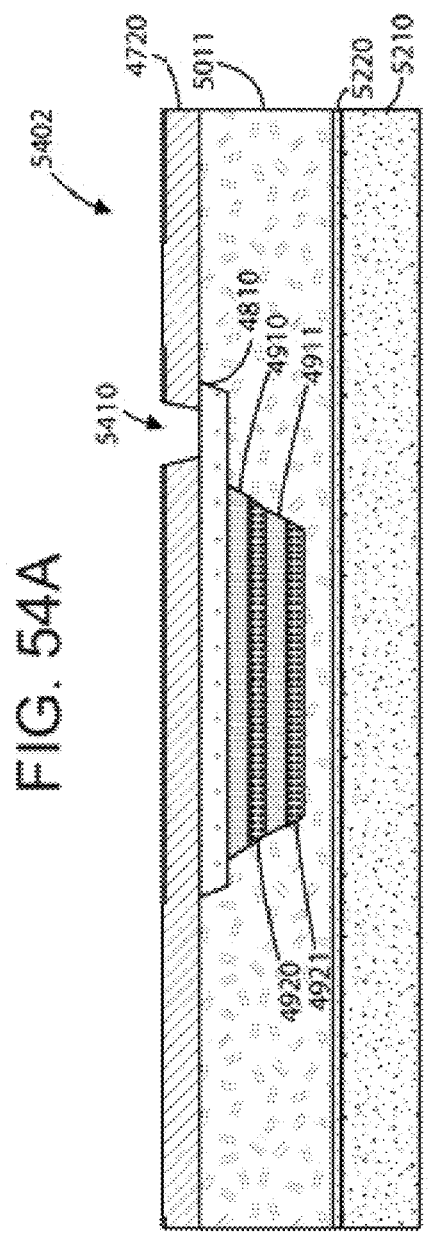

FIGS. 54A-54C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming an electrode contact via 5410 within the piezoelectric film 4720 overlying the first electrode 4810. The via forming processes can include various types of etching processes.

FIGS. 55A-55C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a second electrode 5510 overlying the piezoelectric film 4720. In an example, the formation of the second electrode 5510 includes depositing molybdenum (Mo), ruthenium (Ru), tungsten (W), or other like materials; and then etching the second electrode 5510 to form an electrode cavity 5511 and to remove portion 5511 from the second electrode to form a top metal 5520. Further, the top metal 5520 is physically coupled to the first electrode 5520 through electrode contact via 5410.

FIGS. 56A-56C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first contact metal 5610 overlying a portion of the second electrode 5510 and a portion of the piezoelectric film 4720, and forming a second contact metal 5611 overlying a portion of the top metal 5520 and a portion of the piezoelectric film 4720. In an example, the first and second contact metals can include gold (Au), aluminum (Al), copper (Cu), nickel (Ni), aluminum bronze (AlCu), or other like materials. This figure also shows the method step of forming a second passivation layer 5620 overlying the second electrode 5510, the top metal 5520, and the piezoelectric film 4720. In an example, the second passivation layer 5620 can include silicon nitride (SiN), silicon oxide (SiOx), or other like materials. In a specific example, the second passivation layer 5620 can have a thickness ranging from about 50 nm to about 100 nm.

Figure 57C:
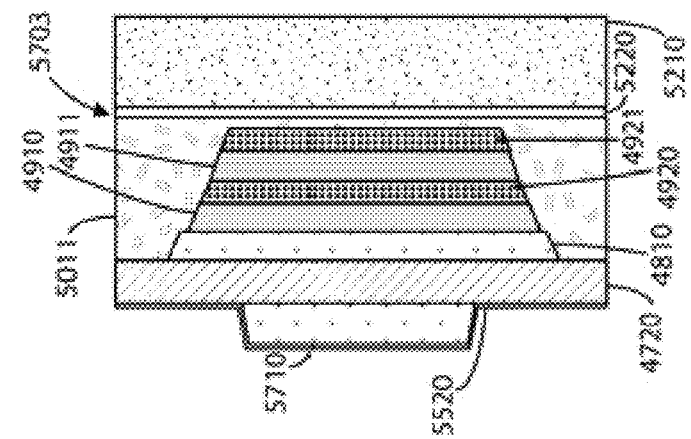
Figure 57A:
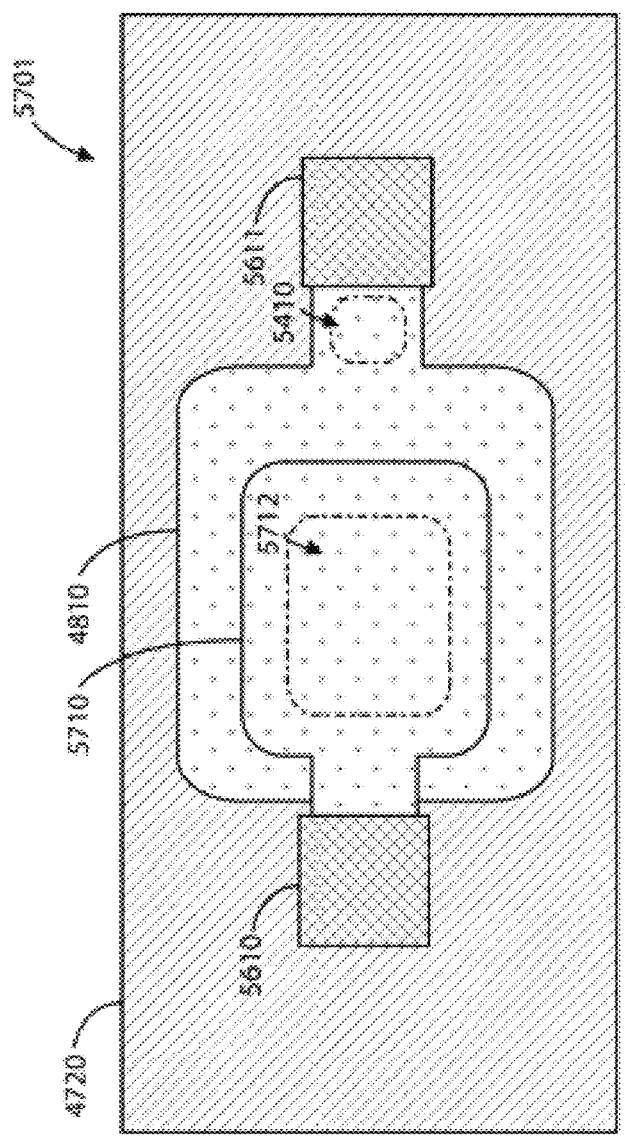
Figure 57B:
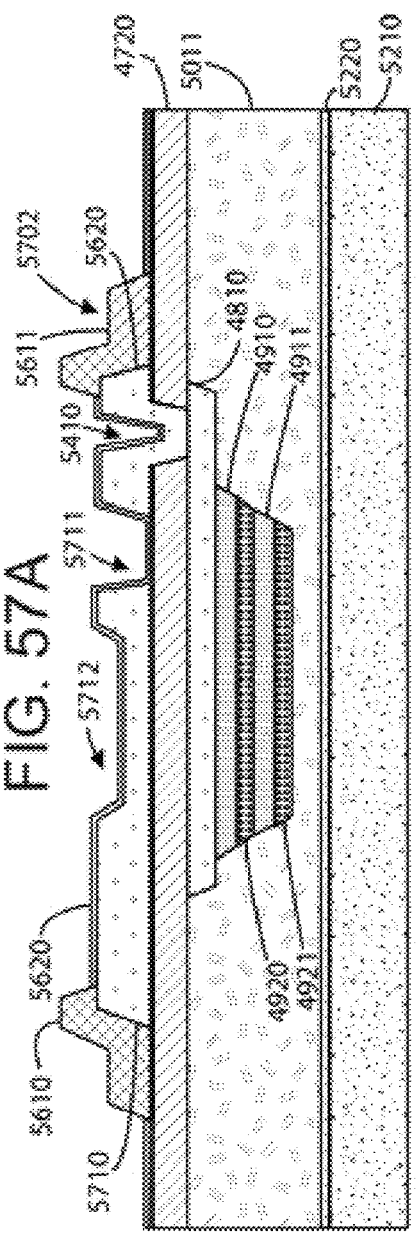

FIGS. 57A-57C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the second electrode 5510 and the top metal 5520 to form a processed second electrode 5710 and a processed top metal 5720. This step can follow the formation of second electrode 5710 and top metal 5720. In an example, the processing of these two components includes depositing molybdenum (Mo), ruthenium (Ru), tungsten (W), or other like materials; and then etching (e.g., dry etch or the like) this material to form the processed second electrode 5410 with an electrode cavity 5712 and the processed top metal 5720. The processed top metal 5720 remains separated from the processed second electrode 5710 by the removal of portion 5711. In a specific example, this processing gives the second electrode and the top metal greater thickness while creating the electrode cavity 5712. In a specific example, the processed second electrode 5710 is characterized by the addition of an energy confinement structure configured on the processed second electrode 5710 to increase Q.

FIGS. 58A-58C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810 to form a processed first electrode 5810. This step can follow the formation of first electrode 4810. In an example, the processing of these two components includes depositing molybdenum (Mo), ruthenium (Ru), tungsten (W), or other like materials; and then etching (e.g., dry etch or the like) this material to form the processed first electrode 5810 with an electrode cavity, similar to the processed second electrode 5710. Compared to the two previous examples, there is no air cavity. In a specific example, the processed first electrode 5810 is characterized by the addition of an energy confinement structure configured on the processed second electrode 5810 to increase Q.

Figure 59C:
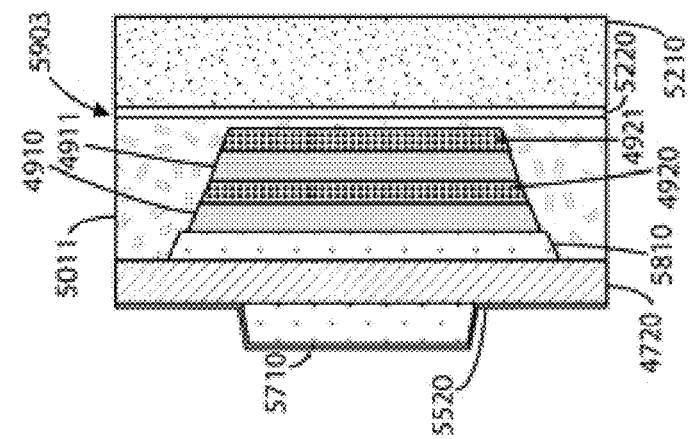
FIGS. 59A-59C are simplified diagrams illustrating various cross-sectional views of a single crystal acoustic resonator device and of method steps for a solidly mounted transfer process for single crystal acoustic resonator devices according to an example of the present invention.
Figure 59A:
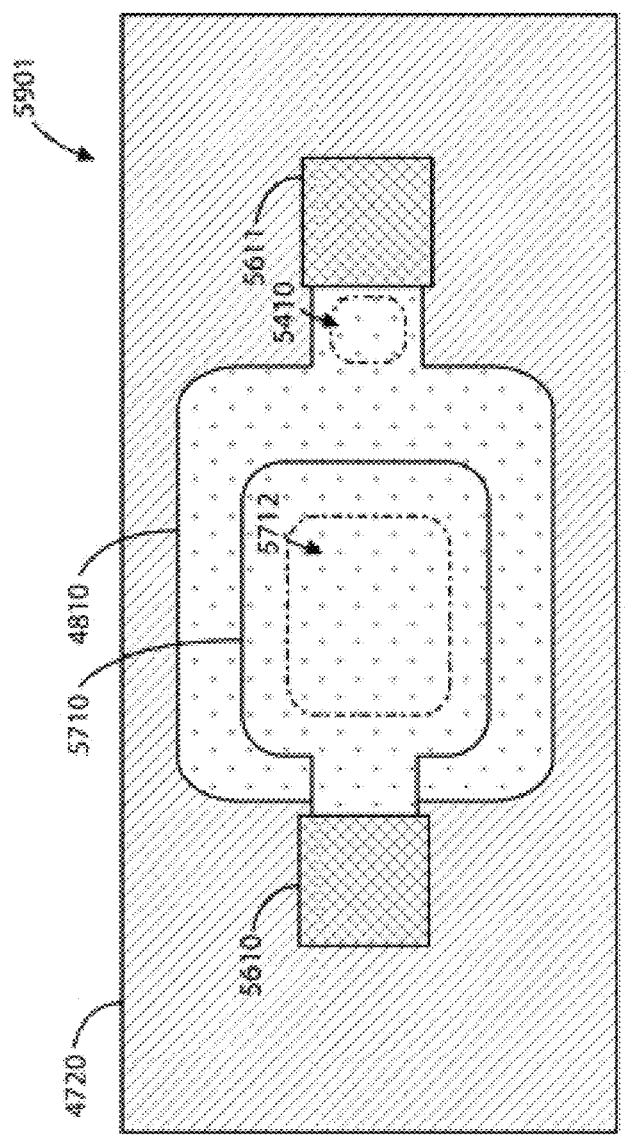
Figure 59B:
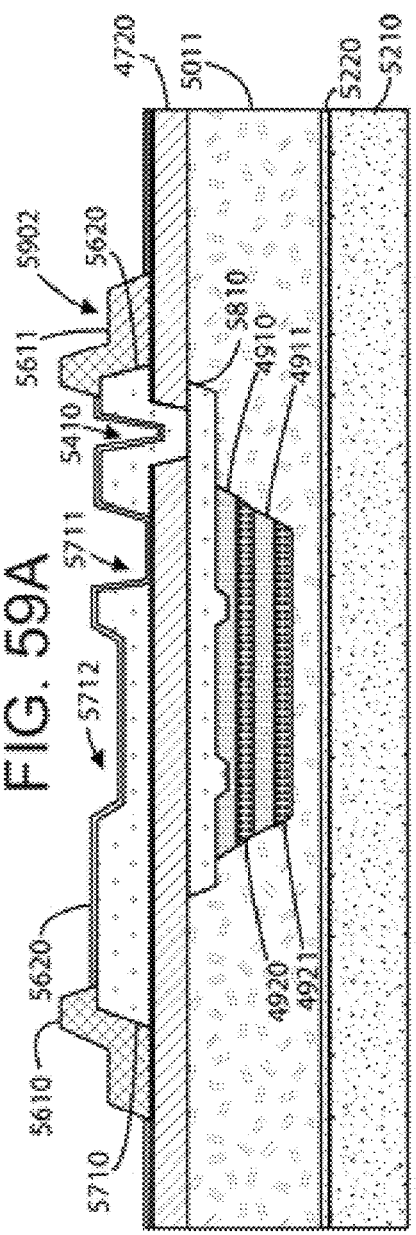

FIGS. 59A-59C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810, to form a processed first electrode 5810, and the second electrode 5510/top metal 5520 to form a processed second electrode 5710/processed top metal 5720. These steps can follow the formation of each respective electrode, as described for FIGS. 57A-57C and 58A-58C. Those of ordinary skill in the art will recognize other variations, modifications, and alternatives.

In each of the preceding examples relating to transfer processes, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance frequency in which the wave is travelling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

In addition, the top single crystalline piezoelectric layer can be replaced by a polycrystalline piezoelectric film. In such films, the lower part that is close to the interface with the substrate has poor crystalline quality with smaller grain sizes and a wider distribution of the piezoelectric polarization orientation than the upper part of the film close to the surface. This is due to the polycrystalline growth of the piezoelectric film, i.e., the nucleation and initial film have random crystalline orientations. Considering AlN as a piezoelectric material, the growth rate along the c-axis or the polarization orientation is higher than other crystalline orientations that increase the proportion of the grains with the c-axis perpendicular to the growth surface as the film grows thicker. In a typical polycrystalline AlN film with about a 1 um thickness, the upper part of the film close to the surface has better crystalline quality and better alignment in terms of piezoelectric polarization. By using the thin film transfer process contemplated in the present invention, it is possible to use the upper portion of the polycrystalline film in high frequency BAW resonators with very thin piezoelectric films. This can be done by removing a portion of the piezoelectric layer during the growth substrate removal process. Of course, there can be other variations, modifications, and alternatives.

In an example, the present invention provides a high-performance, ultra-small pass-band Bulk Acoustic Wave (BAW) Radio Frequency (RF) Filter for use in 5.6/6.6 GHz Wi-Fi applications covering U-NII-1, U-NII-2A, U-NII-2C, and U-NII-C bands.

Figure 60:
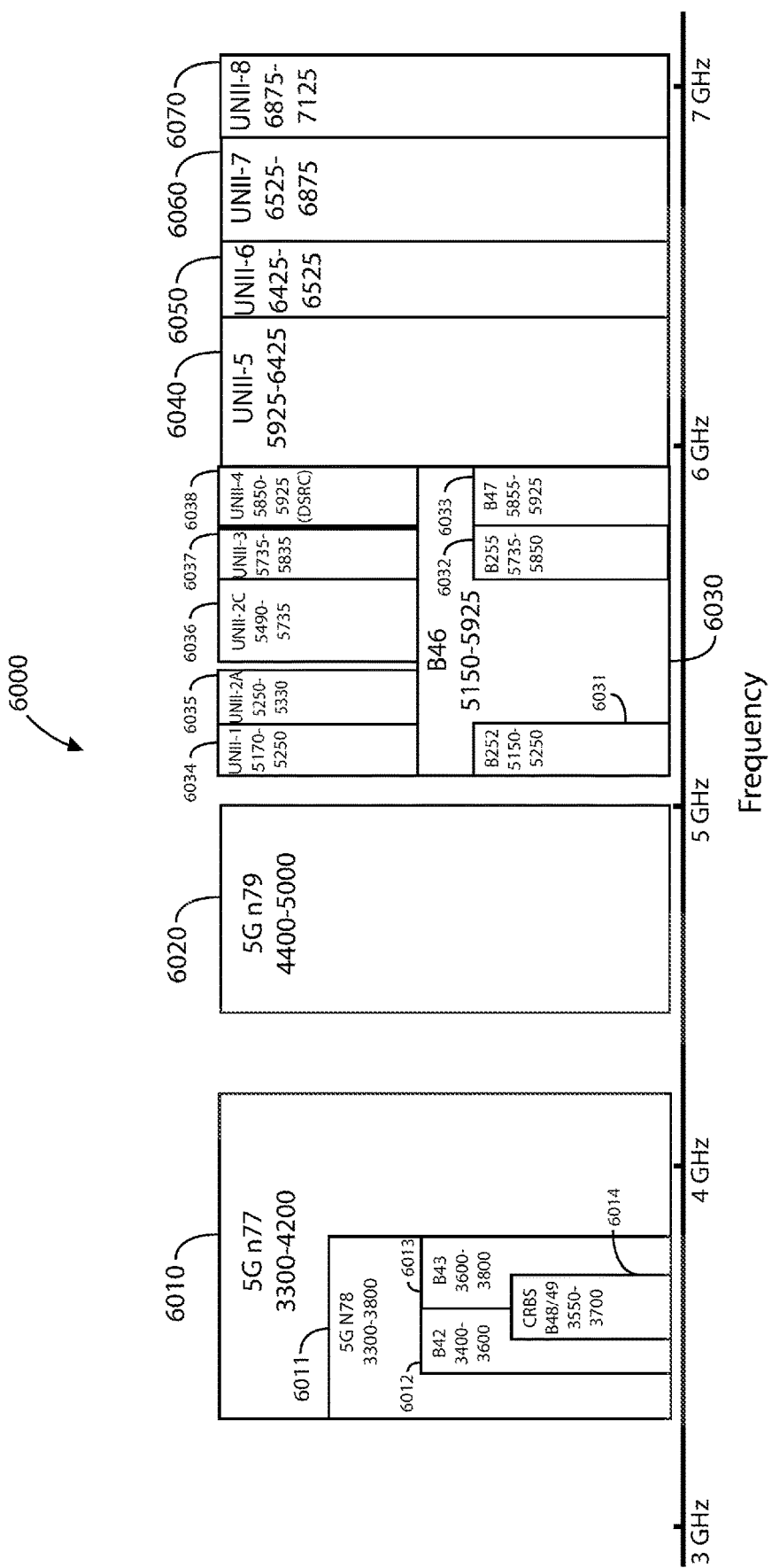
FIG. 60 is a simplified diagram illustrating filter passband requirements in a radio frequency spectrum according to an example of the present invention.

FIG. 60 is a simplified diagram illustrating filter pass-band requirements in a radio frequency spectrum according to an example of the present invention. As shown, the frequency spectrum 6000 shows a range from about 3.0 GHz to about 7.0 GHz. Here, a first application band (3.3 GHz-4.2 GHz) 6010 is configured for 5G n77 applications. This band includes a 5G n78 sub-band (3.3 GHz-3.8 GHz) 6011, which includes further LTE sub-bands B42 (3.4 GHz-3.6 GHz) 6012, B43 (3.6 GHz-3.8 GHz) 6013, and CRBS B48/49 (3.55 GHz-3.7 GHz) 6014. A second application band 6020 (4.4 GHz-5.0 GHz) is configured for 5G n79 applications. Those of ordinary skill in the art will recognize other variations, modifications, and alternatives.

A third application band 6030 can be configured for the 5.5 GHz Wi-Fi and 5G applications. In an example, this band can include a B252 sub-band (5.15 GHz-5.25 GHz) 6031, a B255 sub-band (5.735 GHz-5850 GHz) 6032, and a B47 sub-band (5.855 GHz-5.925 GHz) 6033. These sub-bands can be configured alongside a UNII-1 band (5.15 GHz-5.25 GHz) 6034, a UNII-2A band (5.25 GHz-5.33 GHz) 6035, a UNII-2C band (5.49 GHz-5.735 GHz) 6036, a UNII-3 band (5.725 GHz-5.835 GHz) 6037, and a UNII-4 band (5.85 GHz-5.925 GHz) 6038. These bands can coexist with additional bands configured following the third application band 6030 for other applications. In an example, there can be a UNII-5 band (5.925 GHz-6.425 GHz) 6040, a UNII-6 band (6.425 GHz-6.525 GHz) 6050, a UNII-7 band (6.525 GHz-6875 GHz) 6060, and a UNII-8 band (6.875 GHz-7.125 GHz) 6070. Of course, there can be other variations, modifications, and alternatives.

In an embodiment, the present filter utilizes high purity XBAW technology as described in the previous figures. This filter provides low insertion loss and meets the stringent rejection requirements enabling coexistence with U-NII-4, U-NII-5, U-NII-6, U-NII-7, and U-NII-8 bands, shown in FIG. 60. The high-power rating satisfies the demanding power requirements of the latest Wi-Fi standards.

FIG. 61 is a simplified diagram illustrating an overview of key markets that are applications for acoustic wave RF filters according to an example of the present invention. The application chart 6100 for 5.6/6.6 GHz BAW RF filters shows mobile devices, smartphones, automobiles, Wi-Fi tri-band routers, tri-band mobile devices, tri-band smartphones, integrated cable modems, Wi-Fi tri-band access points, LTE/LAA small cells, and the like. A schematic representation of the frequency spectrum used in a tri-band Wi-Fi system is provided in FIG. 62.

FIG. 62 is a simplified diagram illustrating application areas for 5.6 GHz and 6.6 GHz RF filters in Tri-Band Wi-Fi radios according to examples of the present invention. As shown, RF filters used by communication devices 6210 can be configured for specific applications at three separate bands of operation. In a specific example, application area 6220 operates at 2.4 GHz and includes computing and mobile devices, application area 6230 operates at 5.6 GHz and includes television and display devices, and application area 6240 operates at 6.6 GHz and includes video game console and handheld devices. Those of ordinary skill in the art will recognize other variations, modifications, and alternatives.

The present invention includes resonator and RF filter devices using both textured polycrystalline piezoelectric materials (deposited using PVD methods) and single crystal piezoelectric materials (grown using CVD technique upon a seed substrate). Various substrates can be used for fabricating the acoustic devices, such silicon substrates of various crystallographic orientations and the like. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Further the piezoelectric materials deposed on the substrate can include allows selected from at least one of the following: AlN, AlN, GaN, InN, InGaN, AlInN, AlInGaN, ScAlN, ScAlGaN, ScGaN, ScN, BAlN, BAlScN, and BN.

The resonator and filter devices may employ process technologies including but not limited to Solidly-Mounted Resonator (SMR), Film Bulk Acoustic Resonator (FBAR), or Single Crystal Bulk Acoustic Resonator (XBAW). Representative cross-sections are shown below in FIGS. 63A-63C. For clarification, the terms "top" and "bottom" used in the present specification are not generally terms in reference of a direction of gravity. Rather, the terms "top" and "bottom" are used in reference to each other in the context of the present device and related circuits. Those of ordinary skill in the art will recognize other variations, modifications, and alternatives.

In an example, the piezoelectric layer ranges between 0.1 and 2.0 um and is optimized to produced optimal combination of resistive and acoustic losses. The thickness of the top and bottom electrodes range between 250 Å and 2500 Å and the metal consists of a refractory metal with high acoustic velocity and low resistivity. The resonators are "passivated" with a dielectric (not shown in FIGS. 63A-63C) consisting of a nitride and or an oxide and whose range is between 100 Å and 2000 Å. The dielectric layer is used to adjust resonator resonance frequency. Extra care is taken to reduce the metal resistivity between adjacent resonators on a metal layer called the interconnect metal. The thickness of the interconnect metal ranges between 500 Å and 5 um. The resonators contain at least one air cavity interface in the case of SMRs and two air cavity interfaces in the case of FBARs and XBAWs. The shape of the resonators selected come from asymmetrical shapes including ellipses, rectangles, and polygons. Further, the resonators contain reflecting features near the resonator edge on one or both sides of the resonator.

Figure 63A:
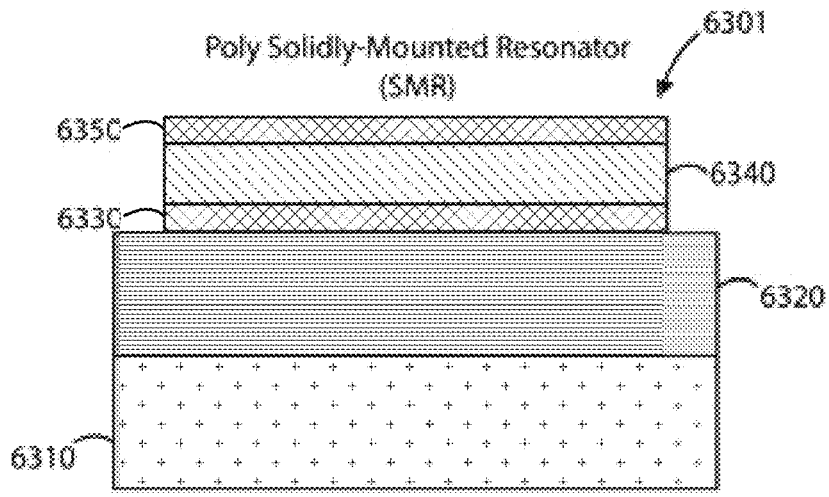
FIGS. 63A-63C are simplified diagrams illustrating cross-sectional views of resonator devices according to various examples of the present invention.
Figure 63B:
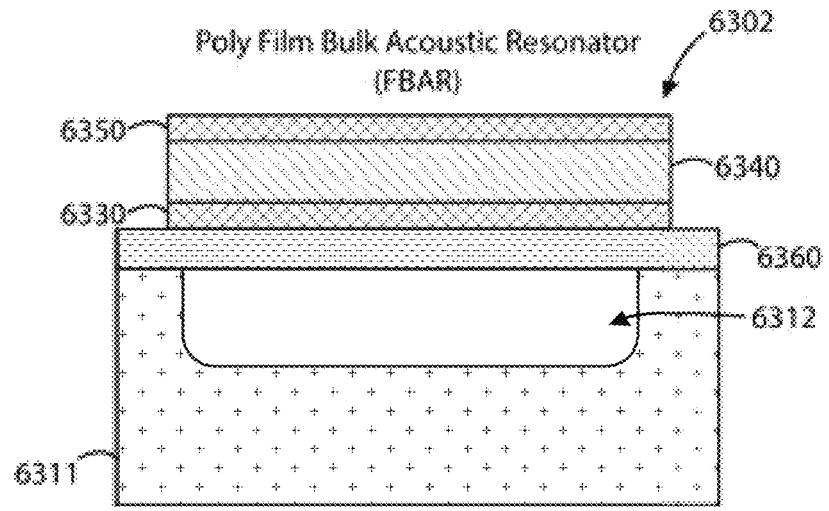
Figure 63C:
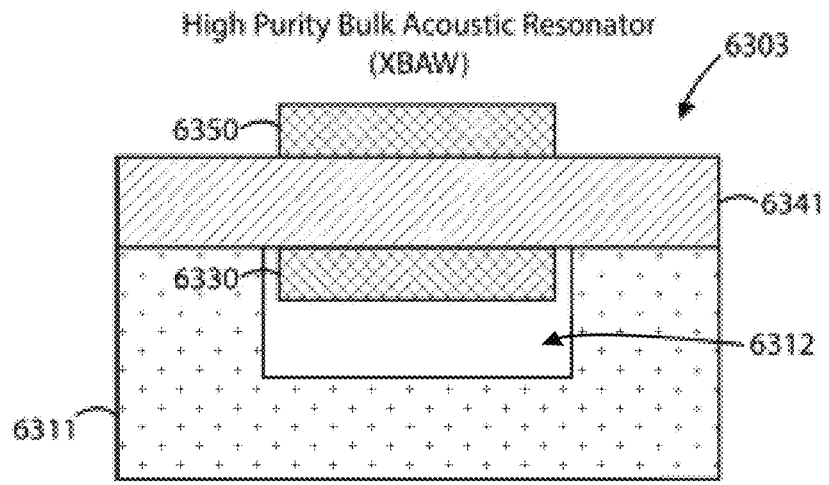

FIGS. 63A-63C are simplified diagrams illustrating cross-sectional views of resonator devices according to various examples of the present invention. More particularly, device 6301 of FIG. 63A shows a BAW resonator device including an SMR, FIG. 63B shows a BAW resonator device including an FBAR, and FIG. 63C shows a BAW resonator device with a high purity XBAW. As shown in SMR device 6301, a reflector device 6320 is configured overlying a substrate member 6310. The reflector device 6320 can be a Bragg reflector or the like. A bottom electrode 6330 is configured overlying the reflector device 6320. A polycrystalline piezoelectric layer 6340 is configured overlying the bottom electrode 6330. Further, a top electrode 6350 is configured overlying the polycrystalline layer 6340. As shown in the FBAR device 6302, the layered structure including the bottom electrode 6330, the polycrystalline layer 6340, and the top electrode 6350 remains the same. The substrate member 6311 includes an air cavity 6312, and a dielectric layer is formed overlying the substrate member 6311 and covering the air cavity 6312. As shown in XBAW device 6303, the substrate member 6311 also contains an air cavity 6312, but the bottom electrode 6330 is formed within a region of the air cavity 6312. A single crystal piezoelectric layer is formed overlying the substrate member 6311, the air cavity 6312, and the bottom electrode 6341. Further, a top electrode 6350 is formed overlying a portion of the single crystal layer 6341. These resonators can be scaled and configured into circuit configurations shown in FIGS. 64A-64C.

Figure 64A:
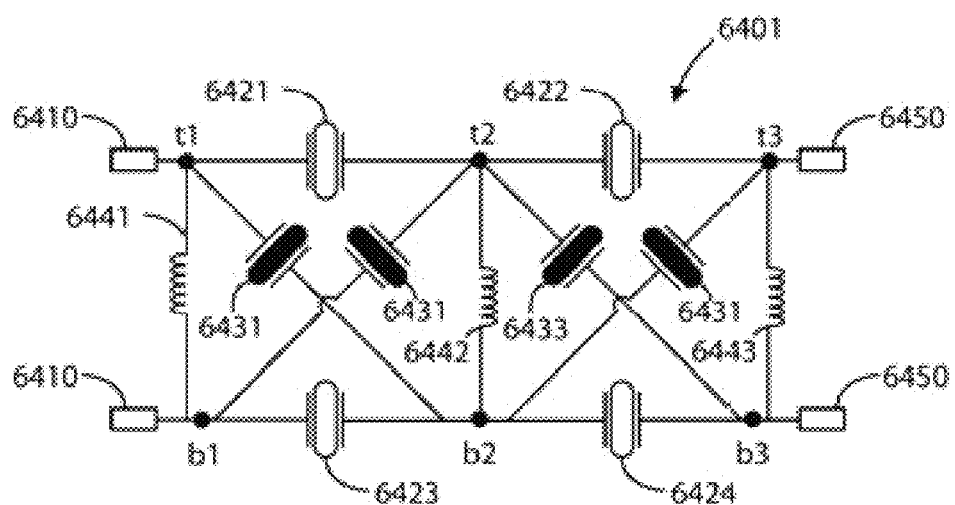
FIGS. 64A-64C are simplified circuit diagrams illustrating representative lattice and ladder configurations for acoustic filter designs according to examples of the present invention.
Figure 64B:
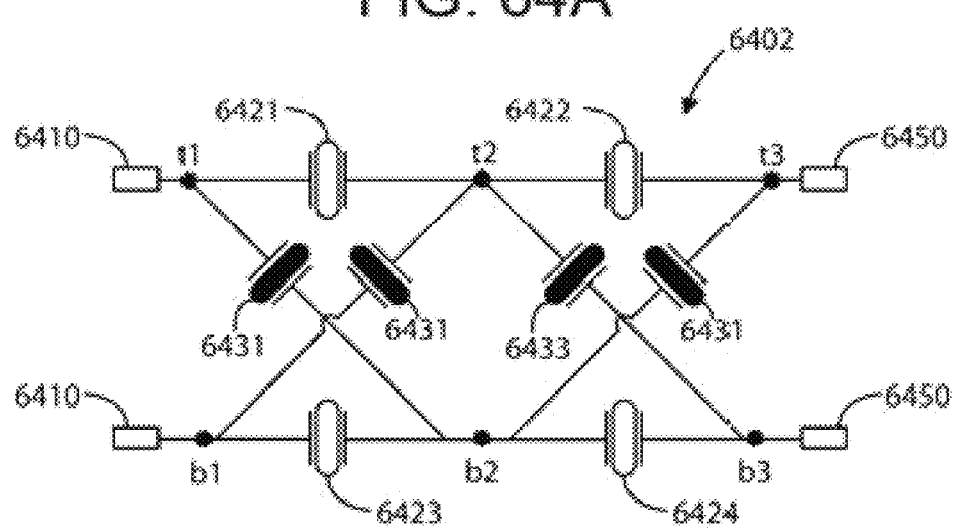
Figure 64C:
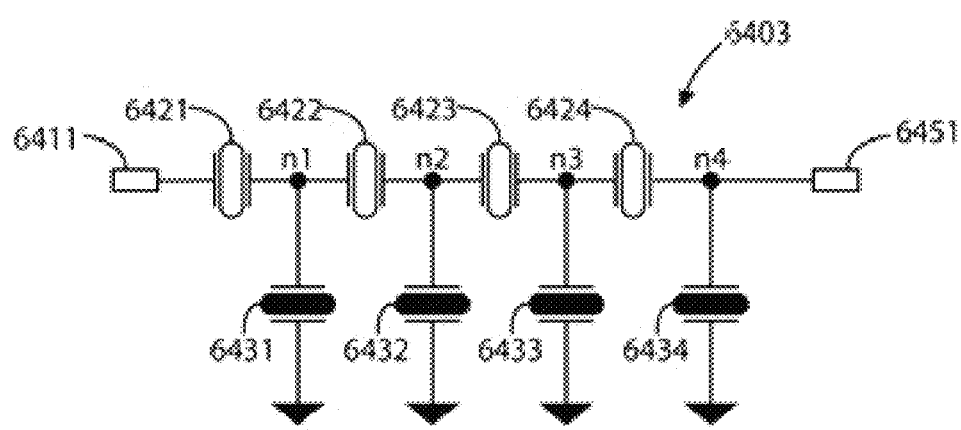

The RF filter circuit can comprise various circuit topologies, including modified lattice ("I") 6401, lattice ("II") 6402, and ladder ("III") 6403 circuit configurations, as shown in FIGS. 64A, 64B, and 64C, respectively. These figures are representative lattice and ladder diagrams for acoustic filter designs including resonators and other passive components. The lattice and modified lattice configurations include differential input ports 6410 and differential output ports 6450, while the ladder configuration includes a single-ended input port 6411 and a single-ended output port 6450. In the lattice configurations, nodes are denoted by top nodes (t1-t3) and bottom nodes (b1-b3), while in the ladder configuration the nodes are denoted as one set of nodes (n1-n4). The series resonator elements (in cases I, II, and III) are shown with white center elements 6421-6424 and the shunt resonator elements have darkened center circuit elements 6431-6434. The series elements resonance frequency is higher than the shunt elements resonance frequency in order to form the filter skirt at the pass-band frequency. The inductors 6441-6443 shown in the modified lattice circuit diagram (FIG. 64A) and any other matching elements can be included either on-chip (in proximity to the resonator elements) or off-chip (nearby to the resonator chip) and can be used to adjust frequency pass-band and/or matching of impedance (to achieve the return loss specification) for the filter circuit. The filter circuit contains resonators with at least two resonance frequencies. The center of the pass-band frequency can be adjusted by a trimming step (using an ion milling technique or other like technique) and the shape the filter skirt can be adjusted by trimming individual resonator elements (to vary the resonance frequency of one or more elements) in the circuit.

In an example, the present invention provides an RF filter circuit device in a ladder configuration. The device can include an input port, a first node coupled to the input port, a first resonator coupled between the first node and the input port. A second node is coupled to the first node and a second resonator is coupled between the first node and the second node. A third node is coupled to the second node and a third resonator is coupled between the second node and the third node. A fourth node is coupled to the third node and a fourth resonator is coupled between the third node and the output port. Further, an output port is coupled to the fourth node. Those of ordinary skill in the art will recognize other variations, modifications, and alternatives.

Each of the first, second, third, and fourth resonators can include a capacitor device. Each such capacitor device can include a substrate member, which has a cavity region and an upper surface region contiguous with an opening in the first cavity region. Each capacitor device can include a bottom electrode within a portion of the cavity region and a piezoelectric material overlying the upper surface region and the bottom electrode. Also, each capacitor device can include a top electrode overlying the single crystal material and the bottom electrode, as well as an insulating material overlying the top electrode and configured with a thickness to tune the resonator.

The device also includes a serial configuration includes the input port, the first node, the first resonator, the second node, the second resonator, the third node, the third resonator, the fourth resonator, the fourth node, and the output port. A separate shunt configuration resonator is coupled to each of the first, second, third, fourth nodes. A parallel configuration includes the first, second, third, and fourth shunt configuration resonators. Further, a circuit response can be configured between the input port and the output port and configured from the serial configuration and the parallel configuration to achieve a transmission loss from a pass-band having a characteristic frequency centered around 5.532 GHz and having a bandwidth from 5.170 GHz to 5.895 GHz such that the characteristic frequency centered around 5.532 GHz is tuned from a lower frequency ranging from about 4.3 GHz to 5.4 GHz. Or, a circuit response can be configured between the input port and the output port and configured from the serial configuration and the parallel configuration to achieve a transmission loss from a pass-band having a characteristic frequency centered around 6.615 GHz and having a bandwidth from 6.105 GHz to 7.125 GHz such that the characteristic frequency centered around 6.615 GHz is tuned from a lower frequency ranging from about 5.6 GHz to 6.5 GHz.

In a specific example, the first, second, third, and fourth piezoelectric materials are each essentially a single crystal aluminum nitride bearing material or aluminum scandium nitride bearing material, a single crystal gallium nitride bearing material or gallium aluminum bearing material, or the like. In another specific embodiment, these piezoelectric materials each comprise a polycrystalline aluminum nitride bearing material or aluminum scandium nitride bearing material, or a polycrystalline gallium nitride bearing material or gallium aluminum bearing material, or the like.

In a specific example, the serial configuration forms a resonance profile and an anti-resonance profile. The parallel configuration also forms a resonance profile and an anti-resonance profile. These profiles are such that the resonance profile from the serial configuration is off-set with the anti-resonance profile of the parallel configuration to form the pass-band.

In a specific example, the pass-band is characterized by a band edge on each side of the pass-band and having an amplitude difference ranging from 10 dB to 60 dB. The pass-band has a pair of band edges; each of which has a transition region from the pass-band to a stop band such that the transition region is no greater than 250 MHz. In another example, pass-band can include a pair of band edges and each of these band edges can have a transition region from the pass-band to a stop band such that the transition region ranges from 5 MHz to 250 MHz.

In a specific example, each of the first, second, third, and fourth insulating materials comprises a silicon nitride bearing material or an oxide bearing material configured with a silicon nitride material an oxide bearing material.

In a specific example, the present device can further include several features. For the 5.6 GHz filter device, the device can further include a rejection band rejecting signals below 5.170 GHz and above 5.895 GHz. Also, the 5.6 GHz device can include an attenuation of up to 10 dB for a frequency range of 1000 MHz to 4000 MHz, an attenuation of up to 20 dB for a frequency range of 4000 MHz to 5000 MHz, an attenuation of up to 52 dB for a frequency range of 5935 MHz to 7125 MHz, or an attenuation of up to 15 dB for a frequency range of 7500 MHz to 9000 MHz. For the 6.6 GHz filter device, the device can further include a rejection band rejecting signals below 6.105 GHz and above 7.125 GHz. Also, the 6.6 GHz device can include an attenuation of up to 10 dB for a frequency range of 1000 MHz to 4000 MHz, an attenuation of up to 20 dB for a frequency range of 4000 MHz to 5000 MHz, an attenuation of up to 52 dB for a frequency range of 5170 MHz to 5835 MHz, or an attenuation of up to 15 dB for a frequency range of 5900 MHz to 7000 MHz.

For the both the 5.6 GHz and 6.6 GHz filter devices, each can include an insertion loss of 2.4 dB and an amplitude variation characterizing the pass-band of 0.8 dB. Both devices can each further include a return loss characterizing the pass-band of up to 14 dB and both devices can be operable from −40 Degrees Celsius to 85 Degrees Celsius. Each of these devices can further include a maximum power within the pass-band of 30 dBm or 1 Watt. Further, the pass-band can be configured for a U-NII-1+U-NII-2A+U-NII-2C+U-NII-3 bands and for an IEEE 802.11a channel plan.

In a specific example, the present device can be configured as a bulk acoustic wave (BAW) filter device. Each of the first, second, third, and fourth resonators can be a BAW resonator. Similarly, each of the first, second, third, and fourth shunt resonators can be BAW resonators. The present device can further include one or more additional resonator devices numbered from N to M, where N is four and M is twenty. Similarly, the present device can further include one or more additional shunt resonator devices numbered from N to M, where N is four and M is twenty.

In an example, the present invention provides an RF circuit device in a lattice configuration. The device can include a differential input port, a top serial configuration, a bottom serial configuration, a first lattice configuration, a second lattice configuration, and a differential output port. The top serial configuration can include a first top node, a second top node, and a third top node. A first top resonator can be coupled between the first top node and the second top node, while a second top resonator can be coupled between the second top node and the third top node. Similarly, the bottom serial configuration can include a first bottom node, a second bottom node, and a third bottom node. A first bottom resonator can be coupled between the first bottom node and the second bottom node, while a second bottom resonator can be coupled between the second bottom node and the third bottom node.

In an example, the first lattice configuration includes a first shunt resonator cross-coupled with a second shunt resonator and coupled between the first top resonator of the top serial configuration and the first bottom resonator of the bottom serial configuration. Similarly, the second lattice configuration can include a first shunt resonator cross-coupled with a second shunt resonator and coupled between the second top resonator of the top serial configuration and the second bottom resonator of the bottom serial configuration. The top serial configuration and the bottom serial configuration can each be coupled to both the differential input port and the differential output port.

In a specific example, the device further includes a first balun coupled to the differential input port and a second balun coupled to the differential output port. The device can further include an inductor device coupled between the differential input and output ports. In a specific example, the device can further include a first inductor device coupled between the first top node of the top serial configuration and the first bottom node of the bottom serial configuration; a second inductor device coupled between the second top node of the top serial configuration and the second bottom node of the bottom serial configuration; and a third inductor device coupled between the third top node of the top serial configuration and the third bottom node of the bottom serial configuration.

Figure 65A:
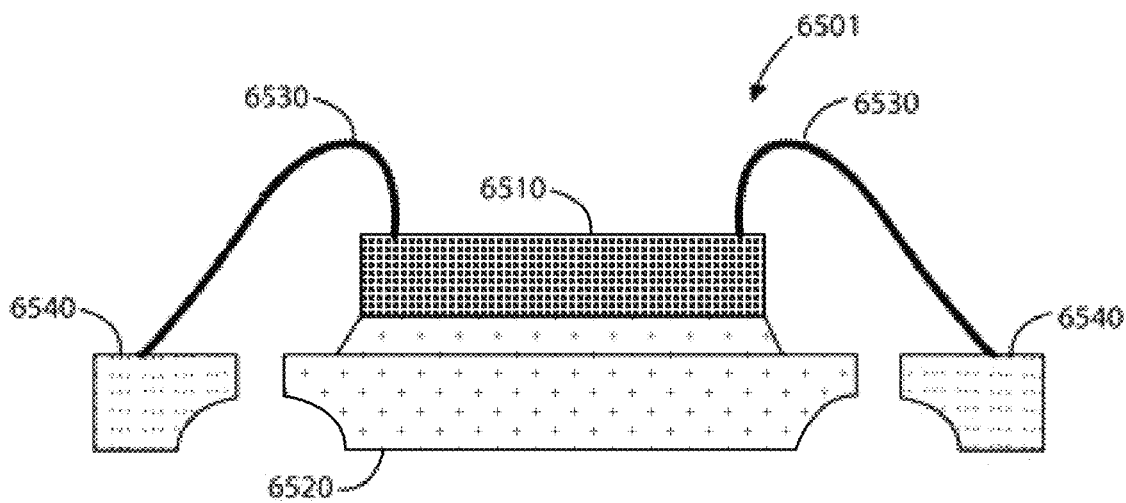
FIGS. 65A-65B are simplified diagrams illustrating packing approaches according to various examples of the present invention.
Figure 65B:
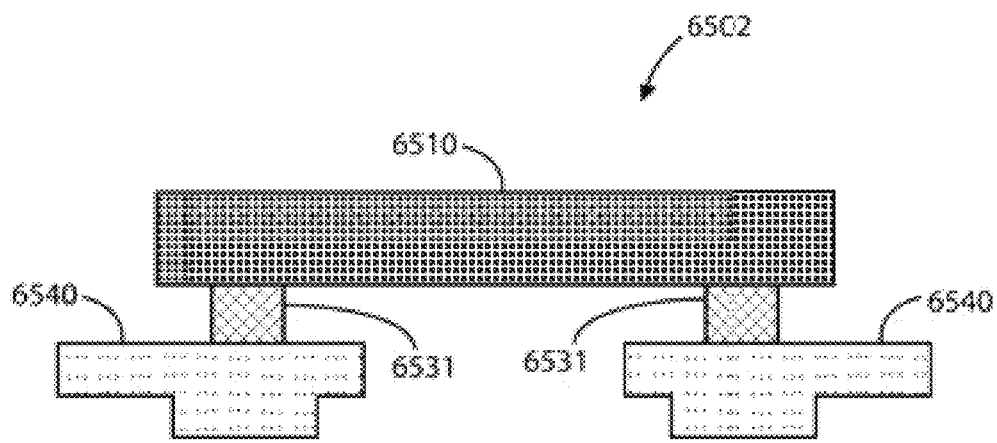
Figure 66:
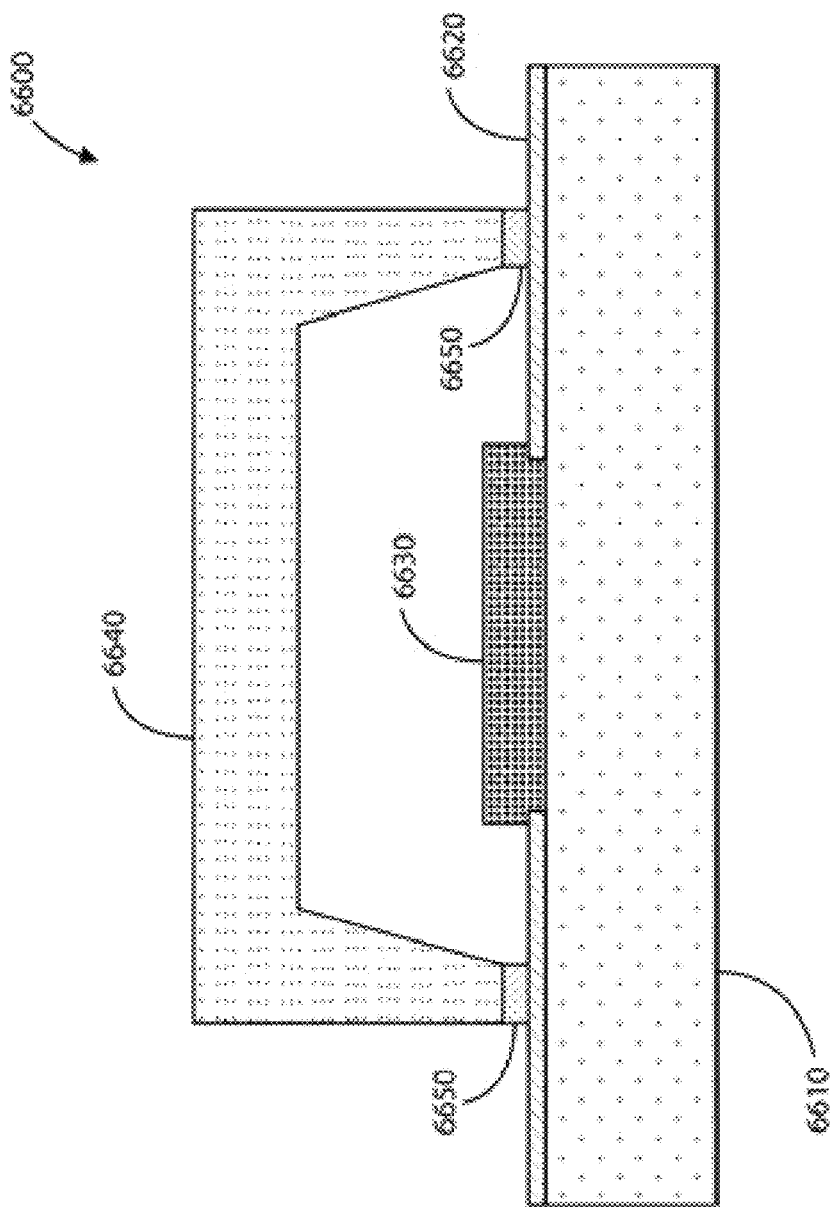
FIG. 66 is a simplified diagram illustrating a packing approach according to an example of the present invention.

The packaging approach includes but is not limited to wafer level packaging (WLP), WLP-plus-cap wafer approach, flip-chip, chip and bond wire, as shown in FIGS. 65 and 66. One or more RF filter chips and one or more filter bands can be packaged within the same housing configuration. Each RF filter band within the package can include one or more resonator filter chips and passive elements (capacitors, inductors) can be used to tailor the bandwidth and frequency spectrum characteristic. For a tri-band Wi-Fi system application, a package configuration including three RF filter bands, including the 2.4 GHz, 5.6 GHz, and 6.6 GHz band-pass solutions is capable using the BAW RF filter technology. The 2.4 GHz filter solution can be either surface acoustic wave (SAW) or BAW, whereas the 5.6 GHz and 6.6 GHz bands are likely BAW given the high-frequency capability of BAW.

FIG. 65A is a simplified diagram illustrating a packing approach according to an example of the present invention. As shown, device 6501 is packaged using a conventional die bond of an RF filter die 6510 to the base 6520 of a package and metal bond wires 6530 to the RF filter chip from the circuit interface 6540.

FIG. 65B is as simplified diagram illustrating a packing approach according to an example of the present invention. As shown, device 6602 is packaged using a flip-mount wafer level package (WLP) showing the RF filter silicon die 6510 mounted to the circuit interface 6540 using copper pillars 6531 or other high-conductivity interconnects.

FIG. 66 is a simplified diagram illustrating a packing approach according to an example of the present invention. Device 6600 shows an alternate version of a WLP utilizing a BAW RF filter circuit MEMS device 6630 and a substrate 6610 to a cap wafer 6640. In an example, the cap wafer 6640 may include thru-silicon-vias (TSVs) to electrically connect the RF filter MEMS device 6630 to the topside of the cap wafer (not shown in the figure). The cap wafer 6640 can be coupled to a dielectric layer 6620 overlying the substrate 6610 and sealed by sealing material 6650.

In an example, the present filter passes frequencies in the range of 5.170 to 5.835 GHz and rejects frequencies outside of this pass-band. Additional features of the 5.6 GHz acoustic wave filter circuit are provided below. The circuit symbol which is used to reference the RF filter building block is provided in FIG. 67. The electrical performance specifications of the 5.6/6.6 GHz filters are provided in FIGS. 68A and 68B.

In various examples, the present filter can have certain features. The die configuration can be less than 2 mm×2 mm×0.5 mm; in a specific example, the die configuration is typically less than 1 mm×1 mm×0.2 mm. The packaged device has an ultra-small form factor, such as a 2 mm×2.5 mm×0.9 mm using a conventional chip and bond wire approach, shown in FIG. 65. WLP package approaches can provide smaller form factors. In a specific example, the device is configured with a single-ended 50-Ohm antenna, and transmitter/receiver (Tx/Rx) ports. The high rejection of the device enables coexistence with adjacent Wi-Fi UNIT bands. The device is also be characterized by a high power rating (maximum +30 dBm), a low insertion loss pass-band filter with less than 2.5 dB transmission loss, and performance over a temperature range from −40 degrees Celsius to +85 degrees Celsius. Further, in a specific example, the device is RoHS (Restriction of Hazardous Substances) compliant and uses Pb-free (lead-free) packaging.

Figure 67:
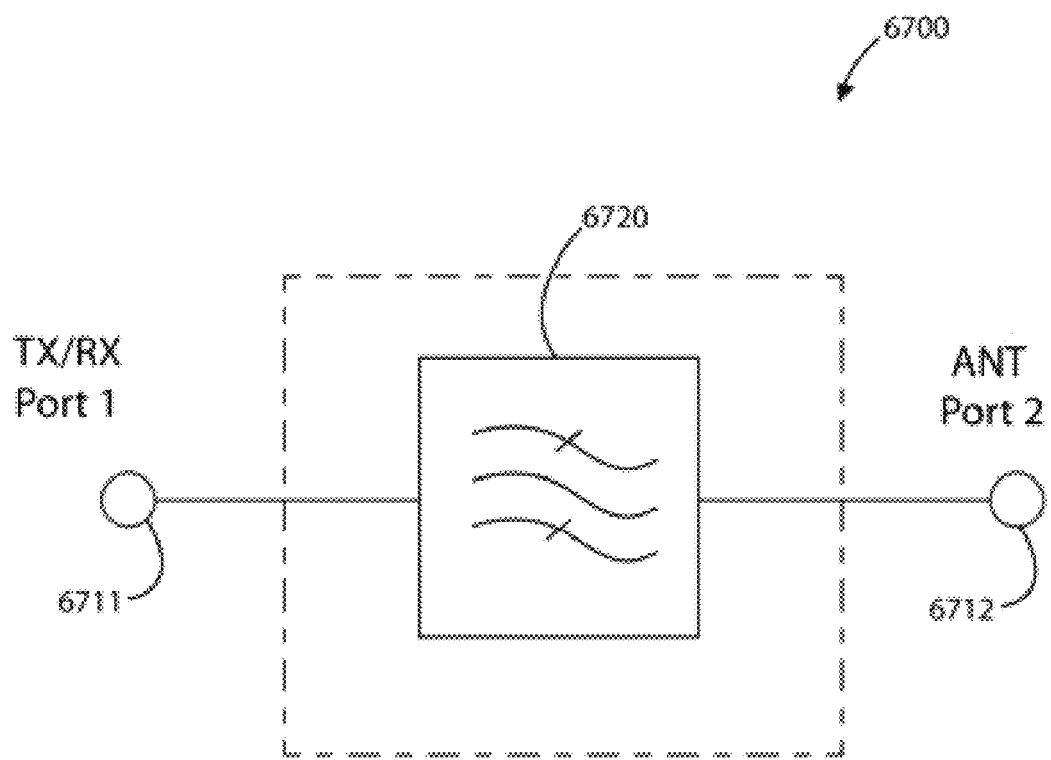
FIG. 67 is a simplified circuit diagram illustrating a 2-port BAW RF filter circuit according to an example of the present invention.

FIG. 67 is a simplified circuit diagram illustrating a 2-port BAW RF filter circuit according to an example of the present invention. As shown, circuit 6700 includes a first port ("Port 1") 6711, a second port ("Port 2") 6712, and a filter 6720. The first port represents a connection from a transmitter (TX) or received (RX) to the filter 6720 and the second port represents a filter connection from the filter 6720 to an antenna (ANT).

FIGS. 68A and 68B are simplified tables of 5.6 GHz and 6.6 GHz filter parameters according to examples of the present invention. As shown, table 6801 includes electrical specifications for a 5.6 GHz RF resonator filter circuit and table 6802 includes electrical specifications for a 6.6 GHz RF resonator filter circuit. The circuit parameters are provided along with the specification units, minimum, along with typical and maximum specification values.

In an example, the present invention provides a front end module (FEM) for a 5.6 GHz or 6.6 GHz Wi-Fi acoustic wave resonator RF filter circuit. The device can include a power amplifier (PA), a 5.6/6.6 GHz resonator, and a diversity switch. In a specific example, the device can further include a low noise amplifier (LNA). The PA is electrically coupled to an input node and can be configured to a DC power detector or an RF power detector. The resonator can be configured between the PA and the diversity switch, or between the diversity switch and an antenna. The LNA may be configured to the diversity switch or be electrically isolated from the switch. Another 5.6/6.6 GHZ resonator may be configured between the diversity switch and the LNA. In a specific example, this device integrates a 5.6/6.6 GHz PA, a 5.6/6.6 GHZ bulk acoustic wave (BAW) RF filter, a single pole two throw (SP2T) switch, and an optional bypassable low noise amplifier (LNA) into a single device. FIGS. 69-73 show five examples of FEMs according to various embodiments of the present invention. In each example, the LNA may be omitted to produce a transmit module only. In the following figures, the reference number scheme for the elements of these FEMs remains the same across FIGS. 69-73 except for the first two digits that correspond to the figure number.

Figure 69:
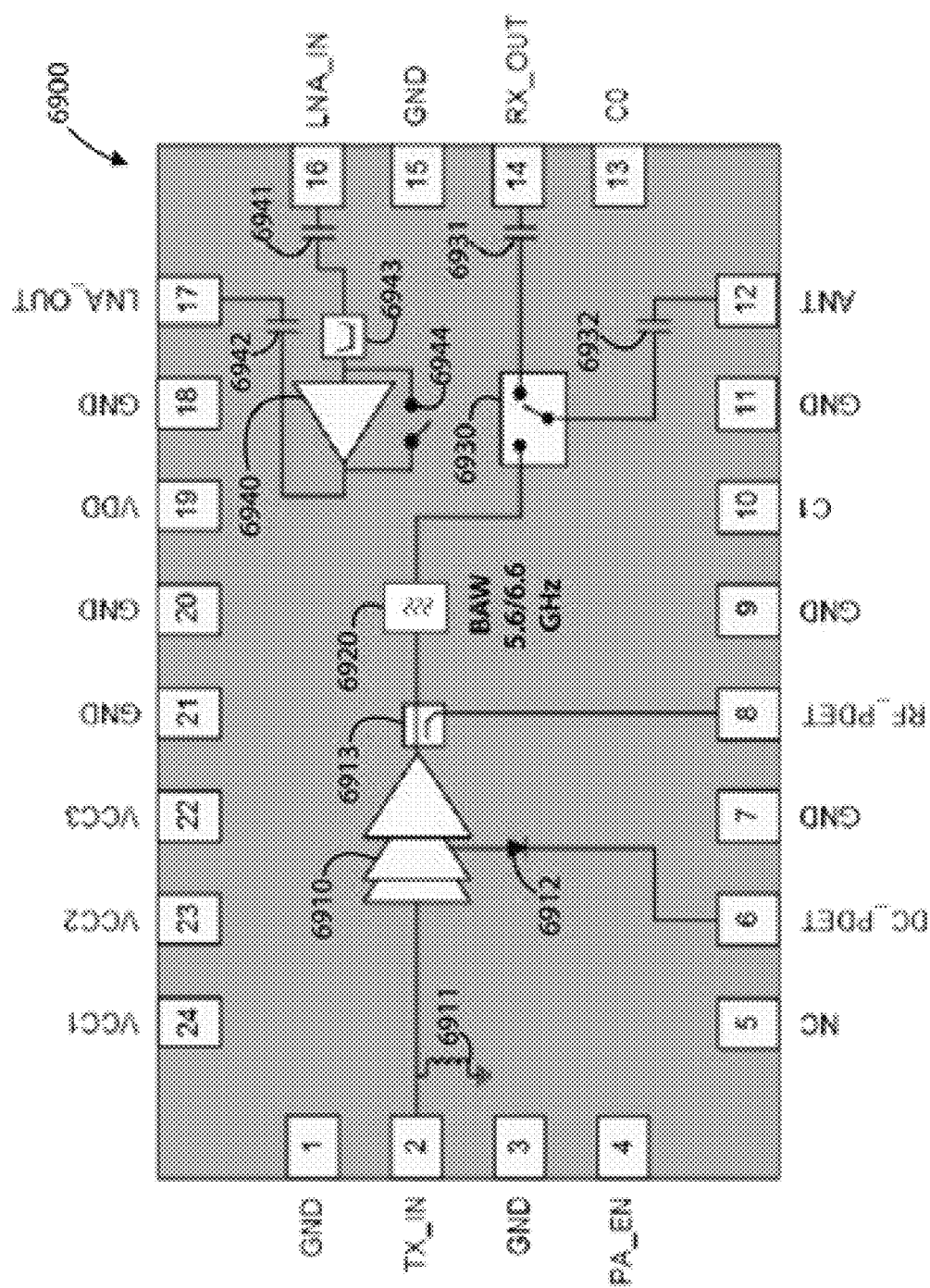
FIGS. 69-73 is a simplified circuit block diagram illustrating a front end module according to various examples of the present invention.

FIG. 69 is a simplified circuit block diagram illustrating a front end module according to an example of the present invention. As shown, device 6900 includes a PA 6910, a 5.6/6.6 GHz resonator 6920, a diversity switch 6930, and an LNA 6940. Here, the input of the PA 6910 is electrically coupled to an input node (shown as TX_IN [2]). In a specific example, the PA can be a 5.6/6.6 GHz PA. An inductor 6911 can electrically coupled to the input node as well. The 5.6/6.6 GHz resonator 6920 is electrically coupled to the output of the PA 6910. In specific example, the resonator 6920 can be a 5.6/6.6 BAW resonator.

The diversity switch 6930 shown here is a single pole two throw (SP2T) switch. One of the throws is electrically coupled to the 5.6/6.6 GHz resonator 6920 while the other throw is electrically coupled to an output node (shown as RX_OUT [14]). In a specific example, a coupling capacitor 6931 can be configured between the switch 6930 and the output node. The pole, which can switch between the two throws, is electrically coupled to an antenna (shown as ANT [12]). In a specific example, a coupling capacitor 6932 can be configured between the switch 6930 and the antenna.

In this case, the LNA 6940 is configured separately from the previous circuit elements and is electrically coupled to an LNA input (shown as LNA_IN [16]) and an LNA output (shown as LNA_OUT [17]). As previously discussed, the LNA 6940 may be omitted, which would result in a device that is a transmit module only. In a specific embodiment, coupling capacitors 6941 and 6942 can be configured between the LNA 6940 and the LNA input and LNA output, respectively. A signal filter 6943 can be configured between the LNA and coupling capacity 6941. In this case, the signal filter 6943 is a bandstop filter. Further, the LNA 6940 can be configured in a switched feedback loop 6944. In a specific example, the LNA 6940 can be a bypassable LNA.

In an example, the device 6900 can be configured with a power detector, which can be a DC power detector or an RF power detector. A DC power detector has a voltage output and would be electrically coupled to the PA at a DC power detect node (shown as DC_PDET [6]). In a specific example, a diode is configured between the PA and the DC power detector. An RF power detector has an RF output from a directional coupler 6913, which is configured at the output of the PA.

In an example, the present device design provides a compact form factor and integrated matching minimizes layout area in applications. The PA can be optimized for a 5V supply voltage that conserves power consumption while maintaining a high linear output power and throughput. Also, an integrated BAW filter reduces the overall size for Wi-Fi radio applications and allows coexistence between the 5.6 GHz (or 6.6 GHz) radio band and adjacent 2.4 GHz and 6.5 GHz (or 5.6 GHz) bands in a tri-band router configuration. Those of ordinary skill in the art will recognize other variations, modifications, and alternatives to the above.

Figure 70:
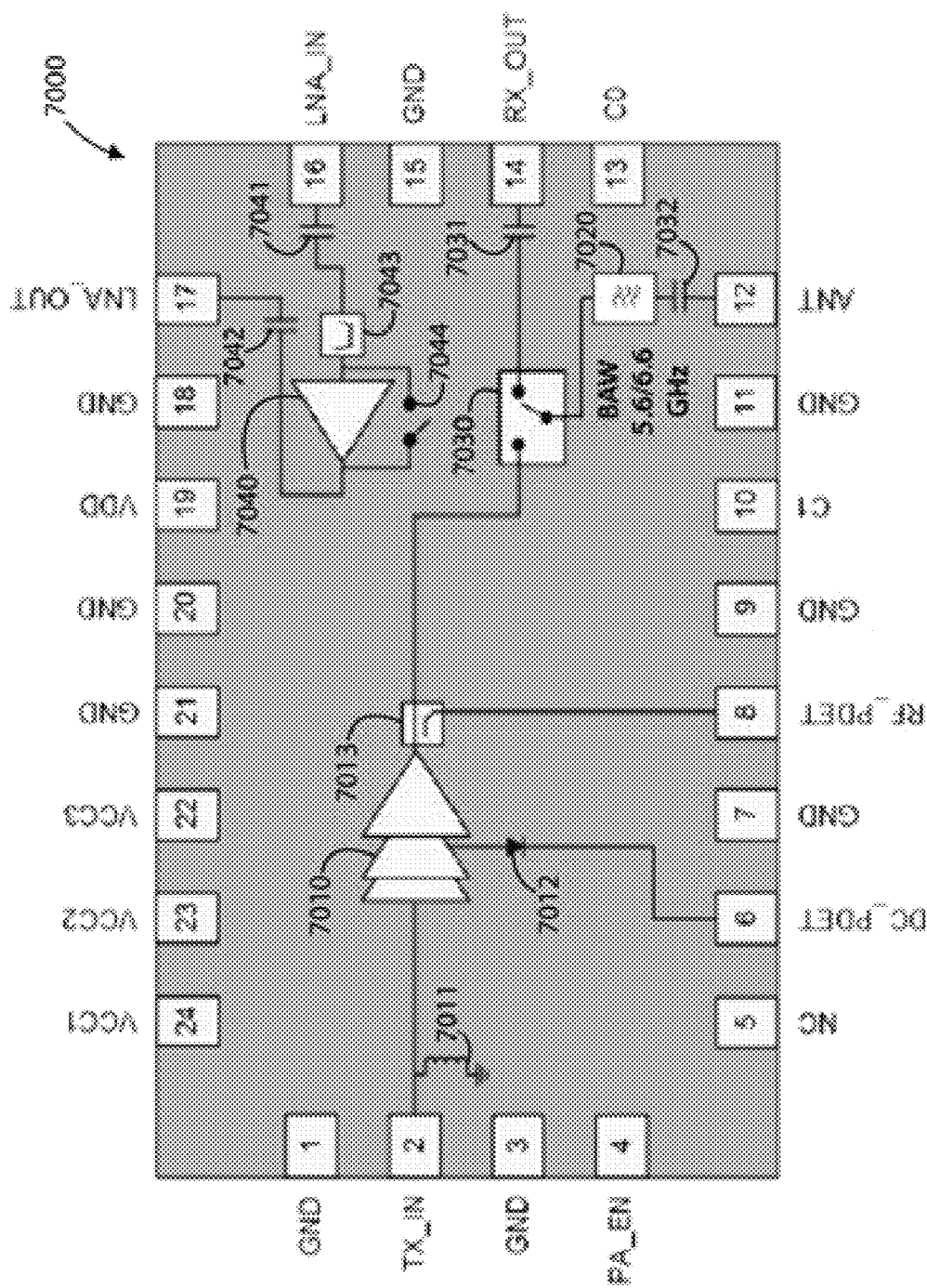

FIG. 70 is a simplified circuit block diagram illustrating a front end module according to an example of the present invention. The reference number scheme is the same as in FIG. 69 except that the first two digits reference "70". As shown, device 7000 is similar to device 6900 of FIG. 69 except for the configuration of the 5.6/6.6 GHz resonator 7020. Here, the resonator 7020 is configured between the pole of the diversity switch 7030 and the antenna, as well as the coupling capacitor 7032. Of course, there can be other variations, modifications, and alternatives.

Figure 71:
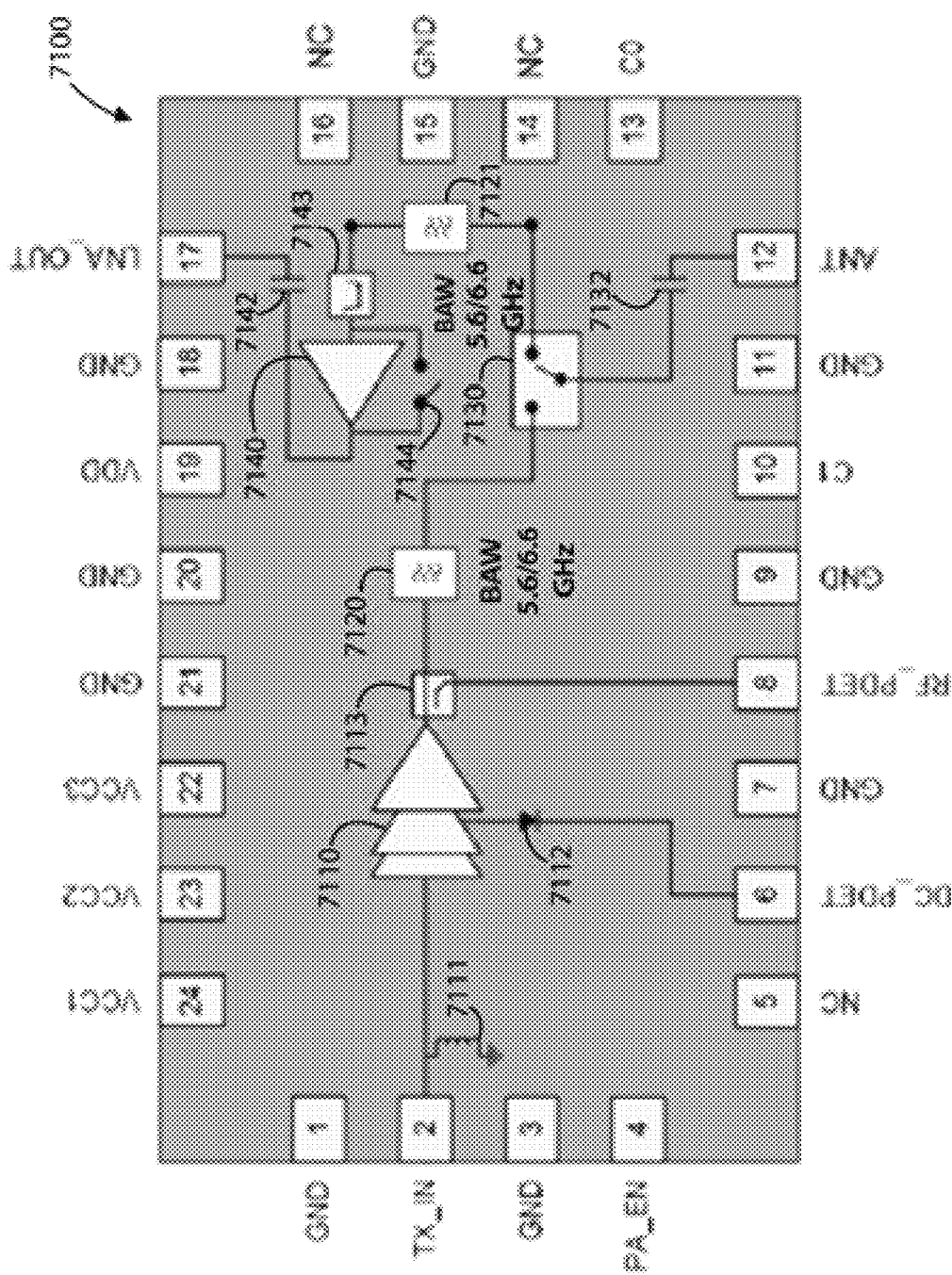

FIG. 71 is a simplified circuit block diagram illustrating a front end module according to an example of the present invention. The reference number scheme is the same as in FIG. 69 except that the first two digits reference "71". As shown, device 7100 is similar to device 6900 except that there is an additional 5.6/6.6 GHz resonator 7121 configured between one of the throws of the diversity switch 7130 and the input to the LNA 7140, as well as the signal filter 7143. In this example, the switch 7130 is not coupled to the output node, and the LNA is not coupled to the LNA input node. Similar to the first resonator 7120, the second resonator 7121 can also be a 5.6/6.6 GHz BAW resonator. Of course, there can be other variations, modifications, and alternatives.

Figure 72:
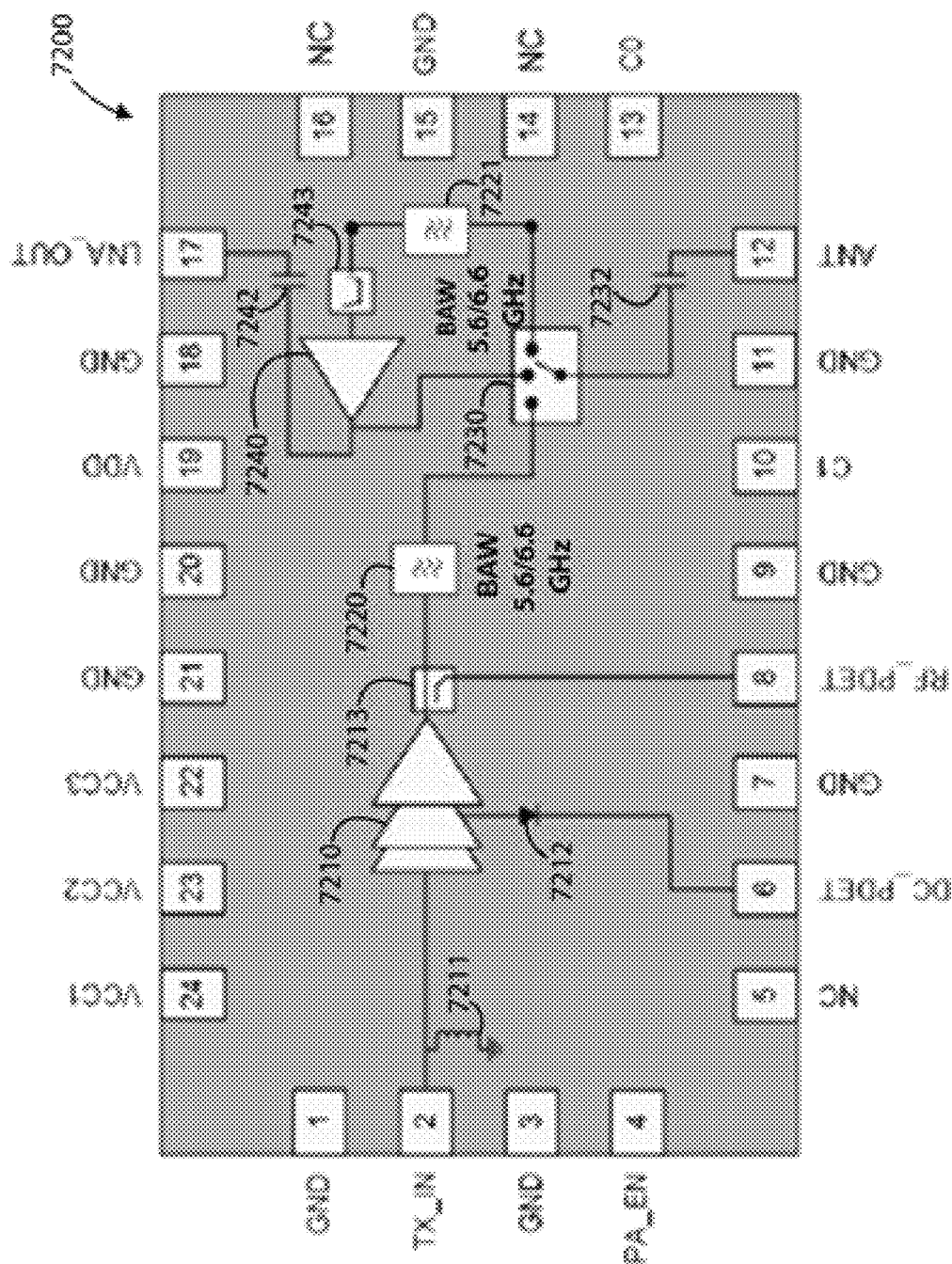

FIG. 72 is a simplified circuit block diagram illustrating a front end module according to an example of the present invention. The reference number scheme is the same as in FIG. 69 except that the first two digits reference "72". As shown, device 7200 is similar to device 7100 of FIG. 71 except that the diversity switch 7230 is a single pole three throw (SP3T) switch and the LNA 7240 no longer includes the switched feedback loop. Rather, the output of the LNA 7240 is electrically coupled to the third throw of the switch 7240. Of course, there can be other variations, modifications, and alternatives.

Figure 73:
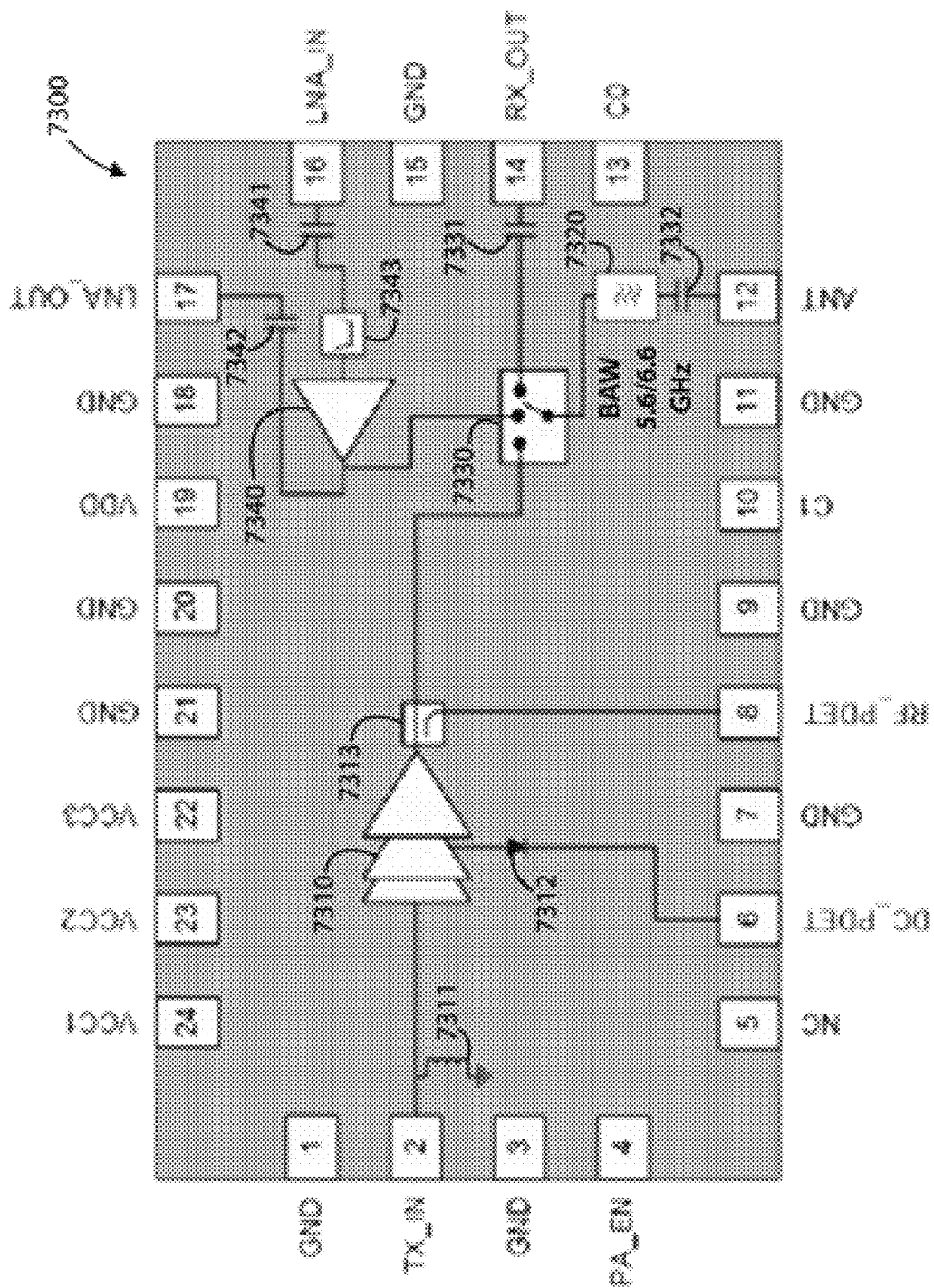

FIG. 73 is a simplified circuit block diagram illustrating a front end module according to an example of the present invention. The reference number scheme is the same as in FIG. 69 except that the first two digits reference "73". As shown, device 7300 is similar to device 7000 of FIG. 70 by having the 5.6/6.6 GHz resonator 7320 configured between the switch 7330 and the antenna, but also similar to device 7200 of FIG. 72 by having the output of the LNA 7340 electrically coupled to a third throw of switch 7330, which is a SP3T switch. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A 5.6 GHz front end module (FEM) device, the device comprising:
   a power amplifier (PA) electrically coupled to an input node;
   a 5.6 GHz bulk acoustic wave (BAW) resonator electrically coupled to the PA, the 5.6 GHz BAW resonator having a passband frequency of 5.170 GHz to 5.895 GHz;
   wherein the 5.6 GHz BAW resonator comprises
   a substrate;
   a support layer overlying the substrate, the support layer having an air cavity;
   a first electrode overlying the air cavity and a portion of the support layer;
   a first passivation layer overlying the support layer and being physically coupled to the first electrode;
   a piezoelectric film overlying the support layer, the first electrode, and the air cavity, the piezoelectric film having an electrode contact via;
   a second electrode formed overlying the piezoelectric film; and
   a top metal formed overlying the piezoelectric film, the top metal being physically coupled to the first electrode through the electrode contact via; and
   a diversity switch electrically coupled the 5.6 GHz BAW resonator, an output node, and an antenna.

2. The device of claim 1 wherein the PA comprises a 5.6 GHz power amplifier;
   wherein the 5.6 GHz BAW resonator comprises a 5.6 GHz BAW RF filter; and
   wherein the diversity switch comprises a single pole two throw (SP2T) switch.

3. The device of claim 1 further comprising a bypassable low noise amplifier (LNA) electrically coupled to an LNA input node and an LNA output node.

4. The device of claim 1 further comprising a DC power detector having a voltage output, the DC power detector being electrically coupled to the PA; and
   an RF power detector having an RF output from a directional coupler, the RF power detector being electrically coupled to the PA.

5. The device of claim 1 wherein the 5.6 GHz BAW resonator further comprises a bonding support layer overlying the substrate, and wherein the support layer is configured overlying the bonding support layer; and
   wherein the 5.6 GHz BAW resonator further comprises
   a first contact metal formed overlying a portion of the second electrode and the piezoelectric film;
   a second contact metal formed overlying a portion of the top metal and the piezoelectric film; and
   a second passivation layer formed overlying the piezoelectric film, the second electrode, and the top metal.

6. A 5.6 GHz front end module (FEM) device, the device comprising:
   a power amplifier (PA) electrically coupled to an input node;
   a diversity switch electrically coupled to the PA and an output node; and
   a 5.6 GHz bulk acoustic wave (BAW) resonator electrically coupled to the diversity switch and an antenna, the 5.6 GHz BAW resonator having a passband frequency of 5.170 GHz to 5.895 GHz;
   wherein the 5.6 GHz BAW resonator comprises
   a substrate;
   a support layer overlying the substrate, the support layer having an air cavity;
   a first electrode overlying the air cavity and a portion of the support layer;
   a first passivation layer overlying the support layer and being physically coupled to the first electrode;
   a piezoelectric film overlying the support layer, the first electrode, and the air cavity, the piezoelectric film having an electrode contact via;
   a second electrode formed overlying the piezoelectric film; and
   a top metal formed overlying the piezoelectric film, the top metal being physically coupled to the first electrode through the electrode contact via.

7. The device of claim 6 wherein the PA comprises a 5.6 GHz power amplifier;
   wherein the 5.6 GHz resonator comprises a 5.6 GHz BAW RF filter; and
   wherein the diversity switch comprises a single pole two throw (SP2T) switch.

8. The device of claim 6 further comprising a bypassable low noise amplifier (LNA) electrically coupled to an LNA input node and an LNA output node.

9. The device of claim 6 further comprising a DC power detector having a voltage output, the DC power detector being electrically coupled to the PA; and
   an RF power detector having an RF output from a directional coupler, the RF power detector being electrically coupled to the PA.

10. The device of claim 6 wherein the 5.6 GHz BAW resonator further comprises a bonding support layer overlying the substrate, and wherein the support layer is configured overlying the bonding support layer; and
    wherein the 5.6 GHz BAW resonator further comprises
    a first contact metal formed overlying a portion of the second electrode and the piezoelectric film;
    a second contact metal formed overlying a portion of the top metal and the piezoelectric film; and
    a second passivation layer formed overlying the piezoelectric film, the second electrode, and the top metal.

11. A 6.6 GHz front end module (FEM) device, the device comprising:
a power amplifier (PA) electrically coupled to an input node;
a 6.6 GHz resonator electrically coupled to the PA;
wherein the 6.6 GHz resonator comprises
a substrate;
a support layer overlying the substrate, the support layer having an air cavity;
a first electrode overlying the air cavity and a portion of the support layer;
a first passivation layer overlying the support layer and being physically coupled to the first electrode;
a piezoelectric film overlying the support layer, the first electrode, and the air cavity, the piezoelectric film having an electrode contact via;
a second electrode formed overlying the piezoelectric film; and
a top metal formed overlying the piezoelectric film, the top metal being physically coupled to the first electrode through the electrode contact via; and
a diversity switch electrically coupled the 6.6 GHz resonator, an output node, and an antenna.

12. The device of claim 11 wherein the PA comprises a 6.6 GHz power amplifier;
wherein the 6.6 GHz BAW resonator comprises a 6.6 GHz bulk acoustic wave (BAW) RF filter; and
wherein the diversity switch comprises a single pole two throw (SP2T) switch.

13. The device of claim 11 further comprising a bypassable low noise amplifier (LNA) electrically coupled to an LNA input node and an LNA output node.

14. The device of claim 11 further comprising a DC power detector having a voltage output, the DC power detector being electrically coupled to the PA; and
an RF power detector having an RF output from a directional coupler, the RF power detector being electrically coupled to the PA.

15. The device of claim 11 wherein the 6.6 GHz resonator further comprises a bonding support layer overlying the substrate, and wherein the support layer is configured overlying the bonding support layer; and
wherein the 6.6 GHz resonator further comprises
a first contact metal formed overlying a portion of the second electrode and the piezoelectric film;
a second contact metal formed overlying a portion of the top metal and the piezoelectric film; and
a second passivation layer formed overlying the piezoelectric film, the second electrode, and the top metal.

16. A 6.6 GHz front end module (FEM) device, the device comprising:
a power amplifier (PA) electrically coupled to an input node;
a diversity switch electrically coupled to the PA and an output node; and
a 6.6 GHz resonator electrically coupled to the diversity switch and an antenna;
wherein the 6.6 GHz resonator comprises
a substrate;
a support layer overlying the substrate, the support layer having an air cavity;
a first electrode overlying the air cavity and a portion of the support layer;
a first passivation layer overlying the support layer and being physically coupled to the first electrode;
a piezoelectric film overlying the support layer, the first electrode, and the air cavity, the piezoelectric film having an electrode contact via;
a second electrode formed overlying the piezoelectric film; and
a top metal formed overlying the piezoelectric film, the top metal being physically coupled to the first electrode through the electrode contact via.

17. The device of claim 16 wherein the PA comprises a 6.6 GHz power amplifier;
wherein the 6.6 GHz resonator comprises a 6.6 GHz bulk acoustic wave (BAW) RF filter; and
wherein the diversity switch comprises a single pole two throw (SP2T) switch.

18. The device of claim 16 further comprising a bypassable low noise amplifier (LNA) electrically coupled to an LNA input node and an LNA output node.

19. The device of claim 16 further comprising a DC power detector having a voltage output, the DC power detector being electrically coupled to the PA; and
an RF power detector having an RF output from a directional coupler, the RF power detector being electrically coupled to the PA.

20. The device of claim 16 wherein the 6.6 GHz resonator further comprises a bonding support layer overlying the substrate, and wherein the support layer is configured overlying the bonding support layer; and
wherein the 6.6 GHz resonator further comprises
a first contact metal formed overlying a portion of the second electrode and the piezoelectric film;
a second contact metal formed overlying a portion of the top metal and the piezoelectric film; and
a second passivation layer formed overlying the piezoelectric film, the second electrode, and the top metal.

* * * * *